US009343176B2

(12) United States Patent
Chung

(10) Patent No.: US 9,343,176 B2
(45) Date of Patent: *May 17, 2016

(54) LOW-PIN-COUNT NON-VOLATILE MEMORY INTERFACE WITH SOFT PROGRAMMING CAPABILITY

(71) Applicant: Shine C. Chung, San Jose, CA (US)

(72) Inventor: Shine C. Chung, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/792,479

(22) Filed: Jul. 6, 2015

(65) Prior Publication Data

US 2015/0310927 A1 Oct. 29, 2015

Related U.S. Application Data

(63) Continuation of application No. 14/231,404, filed on Mar. 31, 2014, now Pat. No. 9,076,513, which is a continuation-in-part of application No. 13/288,843, filed on Nov. 3, 2011, now Pat. No. 8,988,965.

(60) Provisional application No. 61/409,539, filed on Nov. 3, 2010, provisional application No. 61/806,314, filed on Mar. 28, 2013.

(51) Int. Cl.
G11C 17/18 (2006.01)
G11C 16/10 (2006.01)
(Continued)

(52) U.S. Cl.
CPC *G11C 17/18* (2013.01); *G11C 7/10* (2013.01); *G11C 8/18* (2013.01); *G11C 13/004* (2013.01); *G11C 13/0069* (2013.01); *G11C 13/0097* (2013.01); *G11C 16/0408* (2013.01); *G11C 16/10* (2013.01); *G11C 17/00* (2013.01); *G11C 17/16* (2013.01); *G11C 29/022* (2013.01);

(Continued)

(58) Field of Classification Search
CPC ........ G11C 16/10; G11C 16/26; G11C 29/12; G11C 8/18; G11C 7/00; G11C 18/00
See application file for complete search history.

(56) References Cited

U.S. PATENT DOCUMENTS 3,198,670 A 8/1965 Nissim
3,715,242 A 2/1973 Daniel
(Continued)

FOREIGN PATENT DOCUMENTS

CN 1469473 A 1/2004
CN 1691204 A 11/2005
(Continued)

OTHER PUBLICATIONS

U.S. Appl. No. 13/471,704, filed May 15, 2012.
(Continued)

*Primary Examiner* — Hien Nguyen

(57) ABSTRACT

A low-pin-count non-volatile (NVM) memory with no more than two control signals that can at least program NVM cells, load data to be programmed into output registers, or read the NVM cells. At least one of the NVM cells has at least one NVM element coupled to at least one selector and to a first supply voltage line. The selector is coupled to a second supply voltage line and having a select signal. No more than two control signals can be used to select the at least one NVM cells in the NVM sequentially for programming the data into the at least one NVM cells or loading data into the at least one output registers. Programming into the NVM cells, or loading data into output registers, can be determined by the voltage levels of the first to the second supply voltage lines.

20 Claims, 22 Drawing Sheets

(51) Int. Cl.

| | |
|---|---|
| *G11C 29/02* | (2006.01) |
| *G11C 29/12* | (2006.01) |
| *G11C 29/46* | (2006.01) |
| *G11C 7/10* | (2006.01) |
| *G11C 8/18* | (2006.01) |
| *G11C 17/00* | (2006.01) |
| *G11C 17/16* | (2006.01) |
| *G11C 13/00* | (2006.01) |
| *G11C 16/04* | (2006.01) |
| *G11C 17/14* | (2006.01) |
| *G11C 16/16* | (2006.01) |
| *G11C 16/26* | (2006.01) |
| *G11C 16/32* | (2006.01) |

(52) U.S. Cl.
CPC .......... *G11C29/027* (2013.01); *G11C 29/1201* (2013.01); *G11C 29/46* (2013.01); *G11C 16/16* (2013.01); *G11C 16/26* (2013.01); *G11C 16/32* (2013.01); *G11C 17/146* (2013.01); *G11C 2216/30* (2013.01)

(56) References Cited

U.S. PATENT DOCUMENTS

| | | | |
|---|---|---|---|
| 4,148,046 A | 4/1979 | Hendrickson et al. | |
| 4,192,059 A | 3/1980 | Khan et al. | |
| 4,642,674 A | 2/1987 | Schoofs | |
| 5,192,989 A | 3/1993 | Matsushita et al. | |
| 5,389,552 A | 2/1995 | Iranmanesh | |
| 5,447,876 A | 9/1995 | Moyer et al. | |
| 5,635,742 A | 6/1997 | Hoshi et al. | |
| 5,637,901 A | 6/1997 | Beigel et al. | |
| 5,723,890 A | 3/1998 | Fujihira et al. | |
| 5,757,046 A | 5/1998 | Fujihira et al. | |
| 5,761,148 A | 6/1998 | Allan et al. | |
| 5,962,903 A | 10/1999 | Sung et al. | |
| 6,002,156 A | 12/1999 | Lin | |
| 6,008,092 A | 12/1999 | Gould | |
| 6,034,882 A | 3/2000 | Johnson et al. | |
| 6,054,344 A | 4/2000 | Liang et al. | |
| 6,140,687 A | 10/2000 | Shimormura et al. | |
| 6,243,864 B1 | 6/2001 | Odani et al. | |
| 6,249,472 B1 | 6/2001 | Tamura et al. | |
| 6,346,727 B1 | 2/2002 | Ohtomo | |
| 6,388,292 B1 | 5/2002 | Lin | |
| 6,400,540 B1 | 6/2002 | Chang | |
| 6,405,160 B1 | 6/2002 | Djaja et al. | |
| 6,461,934 B2 | 10/2002 | Nishida et al. | |
| 6,483,734 B1 | 11/2002 | Sharma et al. | |
| 6,597,629 B1 | 7/2003 | Raszka et al. | |
| 6,611,043 B2 | 8/2003 | Takiguchi | |
| 6,731,535 B1 | 5/2004 | Ooishi et al. | |
| 6,770,953 B2 | 8/2004 | Boeck et al. | |
| 6,798,684 B2 | 9/2004 | Low et al. | |
| 6,803,804 B2 | 10/2004 | Madurawe | |
| 6,813,705 B2 | 11/2004 | Duesterwald et al. | |
| 6,897,543 B1 | 5/2005 | Huang et al. | |
| 6,934,176 B2 | 8/2005 | Low et al. | |
| 6,944,083 B2 | 9/2005 | Pedlow | |
| 6,967,879 B2 | 11/2005 | Mizukoshi | |
| 7,009,182 B2 | 3/2006 | Kannan et al. | |
| 7,102,951 B2 | 9/2006 | Paillet et al. | |
| 7,167,397 B2 | 1/2007 | Paillet et al. | |
| 7,211,843 B2 | 5/2007 | Low et al. | |
| 7,212,432 B2 | 5/2007 | Ferrant et al. | |
| 7,224,598 B2 | 5/2007 | Perner | |
| 7,263,027 B2 | 8/2007 | Kim et al. | |
| 7,294,542 B2 | 11/2007 | Okushima | |
| 7,369,452 B2 | 5/2008 | Kenkare et al. | |
| 7,391,064 B1 | 6/2008 | Tripsas et al. | |
| 7,411,844 B2 | 8/2008 | Nitzan et al. | |
| 7,439,608 B2 | 10/2008 | Arendt | |
| 7,461,371 B2 | 12/2008 | Luo et al. | |
| 7,573,762 B2 | 8/2009 | Kenkare et al. | |
| 7,589,367 B2 | 9/2009 | Oh et al. | |
| 7,609,578 B2 | 10/2009 | Buer et al. | |
| 7,660,181 B2 | 2/2010 | Kumar et al. | |
| 7,696,017 B1 | 4/2010 | Tripsas et al. | |
| 7,701,038 B2 | 4/2010 | Chen et al. | |
| 7,764,532 B2 | 7/2010 | Kurjanowicz et al. | |
| 7,772,591 B1 | 8/2010 | Shih et al. | |
| 7,802,057 B2 | 9/2010 | Iyer et al. | |
| 7,808,815 B2 | 10/2010 | Ro et al. | |
| 7,830,697 B2 | 11/2010 | Herner | |
| 7,833,823 B2 | 11/2010 | Klersy | |
| 7,852,656 B2 | 12/2010 | Shin et al. | |
| 7,859,920 B2 | 12/2010 | Jung | |
| 7,889,204 B2 | 2/2011 | Hansen et al. | |
| 7,910,999 B2 | 3/2011 | Lee et al. | |
| 8,008,723 B2 | 8/2011 | Nagai | |
| 8,050,129 B2 | 11/2011 | Liu et al. | |
| 8,089,137 B2 | 1/2012 | Lung et al. | |
| 8,115,280 B2 | 2/2012 | Chen et al. | |
| 8,119,048 B2 | 2/2012 | Nishimura | |
| 8,168,538 B2 | 5/2012 | Chen et al. | |
| 8,174,063 B2 | 5/2012 | Liu et al. | |
| 8,174,922 B2 | 5/2012 | Naritake | |
| 8,179,711 B2 | 5/2012 | Kim et al. | |
| 8,183,665 B2 | 5/2012 | Bertin et al. | |
| 8,217,490 B2 | 7/2012 | Bertin et al. | |
| 8,233,316 B2 | 7/2012 | Liu et al. | |
| 8,339,079 B2 | 12/2012 | Tamada | |
| 8,369,166 B2 | 2/2013 | Kurjanowicz et al. | |
| 8,373,254 B2 | 2/2013 | Chen et al. | |
| 8,380,768 B2 | 2/2013 | Hoefler | |
| 8,415,764 B2 | 4/2013 | Chung | |
| 8,482,972 B2 | 7/2013 | Chung | |
| 8,488,359 B2 | 7/2013 | Chung | |
| 8,488,364 B2 | 7/2013 | Chung | |
| 8,514,606 B2 | 8/2013 | Chung | |
| 8,526,254 B2 | 9/2013 | Kurjanowicz et al. | |
| 8,559,208 B2 | 10/2013 | Chung | |
| 8,570,800 B2 | 10/2013 | Chung | |
| 8,576,602 B2 | 11/2013 | Chung | |
| 8,643,085 B2 | 2/2014 | Pfirsch | |
| 8,644,049 B2 | 2/2014 | Chung | |
| 8,648,349 B2 | 2/2014 | Masuda et al. | |
| 8,649,203 B2 | 2/2014 | Chung | |
| 8,680,620 B2 | 3/2014 | Salcedo | |
| 8,699,259 B2 | 4/2014 | Zhang et al. | |
| 8,760,904 B2 | 6/2014 | Chung | |
| 8,804,398 B2 | 8/2014 | Chung | |
| 8,817,563 B2 | 8/2014 | Chung | |
| 8,830,720 B2 | 9/2014 | Chung | |
| 8,848,423 B2 | 9/2014 | Chung | |
| 8,854,859 B2 | 10/2014 | Chung | |
| 8,861,249 B2 | 10/2014 | Chung | |
| 8,913,415 B2 | 12/2014 | Chung | |
| 8,913,449 B2 | 12/2014 | Chung | |
| 8,923,085 B2 | 12/2014 | Chung | |
| 8,929,122 B2 | 1/2015 | Chung | |
| 8,988,965 B2 | 3/2015 | Chung | |
| 9,019,742 B2 | 4/2015 | Chung | |
| 9,019,791 B2 | 4/2015 | Chung | |
| 9,025,357 B2 | 5/2015 | Chung | |
| 9,070,437 B2 | 6/2015 | Chung | |
| 2002/0075744 A1 | 6/2002 | McCollum | |
| 2002/0168821 A1 | 11/2002 | Williams et al. | |
| 2002/0196659 A1 | 12/2002 | Hurst et al. | |
| 2003/0104860 A1 | 6/2003 | Cannon et al. | |
| 2003/0135709 A1 | 7/2003 | Niles et al. | |
| 2003/0169625 A1 | 9/2003 | Hush et al. | |
| 2004/0057271 A1 | 3/2004 | Parkinson | |
| 2004/0113183 A1 | 6/2004 | Karpov et al. | |
| 2004/0130924 A1 | 7/2004 | Ma et al. | |
| 2005/0060500 A1 | 3/2005 | Luo et al. | |
| 2005/0062110 A1 | 3/2005 | Dietz et al. | |
| 2005/0110081 A1 | 5/2005 | Pendharkar | |
| 2005/0124116 A1 | 6/2005 | Hsu et al. | |
| 2005/0146962 A1 | 7/2005 | Schreck | |
| 2005/0242386 A1 | 11/2005 | Ang | |
| 2006/0072357 A1 | 4/2006 | Wicker | |

(56) References Cited

U.S. PATENT DOCUMENTS

| | | |
|---|---|---|
| 2006/0092689 A1 | 5/2006 | Braun et al. |
| 2006/0104111 A1 | 5/2006 | Tripsas et al. |
| 2006/0120148 A1 | 6/2006 | Kim et al. |
| 2006/0129782 A1 | 6/2006 | Bansal et al. |
| 2006/0215440 A1 | 9/2006 | Cho et al. |
| 2006/0244099 A1 | 11/2006 | Kurjanowicz |
| 2007/0004160 A1 | 1/2007 | Voldman |
| 2007/0057323 A1 | 3/2007 | Furukawa et al. |
| 2007/0081377 A1 | 4/2007 | Zheng et al. |
| 2007/0133341 A1 | 6/2007 | Lee et al. |
| 2007/0138549 A1 | 6/2007 | Wu et al. |
| 2007/0223266 A1 | 9/2007 | Chen |
| 2007/0279978 A1 | 12/2007 | Ho et al. |
| 2008/0025068 A1 | 1/2008 | Scheuerlein et al. |
| 2008/0028134 A1 | 1/2008 | Matsubara et al. |
| 2008/0044959 A1 | 2/2008 | Cheng et al. |
| 2008/0067601 A1 | 3/2008 | Chen |
| 2008/0105878 A1 | 5/2008 | Ohara |
| 2008/0151612 A1 | 6/2008 | Pellizzer et al. |
| 2008/0170429 A1 | 7/2008 | Bertin et al. |
| 2008/0175060 A1 | 7/2008 | Liu et al. |
| 2008/0220560 A1 | 9/2008 | Klersy |
| 2008/0225567 A1 | 9/2008 | Burr et al. |
| 2008/0280401 A1 | 11/2008 | Burr et al. |
| 2008/0316852 A1 | 12/2008 | Matsufuji et al. |
| 2009/0055617 A1 | 2/2009 | Bansal et al. |
| 2009/0115021 A1 | 5/2009 | Moriwaki |
| 2009/0168493 A1 | 7/2009 | Kim et al. |
| 2009/0172315 A1 | 7/2009 | Iyer et al. |
| 2009/0180310 A1 | 7/2009 | Shimomura et al. |
| 2009/0194839 A1 | 8/2009 | Bertin et al. |
| 2009/0213660 A1 | 8/2009 | Pikhay et al. |
| 2009/0219756 A1 | 9/2009 | Schroegmeier et al. |
| 2009/0309089 A1 | 12/2009 | Hsia et al. |
| 2010/0027326 A1 | 2/2010 | Kim et al. |
| 2010/0061136 A1 | 3/2010 | Koyama et al. |
| 2010/0085798 A1 | 4/2010 | Lu et al. |
| 2010/0091546 A1 | 4/2010 | Liu et al. |
| 2010/0142254 A1 | 6/2010 | Choi et al. |
| 2010/0157651 A1 | 6/2010 | Kumar et al. |
| 2010/0171086 A1 | 7/2010 | Lung et al. |
| 2010/0232203 A1 | 9/2010 | Chung et al. |
| 2010/0238701 A1 | 9/2010 | Tsukamoto et al. |
| 2010/0246237 A1 | 9/2010 | Borot et al. |
| 2010/0277967 A1 | 11/2010 | Lee et al. |
| 2010/0301304 A1 | 12/2010 | Chen et al. |
| 2011/0022648 A1 | 1/2011 | Harris et al. |
| 2011/0062557 A1 | 3/2011 | Bandyopadhyay et al. |
| 2011/0128772 A1 | 6/2011 | Kim et al. |
| 2011/0145777 A1 | 6/2011 | Iyer et al. |
| 2011/0175199 A1 | 7/2011 | Lin et al. |
| 2011/0222330 A1 | 9/2011 | Lee et al. |
| 2011/0260289 A1 | 10/2011 | Oyamada |
| 2011/0297912 A1 | 12/2011 | Samachisa et al. |
| 2011/0310655 A1 | 12/2011 | Kreupl et al. |
| 2011/0312166 A1 | 12/2011 | Yedinak et al. |
| 2012/0032303 A1 | 2/2012 | Elkareh et al. |
| 2012/0039107 A1 | 2/2012 | Chung |
| 2012/0044736 A1 | 2/2012 | Chung |
| 2012/0044737 A1 | 2/2012 | Chung |
| 2012/0044738 A1 | 2/2012 | Chung |
| 2012/0044739 A1 | 2/2012 | Chung |
| 2012/0044740 A1 | 2/2012 | Chung |
| 2012/0044743 A1 | 2/2012 | Chung |
| 2012/0044744 A1 | 2/2012 | Chung |
| 2012/0044745 A1 | 2/2012 | Chung |
| 2012/0044746 A1 | 2/2012 | Chung |
| 2012/0044747 A1 | 2/2012 | Chung |
| 2012/0044748 A1 | 2/2012 | Chung |
| 2012/0044753 A1 | 2/2012 | Chung |
| 2012/0044756 A1 | 2/2012 | Chung |
| 2012/0044757 A1 | 2/2012 | Chung |
| 2012/0044758 A1 | 2/2012 | Chung |
| 2012/0047322 A1 | 2/2012 | Chung |
| 2012/0074460 A1 | 3/2012 | Kitagawa |
| 2012/0106231 A1 | 5/2012 | Chung |
| 2012/0147653 A1 | 6/2012 | Chung |
| 2012/0147657 A1 | 6/2012 | Sekar et al. |
| 2012/0209888 A1 | 8/2012 | Chung |
| 2012/0224406 A1 | 9/2012 | Chung |
| 2012/0256292 A1 | 10/2012 | Yu et al. |
| 2012/0287730 A1 | 11/2012 | Kim |
| 2012/0314472 A1 | 12/2012 | Chung |
| 2012/0314473 A1 | 12/2012 | Chung |
| 2012/0320656 A1 | 12/2012 | Chung |
| 2012/0320657 A1 | 12/2012 | Chung |
| 2013/0148409 A1 | 6/2013 | Chung |
| 2013/0161780 A1 | 6/2013 | Kizilyalli et al. |
| 2013/0189829 A1 | 7/2013 | Mieczkowski et al. |
| 2013/0200488 A1 | 8/2013 | Chung |
| 2013/0201745 A1 | 8/2013 | Chung |
| 2013/0201746 A1 | 8/2013 | Chung |
| 2013/0201748 A1 | 8/2013 | Chung |
| 2013/0201749 A1 | 8/2013 | Chung |
| 2013/0208526 A1 | 8/2013 | Chung |
| 2013/0215663 A1 | 8/2013 | Chung |
| 2013/0235644 A1 | 9/2013 | Chung |
| 2013/0268526 A1 | 10/2013 | John et al. |
| 2013/0308366 A1 | 11/2013 | Chung |
| 2014/0010032 A1 | 1/2014 | Seshadri et al. |
| 2014/0016394 A1 | 1/2014 | Chung et al. |
| 2014/0071726 A1 | 3/2014 | Chung |
| 2014/0092674 A1 | 4/2014 | Chung |
| 2014/0124871 A1 | 5/2014 | Ko et al. |
| 2014/0124895 A1 | 5/2014 | Salzman et al. |
| 2014/0126266 A1 | 5/2014 | Chung |
| 2014/0131710 A1 | 5/2014 | Chung |
| 2014/0131711 A1 | 5/2014 | Chung |
| 2014/0131764 A1 | 5/2014 | Chung |
| 2014/0133056 A1 | 5/2014 | Chung |
| 2014/0160830 A1 | 6/2014 | Chung |
| 2014/0211567 A1 | 7/2014 | Chung |
| 2014/0269135 A1 | 9/2014 | Chung |
| 2014/0340954 A1 | 11/2014 | Chung |
| 2015/0003142 A1 | 1/2015 | Chung |
| 2015/0003143 A1 | 1/2015 | Chung |
| 2015/0009743 A1 | 1/2015 | Chung |
| 2015/0014785 A1 | 1/2015 | Chung |
| 2015/0021543 A1 | 1/2015 | Chung |
| 2015/0029777 A1 | 1/2015 | Chung |
| 2015/0078060 A1* | 3/2015 | Chung ............... G11C 8/18 365/94 |

FOREIGN PATENT DOCUMENTS

| | | |
|---|---|---|
| CN | 101057330 A | 10/2007 |
| CN | 101083227 A | 12/2007 |
| CN | 101188140 A | 5/2008 |
| CN | 101271881 A | 9/2008 |
| CN | 101483062 A | 7/2009 |
| CN | 101728412 A | 6/2010 |
| EP | 1367596 A1 | 12/2003 |
| JP | 03-264814 | 11/1991 |
| TW | I309081 | 10/2007 |

OTHER PUBLICATIONS

U.S. Appl. No. 13/026,650, filed Feb. 14, 2011.
U.S. Appl. No. 13/026,656, filed Feb. 14, 2011.
U.S. Appl. No. 13/026,664, filed Feb. 14, 2011.
U.S. Appl. No. 13/026,678, filed Feb. 14, 2011.
U.S. Appl. No. 13/026,692, filed Feb. 14, 2011.
U.S. Appl. No. 13/026,704, filed Feb. 14, 2011.
U.S. Appl. No. 13/026,717, filed Feb. 14, 2011.
U.S. Appl. No. 13/026,725, filed Feb. 14, 2011.
U.S. Appl. No. 13/026,752, filed Feb. 14, 2011.
U.S. Appl. No. 13/026,771, filed Feb. 14, 2011.
U.S. Appl. No. 13/026,783, filed Feb. 14, 2011.
U.S. Appl. No. 13/026,835, filed Feb. 14, 2011.
U.S. Appl. No. 13/026,840, filed Feb. 14, 2011.
U.S. Appl. No. 13/026,852, filed Feb. 14, 2011.
U.S. Appl. No. 13/214,198, filed Aug. 21, 2011.
U.S. Appl. No. 13/590,044, filed Aug. 20, 2012.

(56) References Cited

OTHER PUBLICATIONS

U.S. Appl. No. 13/590,047, filed Aug. 20, 2012.
U.S. Appl. No. 13/590,049, filed Aug. 20, 2012.
U.S. Appl. No. 13/590,050, filed Aug. 20, 2012.
U.S. Appl. No. 13/214,183, filed Aug. 20, 2011.
U.S. Appl. No. 13/288,843, filed Nov. 3, 2011.
U.S. Appl. No. 13/314,444, filed Dec. 8, 2011.
U.S. Appl. No. 13/397,673, filed Feb. 15, 2012.
U.S. Appl. No. 13/571,797, filed Aug. 10, 2012.
U.S. Appl. No. 13/678,539, filed Nov. 15, 2012.
U.S. Appl. No. 13/678,544, filed Nov. 15, 2012.
U.S. Appl. No. 13/678,541, filed Nov. 15, 2012.
U.S. Appl. No. 13/678,543, filed Nov. 15, 2012.
Ahn, S.J. et al, "Highly Reliable 50nm Contact Cell Technology for 256Mb PRAM," IEEE VLSI Tech Symp., Jun. 2005, pp. 98-99.
Alavi, Mohsen, et al., "A PROM Element Based on Salicide Allgomeration of Poly Fuses in a CMOS Logic Process," IEEE IEDM, 97, pp. 855-858.
Andre, T. W. et al., "A 4-Mb 0.18um 1T1MTJ Toggle MRAM With Balanced Three Input Sensing Scheme and Locally Mirrored Unidirectional Write Drivers," IEEE J. of Solid-State Circuits, vol. 40, No. 1, Jan. 2005, pp. 301-309.
Ang, Boon et al., "NiSi Polysilicon Fuse Reliability in 65nm Logic CMOS Technology," IEEE Trans. on Dev. Mat. Rel. vol. 7, No. 2, Jun. 2007, pp. 298-303.
Aziz, A. et al., "Lateral Polysilicon n+p Diodes: Effect of the Grain boundaries and of the p-Implemented Doping Level on the I-V and C-V Characteristics," Springer Proceedings in Physics, vol. 54, 1991, pp. 318-322.
Aziz, A. et al., "Lateral Polysilicon PN Diodes: Current-Voltage Characteristics Simulation Between 200K and 400K a Numerical Approach," IEEE Trans. on Elec. Dev., vol. 41, No. 2, Feb. 1994, pp. 204-211.
Banerjee, Kaustav et al., "High Current Effects in Salicide Films for Sub-0.25um VLSI Technologies," IEEE 36th IRPS, 1998, pp. 284-292.
Bedeschi, F. et al., "4-Mb MOSFET-Selected uTrench Phase-Change Memory Experimental Chip," IEEE J. of Solid-State Circuits, vol. 40, No. 7, Jul. 2005, pp. 1557-1565.
Bedeschi, F. et al., "A Bipolar-Selected Phase Change Memory Featuring Multi-Level Cell Storage," IEEE J. Sol. Stat. Cir., vol. 44, No. 1, Jan. 2009, pp. 217-227.
Bedeschi, F. et al., "A Fully Symmetrical Sense Amplifier for Nonvolatile Memories," IEEE. Int. Symp. on Circuits and Systems, (ISCAS), vol. 2, 2004, pp. 625-628.
Bedeschi, F. et al., "An 8Mb Demonstrator for High-Density 1.8V Phase-Change Memories," VLIS Cir. Symp, Jun. 2004, pp. 442-445.
Bedeschi, F. et al., "Set and Reset Pulse Characterization in BJT-Selected Phase-Change Memory," IEEE Int. Symp. on Circuits and Systems (ISCAS), 2005, pp. 1270-1273.
Braganca, P. M. et al., "A Three-Terminal Approach to Developing Spin-Torque Written Magnetic Random Access Memory Cells," IEEE Trans. on Nano. vol. 8, No. 2, Mar. 2009, pp. 190-195.
Cagli, C. et al., "Evidence for threshold switching in the set process of NiO-based RRAM and physical modeling for set, reset, retention and disturb prediction," IEEE IEDM, 2008, pp. 1-4.
Chan, W. T. et al., "CMOS Compatible Zero-Mask One-Time Programmable (OTP) Memory Design," Proc. Int. Conf. Solid State Integr. Cir. Tech., Beijing, China, Oct. 20-23, 2008, pp. 861-864.
Chan, Wan Tim, et al., "CMOS Compatible Zero-Mask One Time Programmable Memory Design", Master Thesis, Hong-Kong University of Science and Technologies, 2008.
Chang, Meng-Fan et al., "Circuit Design Challenges in Embedded Memory and Resistive RAM (RRAM) for Mobile SoC and 3D-IC", Design Automation Conference (ASP-DAC), 16th Asia and South Pacific, 2011, pp. 197-203.
Cheng, Yu-Hsing et al., "Failure Analysis and Optimization of Metal Fuses for Post Package Trimming," IEEE 45th IRPS, 2007, pp. 616-617.
Chiu, Pi-Feng et al., "A Low Store Energy, Low VDDmin, Nonvolatile 8T2R SRAM with 3D Stacked RRAM Devices for Low Power Mobile Applications," IEEE VLSI Cir./Tech Symp., Jun. 2010, pp. 229-230.
Cho, Woo Yeong et al., "A 0.18um 3.0V 64Mb Non-Volatile Phase-Transition Random-Access Memory (PRAM)," ISSCC, Feb. 2004, Sec. 2-1.
Choi, Sang-Jun et al., "Improvement of CBRAM Resistance Window by Scaling Down Electrode Size in Pure-GeTe Film," IEEE Elec. Dev., vol. 30, No. 2, Feb. 2009, pp. 120-122.
Choi, Youngdon et al., "A 20nm 1.8V 8Gb PRAM with 40MB/s Program Bandwidth," IEEE ISSCC, 2012, pp. 46-47.
Chung, S. et al., "A 1.25um2 Cell 32Kb Electrical Fuse Memory in 32nm CMOS with 700mV Vddmin and Parallel/Serial Interface," VLSI Cir. Symp., Jun. 2009, pp. 30-31.
Chung, S. et al., "A 512×8 Electrical Fuse Memory with 15um2 Cells Using 8-sq Asymmetrical Fuse and Core Devices in 90nm CMOS," VLSI Cir. Symp., Jun. 2007, pp. 74-75.
Crowley, Matthew et al., "512Mb PROM with 8 Layers of Antifuse/Diode Cells," IEEE ISSCC 2003, Sec. 16.4.
De Sandre, Guido et al., "A 4Mb LV MOS-Selected Embedded Phase Change Memory in 90nm Standard CMOS Technology," IEEE J. Sol. Stat. Cir, vol. 46. No. 1, Jan. 2011, pp. 52-63.
De Sandre, Guido et al., "A 90nm 4Mb Embedded Phase-Change Memory with 1.2V 12ns Read Access Time and 1MB/s Write Throughput," ISSCC 2010, Sec. 14.7.
Desikan, Rajagopalan et al., "On-Chip MRAM as a High-Bandwidth Low-Latency Replacement for DRAM Physical Memories," Tech Report TR-02-47, Dept. of Computer Science, University of Texas, Austin, Sep. 27, 2002, 18 pages.
Dietrich, Stefan et al., "A Nonvolatile 2-Mbit CBRAM Memory Core Featuring Advanced Read and Program Control," IEEE J. of Solid-Stat Cir., vol. 42, No. 4, Apr. 2007, pp. 839-845.
Dion, Michael J., "Reservoir Modeling for Electromigration Improvement of Metal Systems with Refractory Barriers," IEEE 39th IRPS, 2001, pp. 327-333.
Doorn, T. S. et al., "Ultra-fast Programming of Silicided Polysilicon Fuses Based on New Insights in the Programming Physics," IEEE IEDM, 2005, pp. 667-670.
Doorn, T. S., "Detailed Qualitative Model for the Programming Physics of Silicided Polysilicon Fuses," IEEE Trans. on Elec. Dev. vol. 54, No. 12, Dec. 2007, pp. 3285-3291.
Durlam, M. et al., "A 1-Mbit MRAM Based on 1T1MTJ Bit Cell Integrated With Copper Interconnects," IEEE J. of Solid-State Circuits, vol. 38, No. 5, May 2003, pp. 769-773.
Engel, B. et al., "The Science and Technology of Magnetoresistive Tunnel Memory," IEEE Tran. on Nanotechnology, vol. 1, No. 1, Mar. 2002, pp. 32-38.
Engel, B.N. et al., "A 4Mb Toggle MRAM Based on a Novel bit and Switching Method," IEEE Trans. on Mag. vol. 41, No. 1, Jan. 2005, pp. 132-136.
Fellner, Johannes, et al., "Lifetime Study for a Poly Fuse in a 0.35um Polycide CMOS Process," IEEE 43rd IRPS, 2005, pp. 446-449.
Gao, B. et al., "Oxide-Based RRAM: Uniformity Improvement Using a New Material-Oriented Methodology," IEEE VLSI Tech. Symp., Jun. 2009, pp. 30-31.
Gao, B. et al., "Oxide-Based RRAM Switching Mechanism: A New Ion-Transport-Recombination Model," IEDM, Dec. 2008, pp. 563-566.
Gill, M. et al., "Ovonic Unified Memory—A High Performance Nonvolatile Memory Technology for Stand-Alone Memory and Embedded Applications," IEEE, ISSCC Dig. of Tech. Paper, Feb. 2002, pp. 202-203.
Gogl, D. et al., "A 16-Mb MRAM Featuring Bootstrapped Write Drivers," IEEE J. of Solid-State Circuits, vol. 40, No. 4, Apr. 2005, pp. 902-908.
Gopalan, C. et al., Demonstration of Conductive Bridging Random Access Memory (CBRAM) in Logic CMOS Process, IEEE Int. Memory Workshop, 2010, pp. 1-4.
Ha, Daewon and Kim, Kinam, "Recent Advances in High Density Phase Change Memory (PRAM)," IEEE VLSI Tech. Symp. Jun. 2007.

(56) References Cited

OTHER PUBLICATIONS

Hosoi, Y. et al., "High Speed Unipolar Switching Resistance RAM (RRAM) Technology," IEEE IEDM, Dec. 2006, pp. 1-4.
Hosomi, M. et al., "A Novel Nonvolatile Memory with Spin Torque Transfer Magnetization Switching: Spin-RAM," IEEE IEDM Dig. of Tech. Paper, Dec. 2005, pp. 459-463.
Huang, Chia-En et al., "A New CMOS Logic Anti-Fuse Cell with Programmable Contact," IEEE IEDM Tech. Dig. 2007, pp. 48-51.
Im, Jay et al., "Characterization of Silicided Polysilicon Fuse Implemented in 65nm CMOS Technology," 7th Annual Non-Volatile Memory Technology Symp, (NVMTS) 2006, pp. 55-57.
Jin, Li-Yan et al., "Low-Area 1-Kb Multi-Bit OTP IP Design," IEEE 8th Int. Conf. on ASIC (ASICON), 2009. pp. 629-632.
Johnson, Mark et al., "512Mb PROM with a Three-Dimensional Array of Diode/Antifuse Memory Cells," IEEE J. of Sol. Stat. Cir., vol. 38, No. 11, Nov. 2003, pp. 1920-1928.
Kalnitsy, Alexander et al., "CoSi2 Integrated Fuses on Poly Silicon for Low Voltage 0.18um CMOS Applications," IEEE IEDM 1999, pp. 765-768.
Kang, Han-Byul et al., "Electromigration of NiSi Poly Gated Electrical Fuse and Its Resistance Behaviors Induced by High Temperature," IEEE IRPS, 2010, pp. 265-270.
Kang, Sangbeom et al., "A 0.1um 1.8V 256Mb Phase-Change Random Access Memory (PRAM) with 66Mhz Synchronous Burst-Read," IEEE J. of Sol. Stat. Cir. vol. 42. No. 1, Jan. 2007, pp. 210-218.
Kawahara, T. et al., "2Mb Spin-Transfer Torque RAM (SPRAM) with Bit-by-Bit Bidirectional Current Write and Parallelizing-Direction Current Read," IEEE ISSCC Dig. of Tech. Paper, Feb. 2007, pp. 480-481.
Ker, Ming-Dou et al., "High-Current Characterization of Polysilicon Diode for Electrostatic Discharge Protection in Sub-Quarter-Micron Complementary Metal Oxide Semiconductor Technology," Jpn. J. Appl. Phys. vol. 42 (2003) pp. 3377-3378.
Ker, Ming-Dou et al., "Ultra-High-Voltage Charge Pump Circuit in Low-Voltage Bulk CMOS Processes With Polysilicon Diodes," IEEE Trans. on Cir. and Sys.-II: Exp. Brief., vol. 54, No. 1, Jan. 2007, pp. 47-51.
Kim, Deok-Kee et al., "An Investigation of Electrical Current Induced Phase Transitions in the NiPtSi/Polysilicon System," J. App. Phy. 103, 073708 (2008).
Kim, I. S. et al., "High Performance PRAM Cell Scalable to sub-20nm Technology with below 4F2 Cell Size, Extendable to DRAM Applications," IEEE VLSI Tech Symp., Jun. 2010, pp. 203-204.
Kim, Jinbong et al., "3-Transistor Antifuse OTP ROM Array Using Standard CMOS Process," IEEE VLSI Cir. Symposium, Jun. 2003, pp. 239-242.
Kim, O. et al., "CMOS trimming circuit based on polysilicon fusing," Elec. Lett. vol. 34, No. 4, pp. 355-356, Feb. 1998.
Klee, V. et al., "A 0.13um Logic-Based Embedded DRAM Technology with Electrical Fuses, Cu Interconnect in SiLK, sub-7ns Random Access Time and its Extension to the 0.10um Generation," IEEE IEDM, 2001, pp. 407-410.
Kothandaramam, C. et al., "Electrically programmable fuse (eFUSE) using electromigration in silicides," IEEE Elec. Dev. Lett., vol. 23, No. 9, pp. 523-525, Sep. 2002.
Kulkarni, S. et al., "High-Density 3-D Metal-Fuse Prom Featuring 1.37um2 1T1R Bit Cell in 32nm High-K Metal-Gate CMOS Technology," VLSI Cir. Symp., Jun. 2009 pp. 28-29.
Kulkarni, S. et al., "A 4Kb Metal-Fuse OTP-ROM Macro Featuring a 2V Programmable 1.37um2 1T1R Bit Cell in 32nm High-K Metal-Gate CMOS," IEEE J. of Sol. Stat. Cir, vol. 45, No. 4, Apr. 2010, pp. 863-868.
Kund, Michael et al., "Conductive Bridging RAM (CBRAM): An Emerging Non-Volatile Memory Technology Scalable to Sub 20nm," IEEE IEDM 2005, pp. 754-757.
Lai, Han-Chao et al., "A 0.26um2 U-Shaped Nitride-Based Programming Cell on Pure 90nm CMOS Technology," IEEE Elec. Dev. Lett. vol. 28, No. 9, Sep. 2007, pp. 837-839.
Lai, S., "Current Status of the Phase Change Memory and Its Future," IEEE IEDM Dig. of Tech. Paper, Dec. 2003, pp. 255-258.
Lee, H.Y. et al., "Low Power and High Speed Bipolar Switching with a Thin Reactive Ti Buffer Layer in Robust HfO2 Based RRAM," IEEE IEDM, 2008, pp. 1-4.
Lee, K.J., et al., "A 90nm 1.8V 512Mb Diode-Switch PRAM with 266MB/s Read Throughout," IEEE ISSCC, Dig. of Tech. Paper, Feb. 2007, 3 pgs.
Lee, Kwang-Jin et al., "A 90nm 1.8V 512Mb Diode-Switch PRAM with 266MB/s Read Throughput," IEEE J. of Sol. Stat. Cir., vol. 43, No. 1, Jan. 2008, pp. 150-162.
Lee, M.-J. et al., "Stack Friendly all-Oxide 3D RRAM Using GaInZnO Peripheral TFT Realized Over Glass Substrates," IEDM, Dec. 2008. pp. 1-4.
Lee, Man Chiu et al., "OTP Memory for Low Cost Passive RFID Tags," IEEE Conf. on Electron Devices and Solid-State Circuits (EDSSC), 2007, pp. 633-636.
Liaw, Corvin et al., "The Conductive Bridging Random Access Memory (CBRAM): A Non-volatile Multi-Level Memory Technology," 37th European Solid-State Device Research Conference (ESSDERC), 2007, pp. 226-229.
Lim, Kyunam et al., "Bit Line Coupling Scheme and Electrical Fuse Circuit for Reliable Operation of High Density DRAM," IEEE VLSI Cir. Symp. Jun. 2001, pp. 33-34.
Maffitt, T. et al., "Design Considerations for MRAM," IBM J. Res. & Dev., vol. 50, No. 1, Jan. 2006, pp. 25-39.
Meng, X.Z. et al., "Reliability Concept for Electrical Fuses," IEE Proc.-Sci Meas. Technol., vol. 144, No. 2, Mar. 1997, pp. 87-92.
Min, Byung-Jun et al., "An Embedded Non-volatile FRAM with Electrical Fuse Repair Scheme and One Time Programming Scheme for High Performance Smart Cards," IEEE CICC, Nov. 2005, pp. 255-258.
Mojumder, N. N. et al., "Three-Terminal Dual-Pillar STT-MRAM for High Performance Robust Memory Applications," IEEE Trans. Elec. Dev. vol. 58. No. 5, May 2011, pp. 1508-1516.
Morimoto, T. et al., "A NiSi Salicide Technology for Advanced Logic Devices," IEEE IEDM, Dec. 1991, pp. 653-656.
Neale, Ron, "PCM Progress Report No. 6 Afterthoughts," http://www.eetimes.com/General/PrintView/4236240, Feb. 13, 2012, 5 pages.
Nebashi, R. et al., "A 90nm 12ns 32Mb 2T1MTJ MRAM," IEEE ISSCC Dig. of Tech. Paper, Sess. 27.4, Feb. 2009, 3 pages.
Ng, K.P. et al., "Diode-Base Gate Oxide Anti-Fuse One-Time Programmable Memory Array in Standard CMOS Process," IEEE Int. Conf. of Elect. Dev. & Solid-Stat Cir. (EDSSC), Dec. 2009, pp. 457-460.
Ohbayashi, Shigeki et al., "A 65nm Embedded SRAM With Wafer Level Burn-In Mode, Leak-Bit Redundancy and Cu E-Trim Fuse for Known Good Die," IEEE J. of Solid. Stat. Cir., vol. 43, No. 1, Jan. 2008, pp. 96-108.
Oh, G. H. et al., "Parallel Multi-Confined (PMC) Cell Technology for High Density MLC PRAM," IEEE VLSI Tech. Symp., Jun. 2009, pp. 220-221.
Oh, J. H. et al., "Full Integration of Highly Manufacturable 512Mb PRAM Based on 90nm Technology," IEEE IEDM Dig. of Tech. Paper, Dec. 2006, pp. 1-4.
Osada, K. et al., "Phase Change RAM Operated with 1.5V CMOS as Low Cost Embedded Memory," IEEE CICC, Nov. 2005, pp. 431-434.
Park, Don et al., "Study on Reliability of Metal Fuse for Sub-100nm Technology," IEEE Int. Symp. on Semiconductor Manufacturing (ISSM), 2005, pp. 420-421.
Park, Jongwoo et al., "Phase Transformation of Programmed NiSi Electrical Fuse: Diffusion, Agglomeration, and Thermal Stability," 18th IEEE Int. Symp. on Physical and Failure Analysis of Integrated Circuits, (IPFA), 2011, pp. 1-7.
Park, Young-Bae et al., "Design of an eFuse OTP Memory of 8 Bits Based on a 0.35um BCD Process," Mobile IT Convergence (ICMIC), 2011 Int. Conf. on, pp. 137-139.
Pellizzer, F. et al., "Novel uTrench Phase-Change Memory Cell for Embedded and Stand-alone Non-Volatile Memory Applications," IEEE VLSI Tech Symp. Jun. 2004, pp. 18-19.
Peng, J. et al., "A Novel Embedded OTP NVM Using Standard Foundry CMOS Logic Technology," IEEE 21st Non-Volatile Semiconductor Memory Workshop (NVSMW) 2006, pp. 24-26.

(56) References Cited

OTHER PUBLICATIONS

Rizzolo, R. F. et al., "IBM System z9 eFUSE applications and methodology," IBM J. Res. & Dev. vol. 51 No. ½ Jan./Mar. 2007, pp. 65-75.
Robson, Norm et al., "Electrically Programmable Fuse (eFuse) from Memory Redundancy to Autonomic Chips," IEEE CICC, 2007, pp. 799-804.
Russo, U. et al., "Conductive-Filament Switching Analysis and Self-Accelerated Thermal Dissolution Model for Reset in NiO-based RRAM," IEDM, Dec. 2007, pp. 775-778.
Safran, J. et al., "A Compact eFUSE Programmable Array Memory for SOI CMOS," VLSI Cir. Symp. Jun. 2007, pp. 72-73.
Sasaki, Takahiko et al., "Metal-Segregate-Quench Programming of Electrical Fuse," IEEE 43rd IRPS, 2005, pp. 347-351.
Schrogmeier, P. et al., "Time Discrete Voltage Sensing and Iterative Programming Control for a 4F2 Multilevel CBRAM," VLSI Cir. Symp., Jun. 2007, pp. 186-187.
Sheu, Shyh-Shyuan et al., "A 5ns Fast Write Multi-Level Non-Volatile 1K-bits RRAM Memory with Advance Write Scheme,"VLSI Cir. Symp., Jun. 2009, pp. 82-83.
Sheu, Shyh-Shyuan et al., "Fast-Write Resistive RAM (RRAM) for Embedded Applications," IEEE Design & Test of Computers, Jan./Feb. 2011, pp. 64-71.
Shi, Min et al., "Zero-Mask Contact Fuse for One-Time-Programmable Memory in Standard CMOS Processes," IEEE Dev. Lett. vol. 32, No. 7, Jul. 2011, pp. 955-957.
Song, Y. J. et al., "Highly Reliable 256Mb PRAM with Advanced Ring Contact Technology and Novel Encapsulating Technology," IEEE VLSI Tech Symp., Jun. 2006, pp. 153-154.
Suto, Hiroyuki et al., "Programming Conditions for Silicided Poly-Si or Copper Electrically Programmable Fuses," IEEE IIRW Final Report, 2007, pp. 84-89.
Suto, Hiroyuki et al., "Study of Electrically Programmable Fuses Through Series of I-V Measurements," IEEE IIRW Final Report, 2006, pp. 83-86.
Suto, Hiroyuki et al., "Systematic Study of the Dopant-Dependent Properties of Electrically Programmable Fuses With Silicide Poly-Si Links Through a Series of I-V Measurements," IEEE Trans. on Dev. Mat. Rel. vol. 7, No. 2, Jun. 2007, pp. 285-297.
Takaoka, H. et al., A Novel Via-fuse Technology Featuring Highly Stable Blow Operation with Large On-off Ratio for 32nm Node and Beyond, IEDM, 2007, pp. 43-46.
Tehrani, S. et al., "Magnetoresistive Random Access Memory Using Magnetic Tunnel Junction," Proc. of IEEE, vol. 91, No. 5, May 2003, pp. 703-714.
Tehrani, S., "Status and Outlook of MRAM Memory Technology," IEEE IEDM Dig. of Tech Paper., Dec. 2006, pp. 1-4.
Teichmann, J. et al., "One Time Programming (OTP) with Zener Diodes in CMOS Processes," 33rd Conf. on European Solid-State Device Research (ESSDERC), 2003, pp. 433-436.
Tian, C. et al., "Reliability Investigation of NiPtSi Electrical Fuse with Different Programming Mechanisms," IEEE IIRW Final Report, 2007, pp. 90-93.
Tian, C. et al., "Reliability Qualification of CoSi2 Electrical Fuse for 90nm Technology," IEEE 44th IRPS, 2006, pp. 392-397.
Tian, Chunyan et al., "Reliability Investigation of NiPtSi Electrical Fuse with Different Programming Mechanisms," IEEE Trans. on Dev. Mat. Rel. vol. 8, No. 3, Sep. 2008, pp. 536-542.
Tonti, W. R. et al., "Product Specific Sub-Micron E-Fuse Reliability and Design Qualification," IEEE IIRW Final Report, 2003, pp. 36-40.
Tonti, W. R., "Reliability and Design Qualification of a Sub-Micro Tungsten Silicide E-Fuse," IEEE IRPS Proceedings, 2004, pp. 152-156.
Tonti, W. R., "Reliability, Design Qualification, and Prognostic Opportunity of in Die E-Fuse," IEEE Conference on Prognostics and Health Management (PHM), 2011, pp. 1-7.
Ueda, T. et al., "A Novel Cu Electrical Fuse Structure and Blowing Scheme utilizing Crack-assisted Mode for 90-45nm-node and beyond," IEEE VLSI Tech. Sym., Jun. 2006, 2 pages.
Ulman, G. et al., "A Commercial Field-Programmable Dense eFUSE Array Memory with 00.999% Sense Yield for 45nm SOI CMOS", ISSCC 2008/ Session 22 / Variation Compensation and Measurement/ 22.4, 2008 IEEE International Solid-State Circuits Conference, pp. 406-407.
Vimercati, Daniele et al., "A 45nm 1Gbit 1.8V PCM for Wireless and Embedded Applications," IEEE ISSCC Feb. 2010, 26 pages.
Vinson, J. E., "NiCr Fuse Reliability—A New Approach," Southcon/94, Conference Record, 1994, pp. 250-255.
Walko, J., "Ovshinsky's Memories," IEE Review, Issue 11, Nov. 2005, pp. 42-45.
Wang, J. P. et al., "The Understanding of Resistive Switching Mechansim in HfO2-Based Resistive Random Access Memory," IEDM, 2011, pp. 12.1.1-12.1.4.
Wikipedia, "Programmable read-only memory", http://en.wikipedia.org/wiki/Programmable_read-only_memory, downloaded Jan. 31, 2010, 4 pages.
Worledge, D.C., "Single-Domain Model for Toggle MRAM," IBM J. Res. & Dev. vol. 50, No. 1, Jan. 2006, pp. 69-79.
Wu, Kuei-Sheng et al., "The Improvement of Electrical Programmable Fuse with Salicide-Block Dielectrical Film in 40nm CMOS Technology," Interconnect Technology Conference (IITC), 2010 Int. pp. 1-3.
Wu, Kuei-Sheng et al., "Investigation of Electrical Programmable Metal Fuse in 28nm and beyond CMOS Technology," IEEE International Interconnect Technology Conference and 2011 Materials for Advanced Metallization (IITC/MAM), 2011, pp. 1-3.
Yin, M. et al., "Enhancement of Endurance for CuxO based RRAM Cell," 9th Int. Conf. on Solid-State and Integrated-Circuit Technology (ICSICT) 2008, pp. 917-920.
Zhu, Jian-Gang, "Magnetoresistive Random Access Memory: The Path to Competitiveness and Scalability," Proc. of IEEE, vol. 96, No. 11, Nov. 2008, pp. 1786-1798.
Zhuang, W. W. et al., "Novell Colossal Magnetonresistive Thin Film Nonvolatile Resistance Random Access Memory (RRAM)," IEEE IEDM 2002, pp. 193-196.
Notice of Allowance for U.S. Appl. No. 13/026,664 mailed Sep. 18, 2012.
Office Action for U.S. Appl. No. 13/471,704 mailed Jul. 31, 2012.
Notice of Allowance for U.S. Appl. No. 13/471,704 mailed Oct. 18, 2012.
Notice of Allowance for U.S. Appl. No. 13/026,678 mailed Sep. 19, 2012.
Office Action for U.S. Appl. No. 13/026,783 mailed Sep. 27, 2012.
Office Action for U.S. Appl. No. 13/026,717 mailed Oct. 25, 2012.
Office Action for U.S. Appl. No. 13/026,650 mailed Nov. 9, 2012.
Office Action for U.S. Appl. No. 13/026,692 mailed Nov. 9, 2012.
Office Action for U.S. Appl. No. 13/026,752 mailed Nov. 9, 2012.
Office Action for U.S. Appl. No. 13/026,656 mailed Nov. 13, 2012.
Office Action for U.S. Appl. No. 13/026,704 mailed Nov. 23, 2012.
Office Action for U.S. Appl. No. 13/397,673, mailed Dec. 18, 2012.
Office Action for U.S. Appl. No. 13/026,840, mailed Dec. 31, 2012.
Office Action for U.S. Appl. No. 13/026,852, mailed Jan. 14, 2013.
Office Action for U.S. Appl. No. 13/026,783, mailed Sep. 27, 2012.
Restriction Requirement for U.S. Appl. No. 13/026,835, mailed Dec. 12, 2012.
Notice of Allowance for U.S. Appl. No. 13/026,717, mailed Feb. 12, 2013.
Office Action for U.S. Appl. No. 13/471,704, mailed Jan. 25, 2013.
U.S. Appl. No. 13/761,048, filed Feb. 6, 2013.
U.S. Appl. No. 13/761,057, filed Feb. 6, 2013.
U.S. Appl. No. 13/761,097, filed Feb. 6, 2013.
U.S. Appl. No. 13/761,045, filed Feb. 6, 2013.
Office Action for U.S. Appl. No. 13/026,678, mailed Feb. 20, 2013.
Notice of Allowance for U.S. Appl. No. 13/026,783, mailed Mar. 4, 2013.
Notice of Allowance for U.S. Appl. No. 13/026,692, mailed Mar. 15, 2013.
Office Action for U.S. Appl. No. 13/026,704 mailed Nov. 23, 2012.
Notice of Allowance for U.S. Appl. No. 13/026,835, mailed Mar. 20, 2013.
Notice of Allowance for U.S. Appl. No. 13/026,664, mailed Apr. 22, 2013.

(56) References Cited

OTHER PUBLICATIONS

Notice of Allowance for U.S. Appl. No. 13/026,656, mailed Apr. 22, 2013.
Jagasivamani et al., "Development of a Low-Power SRAM Compiler", IEEE Press, 2001, pp. 498-501.
Liu et al., "A Flexible Embedded SRAM Compiler", IEEE Press, 2002, 3 pgs.
Sundrararajan, "OSUSPRAM: Design of a Single Port SRAM Compiler in NCSU FREEPDK45 Process", Mater of Science in Electrical Engineering, Oklahoma State University, Jul. 2010, 117 pgs.
Notice of Allowance for U.S. Appl. No. 13/026,835, Mailed Apr. 18, 2013.
Notice of Allowance for U.S. Appl. No. 13/026,704, mailed Apr. 30, 2013.
Notice of Allowance for U.S. Appl. No. 13/026,852, mailed May 10, 2013.
Notice of Allowance for U.S. Appl. No. 13/026,717, mailed May 15, 2013.
Notice of Allowance for U.S. Appl. No. 13/471,704, mailed May 22, 2013.
Notice of Allowance for U.S. Appl. No. 13/026,678, mailed May 28, 2013.
Notice of Allowance for U.S. Appl. No. 13/026,650, mailed May 30, 2013.
Restriction Requirement for U.S. Appl. No. 13/314,444, mailed Jun. 7, 2013.
Restriction Requirement for U.S. Appl. No. 13/214,198, mailed Jun. 13, 2013.
Notice of Allowance for U.S. Appl. No. 13/026,840, mailed Jun. 13, 2013.
Restriction Requirement for U.S. Appl. No. 13/026,771, mailed Jun. 13, 2013.
Notice of Allowance for U.S. Appl. No. 13/026,752, mailed Jul. 1, 2013.
Restriction Requirement for U.S. Appl. No. 13/678,543, mailed Jul. 8, 2013.
Office Action for U.S. Appl. No. 13/026,725, mailed Jul. 19, 2013.
Notice of Allowance for U.S. Appl. No. 13/026,664, mailed Jul. 22, 2013.
Notice of Allowance for U.S. Appl. No. 13/026,692, mailed Jul. 23, 2013.
Notice of Allowance for U.S. Appl. No. 13/397,673, mailed Jul. 30, 2013.
Notice of Allowance for U.S. Appl. No. 13/026,704, mailed Aug. 2, 2013.
Notice of Allowance for U.S. Appl. No. 13/026,783, mailed Aug. 5, 2013.
Office Action for U.S. Appl. No. 13/214,198, mailed Aug. 6, 2013.
Office action for Chinese Patent Application No. 201110279954.7, mailed Jul. 1, 2013.
Shen et al., "High-K Metal Gate Contact RRAM (CRRAM) in Pure 28 nm CMOS Logic Process", Electron Devices Meeting (IEDM), 2012 IEEE International, Dec. 2012, 4 pgs.
Tseng et al., "A New High-Density and Ultrasmall-Cell Size Contact RRAM (CR-RAM) with Fully CMOS-Logic-Compatible Technology and Circuits", IEEE Transactions on Electron Devices, vol. 58, Issue 1, Jan. 2011, 6 pgs.
Office Action for U.S. Appl. No. 13/026,783, mailed Sep. 9, 2013.
Office Action for U.S. Appl. No. 13/314,444, mailed Sep. 9, 2013.
Office Action for U.S. Appl. No. 13/026,771, mailed Sep. 9, 2013.
Notice of Allowance for U.S. Appl. No. 13/026,852, mailed Sep. 18, 2013.
Office Action (Ex Parte) for U.S. Appl. No. 13/678,543, mailed Sep. 20, 2013.
Office Action for U.S. Appl. No. 13/835,308, mailed Sep. 27, 2013.
Notice of Allowance for U.S. Appl. No. 13/026,717, mailed Oct. 1, 2013.
Office Action for U.S. Appl. No. 13/954,831, mailed Oct. 1, 2013.
Notice of Allowance for U.S. Appl. No. 13/026,656, mailed Oct. 4, 2013.
Office Action for U.S. Appl. No. 13/214,183, mailed Oct. 25, 2013.
Chua, "Many Times Programmable z8 Microcontroller", e-Gizmo.cim, Nov. 21, 2006, pp. 1-5.
Forum, Intel Multi-byte Nops, asmcommunity.net, Nov. 21, 2006, pp. 1-5.
CMOS Z8 OTP Microcontrollers Product Specification, Zilog Inc., May 2008, Revision 1, pp. 1-84.
OTP Programming Adapter Product User Guide, Zilog Inc., 2006, pp. 1-3.
Notice of Allowance for U.S. Appl. No. 13/026,852, mailed Nov. 15, 2013.
Notice of Allowance for U.S. Appl. No. 13/026,835, mailed Nov. 22, 2013.
Notice of Allowance for U.S. Appl. No. 13/026,725, mailed Dec. 10, 2013.
Office Action for U.S. Appl. No. 13/026,783, mailed Dec. 23, 2013.
Notice of Allowance for U.S. Appl. No. 13/026,771, mailed Jan. 15, 2014.
Office Action for Chinese Patent Application No. 201110244362.1, mailed Sep. 29, 2013.
Office Action for Chinese Patent Application No. 201110235464.7, mailed Oct. 8, 2013.
Office Action for Chinese Patent Application No. 201110244400.3, mailed Nov. 5, 2013.
Office Action for Chinese Patent Application No. 201110244342.4, mailed Oct. 31, 2013.
Restriction Requirement for U.S. Appl. No. 13/678,541, mailed Feb. 28, 2014.
Notice of Allowance for U.S. Appl. No. 13/026,840, mailed Mar. 6, 2014.
Notice of Allowance for U.S. Appl. No. 13/026,840, mailed Mar. 10, 2014.
Notice of Allowance of U.S. Appl. No. 13/678,543, mailed Dec. 13, 2013.
Notice of Allowance for U.S. Appl. No. 13/835,308, mailed Mar. 14, 2014.
Notice of Allowance for U.S. Appl. No. 13/026,835, mailed Mar. 14, 2014.
Notice of Allowance for U.S. Appl. No. 13/026,725, mailed Mar. 31, 2014.
Notice of Allowance for U.S. Appl. No. 13/026,852, mailed Mar. 20, 2014.
Notice of Allowance for U.S. Appl. No. 13/026,771, mailed Mar. 18, 2014.
Final Office Action for U.S. Appl. No. 13/214,183, mailed Apr. 17, 2014.
"Embedded Systems/Mixed C and Assembly Programming", Wikibooks, Aug. 6, 2009, pp. 1-7.
Notice of Allowance for U.S. Appl. No. 13/761,097, mailed Jul. 15, 2014.
Office Action for U.S. Appl. No. 13/571,797, mailed Apr. 24, 2014.
Notice of Allowance for U.S. Appl. No. 13/590,044, mailed Apr. 29, 2014.
Notice of Allowance for U.S. Appl. No. 13/954,831, mailed May 27, 2014.
Notice of Allowance of U.S. Appl. No. 13/833,044, mailed May 29, 2014.
Notice of Allowance for U.S. Appl. No. 13/761,048, mailed Jun. 10, 2014.
Office Action for Taiwanese Patent Application No. 100129642, mailed May 19, 2014 (with translation).
Office Action for U.S. Appl. No. 13/072,783, mailed Nov. 7, 2013.
Notice of Allowance for U.S. Appl. No. 13/026,840, mailed Jun. 24, 2014.
Notice of Allowance for U.S. Appl. No. 13/214,198, mailed Jun. 23, 2014.
Notice of Allowance for U.S. Appl. No. 13/590,044, mailed Jun. 23, 2014.
Ker et al., "MOS-bounded diodes for on-chip ESD protection in a 0.15-µ m shallow-trench-isolation salicided CMOS Process" International Symposium on VLSI Technology, Systems and Applications, 2003, 5 pgs.

(56) References Cited

OTHER PUBLICATIONS

Notice of Allowance for U.S. Appl. No. 13/840,965, mailed Jun. 25, 2014.
Office Action for U.S. Appl. No. 13/970,562, mailed Jun. 27, 2014.
Office Action for U.S. Appl. No. 13/835,308, mailed Jun. 27, 2014.
Notice of Allowance for U.S. Appl. No. 13/288,843, mailed Jul. 8, 2014.
Restriction Requirement for U.S. Appl. No. 13/678,539, mailed Jul. 1, 2014.
Notice of Allowance for U.S. Appl. No. 14/231,413, mailed Jul. 18, 2014.
Notice of Allowance for U.S. Appl. No. 13/590,044, mailed Jul. 23, 2014.
Restriction Requirement for U.S. Appl. No. 13/833,067, mailed Jul. 11, 2014.
Notice of Allowance for U.S. Appl. No. 13/954,831, mailed Aug. 4, 2014.
Restriction Requirement for U.S. Appl. No. 13/678,544, mailed Aug. 1, 2014.
Notice of Allowance for U.S. Appl. No. 13/761,097, mailed Jul. 25, 2014.
Ex parte Quayle for U.S. Appl. No. 13/761,057, mailed Aug. 8, 2014.
Final Office Action for U.S. Appl. No. 13/314,444, mailed May 14, 2014.
Corrected Notice of Allowability for U.S. Appl. No. 13/288,843, mailed Aug. 19, 2014.
Office Action for U.S. Appl. No. 13/590,049, mailed Aug. 29, 2014.
Ex Parte Quayle for U.S. Appl. No. 13/590,047, mailed Aug. 29, 2014.
Ex Parte Quayle for U.S. Appl. No. 13/590,050, mailed Sep. 3, 2014.
Office Action for U.S. Appl. No. 13/678,544, mailed Sep. 12, 2014.
Office Action for U.S. Appl. No. 13/678,539, mailed Sep. 10, 2014.
Notice of Allowance for U.S. Appl. No. 13/288,843, mailed Sep. 18, 2014.
Notice of Allowance for U.S. Appl. No. 13/761,057, mailed Sep. 26, 2014.
Notice of Allowance for U.S. Appl. No. 13/833,044, mailed Sep. 24, 2014.
Notice of Allowance for U.S. Appl. No. 13/314,444, mailed Sep. 24, 2014.
Office Action for U.S. Appl. No. 13/761,045, mailed Sep. 30, 2014.
Notice of Allowance for U.S. Appl. No. 13/835,308, mailed Oct. 10, 2014.
Notice of Allowance for U.S. Appl. No. 13/571,797, mailed Oct. 14, 2014.
Office Action for U.S. Appl. No. 13/833,067, mailed Oct. 20, 2014.
Notice of Allowance for U.S. Appl. No. 14/085,228, mailed Oct. 23, 2014.
Office Action for U.S. Appl. No. 13/842,824, mailed Oct. 29, 2014.
Herner et al., "Vertical p-i-n Polysilicon Diode with Antifuse for stackable Field-Programmable ROM", IEEE Electron Device Letters, vol. 25, No. 5, pp. 271-273, May 2004.
Notice of Allowance for U.S. Appl. No. 13/590,049, mailed Nov. 25, 2014.
Notice of Allowance for U.S. Appl. No. 13/590,047, mailed Nov. 24, 2014.
Office Action for U.S. Appl. No. 13/590,044, mailed Dec. 9, 2014.
Notice of Allowance for U.S. Appl. No. 13/590,050, mailed Dec. 18, 2014.
Office Action for U.S. Appl. No. 14/042,392, mailed Dec. 31, 2014.
Office Action for U.S. Appl. No. 14/071,957, mailed Dec. 29, 2014.
International Search Report and Written Opinion for International Patent Application No. PCT/US/2014/056676, mailed Dec. 19, 2014.
Office Action for U.S. Appl. No. 14/493,083, mailed Jan. 8, 2015.
Office Action for Chinese Patent Application No. 2011102443903, mailed Dec. 16, 2014 (with translation).
Notice of Allowance for U.S. Appl. No. 13/970,562, mailed Jan. 23, 2015.
Notice of Allowance for U.S. Appl. No. 14/493,069, mailed Feb. 17, 2015.
Notice of Allowance for U.S. Appl. No. 14/085,228, mailed Feb. 18, 2015.
Notice of Allowance for U.S. Appl. No. 13/761,045, mailed Feb. 18, 2015.
Notice of Allowance for U.S. Appl. No. 14/231,404, mailed Jan. 22, 2015.
Notice of Allowance for U.S. Appl. No. 14/021,990, mailed Dec. 9, 2014.
Final Office Action for U.S. Appl. No. 13/678,544, mailed Feb. 15, 2015.
Office Action for U.S. Appl. No. 14/101,125, mailed Mar. 6, 2015.
Hassan, "Argument for anti-fuse non-volatile memory in 28nm high-k metal gate", Feb. 15, 2011, wwwl.eeetimes.com publication.
Office Action for U.S. Appl. No. 13/026,783, mailed on Mar. 5, 2015.
Final Office Action for U.S. Appl. No. 13/678,539, mailed Apr. 1, 2015.
Office Action for U.S. Appl. No. 14/636,155, mailed on Apr. 10, 2015.
Notice of Allowance for U.S. Appl. No. 14/021,990, mailed Apr. 14, 2015.
Notice of Allowance for U.S. Appl. No. 13,842,824, mailed Apr. 14, 2015.
Notice of Allowance for U.S. Appl. No. 14/071,957, mailed Apr. 14, 2014.
Notice of Allowance for U.S. Appl. No. 14/231,404, mailed Apr. 17, 2015.
Notice of Allowance for U.S. Appl. No. 13/590,444, mailed May 12, 2015.
Notice of Allowance for U.S. Appl. No. 13/072,783, mailed May 13, 2015.
Notice of Allowance for U.S. Appl. No. 13/833,067, mailed Jun. 5, 2015.
Office Action for U.S. Appl. No. 13/314,444, mailed Dec. 10, 2014.
Final Office Action for U.S. Appl. No. 13/026,783, mailed Jul. 30, 2015.
Notice of Allowance for U.S. Appl. No. 14/553,874, Aug. 10, 2015.
Office Action for U.S. Appl. No. 14/500,743, mailed Aug. 17, 2015.
Notice of Allowance for U.S. Appl. No. 14/042,392, mailed Aug. 21, 2015.
Office Action for U.S. Appl. No. 14/485,696, mailed Aug. 20, 2015.
Notice of Allowance for U.S. Appl. No. 14/493,083, mailed Aug. 27, 2015.
Office Action for U.S. Appl. No. 13/678,539, mailed Sep. 16, 2015.
Office Action for U.S. Appl. No. 14/507,691, mailed Oct. 30, 2015.
Final Office Action for U.S. Appl. No. 14/101,125, mailed Nov. 17, 2015.
Notice of Allowance for U.S. Appl. No. 13/072,783, mailed Oct. 27, 2015.

\* cited by examiner

LOW-PIN-COUNT NON-VOLATILE MEMORY INTERFACE WITH SOFT PROGRAMMING CAPABILITY

CROSS-REFERENCE TO RELATED APPLICATIONS

This application is a continuation of U.S. patent application Ser. No. 14/231,404, filed on Mar. 31, 2014 and entitled "Low-Pin-Count Non-Volatile Memory Interface with Soft Programming Capability," which incorporated herein as reference, and which in turn is a continuation-in-part of U.S. patent application Ser. No. 13/288,843, filed on Nov. 3, 2011 and entitled "Low-Pin-Count Non-Volatile Memory Interface," which incorporated herein as reference, and which claims priority benefit of U.S. Provisional Patent Application No. 61/409,539, filed on Nov. 3, 2010 and entitled "Circuit and System of A Low Pin Count One-Time-Programmable Memory," which is hereby incorporated herein by reference.

This prior U.S. patent application Ser. No. 14/231,404 also claims priority benefit of U.S. Provisional Patent Application No. 61/806,914, filed on Mar. 31, 2013 and entitled "Low-Pin-Count Non-Volatile Memory Interface With Two Pins Only," which is hereby incorporated herein by reference.

This application is also related to U.S. patent application Ser. No. 14/231,413, filed on Mar. 31, 2014 and entitled "Low-Pin-Count Non-Volatile Memory Embedded in a Integrated Circuit Without Any Additional Pins For Access," which is hereby incorporated herein by reference.

BACKGROUND OF THE RELATED ART

Non-volatile memory (NVM) is able to retain data when the power supply of a memory is cut off. The memory can be used to permanent store data such as parameters, configuration settings, long-term data storage, etc. Similarly, this kind of memory can be used to store instructions, or codes, for microprocessors, DSPs, or microcontrollers (MCU), etc. Non-volatile normally has three operations, read, write (or called program), and erase, for reading data, programming data, and erasing data before re-programming. Non-volatile memory can be an EPROM, EEPROM, or flash memory that can be programmed from 10K to 100K times, or Multiple-Time Programmable (MTP) to be programmed from a few times to a few hundred times, or One-Time Programmable (OTP) to be programmed one time only. The non-volatile memory can also be emerging memories such as PCRAM (Phase Change RAM), RRAM (Resistive RAM), FRAM (Ferroelectric RAM), or MRAM (Magnetic RAM).

One-Time-Programmable (OTP) is a particular type of non-volatile memory that can be programmed only once. An OTP memory allows the memory cells being programmed once and only once in their lifetime. OTP is generally based on standard CMOS processes and is usually embedded into an integrated circuit that allows each die in a wafer to be customized. There are many applications for OTP, such as memory repair, device trimming, configuration parameters, chip ID, security key, feature select, and PROM, etc.

FIG. 1 shows a conventional low-pin-count OTP memory 6. The OTP memory 6 has a shared pin 7 and a plurality of OTP cells that has a program pad 8 and an OTP element 5 for each cell. The OTP element is usually an electrical fuse that is fabricated from polysilicon, silicided polysilicon, or metal in CMOS processes. To program a fuse, a high voltage can be applied to the pad 8 to conduct a high current flowing through the OTP element 5 to break the fuse into a high resistance state. In 0.35 um CMOS, programming a polycide (i.e. poly-silicon with silicide on top) fuse takes about 60 mA for 100 millisecond. The program current is so high that the shared pin or the nearby interlayer dielectric can be damaged. The area for a one-pad-one-fuse OTP cell is also very large, especially for low-pin-count chips.

FIG. 2(a) shows another conventional NVM cell 10. The NVM cell 10 has an NVM element 11 and a program selector 12. The NVM element 10 is coupled to a supply voltage V+ in one end and to a program selector 12 in the other end. The program selector 12 has the other end coupled to a second supply voltage V−. The program selector 12 can be turned on by asserting a control terminal Sel. The program selector 12 is usually constructed from a MOS device. The NVM element 11 is usually an electrical fuse based on polysilicon, silicided polysilicon, metal, a floating gate to store charges, or an anti-fuse based on gate oxide breakdown, etc.

FIG. 2(b) shows an NVM cell 15 using a diode as program selector, which is well suited for a low-pin-count NVMt. The NVM cell 15 has an NVM element 16 and a diode as a program selector 17. The NVM element 16 is coupled to a supply voltage V+ in one end and a program selector 17 in the other. The program selector 17 has the other end coupled to a second supply voltage V− as a select signal Sel. It is very desirable for the program selector 17 being fabricated in CMOS compatible processes. The program selector 17 can be constructed from a diode that can be embodied as a junction diode with at least one P+ active region on an N well, or a diode with P+ and N+ implants on two ends of a polysilicon substrate or active region on an insulated substrate. The NVM element 16 is commonly an electrical fuse based on polysilicon, silicided polysilicon, metal, CMOS gate material, or anti-fuse based on gate oxide breakdown.

FIG. 2(c) shows a block diagram of a typical low-pin-count NVM cell 130 for a low-pin-count NVM memory. The NVM cell 130 has one NVM element 131 coupled to a supply voltage VDDP in one end and to a selector 132 in the other end as Vx. The selector 132 can be enabled by asserting a signal Sel. The node Vx can be coupled to a sense amplifier 133 and then to a latch 134 by a signal RE. For low-pin-count NVMs, there may be some advantages to build a sense amplifier and a latch into each cell to save the overall costs in a macro and for ease to use.

FIG. 3 shows a pin configuration of a conventional serial OTP memory 20. The OTP memory 20 has an OTP memory module 22 and a power-switch device 21 that couples to a high voltage supply VDDP and the OTP memory module 22. The OTP memory 22 has a chip enable, program, clock, power-switch select, and an output signal denoted as CS#, PGM, CLK, PSWS, and Q, respectively. CS# selects the OTP memory 22 for either read or program. PGM is for program or read control. CLK is for clocking the memory 22. PSWS is for turning on an optional device, power-switch device 21. The output signal Q is for outputting data. Since there are several I/O pins, the footprint of an OTP memory to be integrated into an integrated circuit is large and the cost is relatively high. Sometimes, the PSWS signal can be generated from the OTP memory 22.

FIG. 4(a) shows a program timing waveform of a serial OTP memory with the I/O pin configurations as shown in FIG. 3. If the CLK is low and PGM is high when the CS# falls, the OTP goes into a program mode. Then, PGM toggles to high before the rising edges of CLK for those bits to be programmed. The high CLK period is the actual program time. Similarly, FIG. 4(b) shows a read timing waveform of a serial OTP memory with the I/O pin configurations shown in FIG. 3. If the CLK is high and PGM is low when CS# falls, the OTP goes into a read mode. The cell data are read out at the falling edges of CLK one by one. These timing waveforms in FIGS. 4(*a*) and 4(*b*) are relatively complicated.

Another similar low-pin-count I/O interface is the Serial Peripheral Interconnect (SPI) that has CSB, SCLK, SIN, and SO pins for chip select, serial clock, serial input, and serial output, respectively. The timing waveforms of SPI are similar to those in FIGS. 4(*a*) and 4(*b*). Another two-pin serial I/O interface is I$^2$C that has only two pins: SDA and SCL, for serial data and serial clock, respectively. This I/O interface is for SRAM-like devices that have comparable read and write access time. The I$^2$C for programming a byte or a page in a serial EEPROM is quite complicated: upon issuing a start bit, device ID, program bit, start address, and stop bit, the chip goes into hibernation so that an internally generated programming can be performed for about 4-8 ms. A status register can be checked for completion before next program commands can be issued again. In an OTP memory, the program time is several orders of magnitude higher than the read access and much lower than either the program or erase time of an EEPROM, for example 1 us for OTP programming versus 50 ns for OTP read and 1 us for OTP programming versus 4 ms for flash programming/erasing, such that I$^2$C interface for OTP is not desirable because of high timing overhead.

As NVM memory sizes continue to be reduced, the number of external interface pins becomes a limitation to the NVM memory size. The conventional serial interfaces are relatively complex and are not able to effectively accommodate read and program speed discrepancies. Accordingly, there is a need for a low-pin-count interface for non-volatile memory, such as OTP memory.

SUMMARY

The invention relates to a low-pin-count non-volatile memory (NVM) having reduced area and footprint. For example, in one embodiment, a low-pin-count NVM can have no more than 256 bits, or more particularly no more than 32 bits, and can be used for one or more of device trimming, calibration, configuration settings, parameter storage, security key, product feature select, chip ID, or the like. In one embodiment, the low-pin-count non-volatile memory can use an interface that makes use of not more than three pins (i.e. VDDP, CLK, PGM) external to an integrated circuit. In another embodiment, a low-pin-count NVM can use an interface that makes use of not more than two pins (i.e. VDDP and CLK) external to an integrated circuit. The interface not only can use at most a few external pins but also can share several internal pins with the rest of integrated circuit to thereby reduce area and footprint. For example, if desired, the two or three external pins can be further multiplexed with the other pins so that effectively no additional pins are needed for the NVM interface. In one embodiment the interface can pertain to a low-pin-count One-Time Programmable (OTP) interface for an OTP memory so that the OTP memory can be easily integrated into an integrated circuit.

In one embodiment, a low-pin-count non-volatile memory interface can use a minimum of three signals, PGM, CLK, and VDDP for program control, clock, and high voltage, respectively. By comparing the relative phase between PGM and CLK, start and stop conditions can be detected. In addition, device ID, read/program/erase mode, and starting address can be determined. Thereafter, read, program, or erase sequences can be properly generated. Program assertion and program time can be determined by the pulse width of PGM. So do the erase mode. Finally, the operations can be ended with a stop condition or running out of the available memory space.

In another embodiment, a low-pin-count non-volatile memory interface can use a minimum of only two signals, VDDP and CLK for program voltage supply and clock, respectively. The NVM memory can be reset to an initial state to select a particular cell. Any subsequent CLK toggles can select the next NVM cells. The selected NVM cells can be enabled when the CLK is high. If VDDP is raised to a high program voltage for those cells enabled by CLK, the cells can be programmed accordingly. If VDDP is raised to a core voltage not high enough for programming, the cells enabled by CLK can be soft-programmed accordingly. Soft programming allows each cell being stored with data for test and verification until satisfaction. Then actual programming can follow. Read can be done by raising a Read Enable signal (RE) to the NVM macro so that all cells in the NVM can be sensed and stored into each individual latch. Alternatively, RE can be a Power-On Reset (POR) signal that can be generated automatically during VDD powering up.

In yet another embodiment, a low-pin-count nonvolatile memory (NVM) can be embedded into an integrated circuit by full utilizing the existing pin configuration. A combination of unusual voltage levels or timings can be latched for a few consecutive times to get into a test mode. Once into the test mode, the I/Os of the existing pin configuration can be used as the I/Os of the embedded NVM. Reading the contents of the NVM can be activated by a ramping up of a supply voltage VDD. In this embodiment, either CLK/PGM/VDDP or CLK/VDDP scheme can be readily applied after going into the test mode.

The invention can be implemented in numerous ways, including as a method, system, device, or apparatus (including graphical user interface and computer readable medium). Several embodiments of the invention are discussed below.

As a low-pin-count nonvolatile memory (NVM), one embodiment can, for example, include a plurality of NVM cells. At least one of the NVM cells can include an NVM element coupled to a selector. One embodiment of a low-pin-count NVM has a PGM, CLK, and VDDP pins for program/erase control, clock, and high voltage supply, respectively. With relative phases between PGM and CLK, a start/stop bit condition can be determined. Upon detecting a start bit, various transaction phases of device ID, access patterns, and start address can be determined and followed by actual data cycles to read, program, or erase the NVM cells sequentially. Finally, the transaction can be ended by detecting a stop condition or running out of the available NVM memory space.

As a low-pin-count nonvolatile memory (NVM), another embodiment can, for example, include a plurality of NVM cells. At least one of the NVM cells can include an NVM element coupled to a selector. Each NVM cell can be selected by a CLK signal upon initialization, such as VDD powering up. The CLK can select a next NVM cell after each CLK transition. Each selected NVM cell can be enabled during the CLK high period. If the VDDP is raised to a high program voltage during the CLK high period, the selected NVM cells can be programmed accordingly. If the VDDP is raised to a core voltage during the CLK high period, the selected NVM cells can be soft programmed. Soft programming is a capability to allow data being entered and stored for testing and verifying the functionality until satisfaction. Then actually programming can follow afterward. Read can be done by raising a Read Enable (RE) signal to sense and store the contents of all cells in the NVM. Alternatively, RE can be triggered by a Power-On Reset (POR) signal during VDD powering up to a core voltage.

As a low-pin-count nonvolatile memory (NVM), yet another embodiment can, for example, include a test mode detector. The test mode detector can detect and latch a combination of voltage levels and/or timings that should never happen in normal conditions. To prevent any glitches to mis-trigger into the test mode, the unusual conditions need to happen a few consecutive times to go to the test mode. Once in the test mode, the I/Os of the existing integrated circuits can be used as I/Os of the embedded NVM. This embodiment can work with VDDP/CLK/PGM or VDD/CLK scheme once in the test mode. Reading the contents of the NVM can be activated by a ramping up of a supply voltage, such as VDD, so that no additional pins are needed.

As an electronics system, one embodiment can, for example, include at least a processor, and a low-pin-count nonvolatile memory (NVM) operatively connected to the processor. At least one of the NVM cells can include an NVM element coupled to a selector. One embodiment of a low-pin-count NVM has a PGM, CLK, and VDDP pins for program/erase control, clock, and high voltage supply, respectively. With relative phases between PGM and CLK, a start/stop bit condition can be determined. Upon detecting a start bit, various transaction phases of device ID, access patterns, and start address can be determined and followed by actual data cycles to read, program, or erase the NVM cells sequentially. Finally, the transaction can be ended by detecting a stop condition or running out of the available NVM memory space.

As an electronic system, another embodiment can, for example, include at least a processor, and a low-pin-count nonvolatile memory (NVM) operatively connected to the processor. At least one of the NVM cells can include an NVM element coupled to a selector. An NVM cell can be selected by CLK upon initialization, such as VDD powering up. The CLK can select the next NVM cells after each CLK transition. Each selected NVM cell can be enabled during the CLK high period. If the VDDP is raised to a high program voltage during the CLK high period, the selected NVM cells can be programmed accordingly. If the VDDP is raised to a core voltage during the CLK high period, the selected NVM cells can be soft programmed. Soft programming is a capability to allow data being entered and stored for testing and verifying the functionality until satisfaction. Then actually programming can follow afterward. Read can be done by raising a Read Enable (RE) signal to sense and store the contents of all cells in the NVM. Alternatively, RE can be triggered by a Power-On Reset (POR) signal during VDD powering up to a core voltage.

As an electronic system, yet another embodiment can, for example, include a test mode detector. The test mode detector can detect and latch a combination of voltage levels and/or timings that should never happen in normal conditions. To prevent any glitches to mis-trigger into the test mode, the unusual conditions need to happen a few consecutive times to go to the test mode. Once in the test mode, the I/Os of the existing integrated circuits can be used as I/Os of the embedded NVM. This embodiment can work with VDDP/CLK/PGM or VDD/CLK scheme once in the test mode. Reading the contents of the NVM can be activated by a ramping up of a supply voltage, such as VDD, so that no additional pins are needed. The test mode detector can be built into the NVM in one embodiment.

As a method for providing a low-pin-count nonvolatile memory (NVM), one embodiment can, for example, include at least providing a plurality of NVM cells. At least one of the NVM cells can include an NVM element coupled to a selector. One embodiment of a low-pin-count NVM has a PGM, CLK, and VDDP pins for program/erase control, clock, and high voltage supply, respectively. With relative phases between PGM and CLK, a start/stop bit condition can be determined. Upon detecting a start bit, various transaction phases of device ID, access patterns, and start address can be determined and followed by actual data cycles to read, program, or erase the NVM cells sequentially. Finally, the transaction can be ended by detecting a stop condition or running out of the available NVM memory space.

As a method for providing a low-pin-count nonvolatile memory (NVM), another embodiment can, for example, include at least providing a plurality of NVM cells. At least one of the NVM cells can include an NVM element coupled to a selector. Each NVM cell can be selected by a CLK signal upon initialization, such as VDD powering up. The CLK can select the next NVM cells after each CLK transition. Each selected NVM cell can be enabled during the CLK high period. If the VDDP is raised to a high program voltage during the CLK high period, the selected NVM cells can be programmed accordingly. If the VDDP is raised to a core voltage during the CLK high period, the selected NVM cells can be soft programmed. Soft programming is a capability to allow data being entered and stored for test and verifying the functionality until satisfaction. Then actually programming can follow afterward. Read can be done by raising a Read Enable (RE) signal to sense and store the contents of all cells in the NVM. Alternatively, RE can be triggered by a Power-On Reset (POR) signal during VDD powering up to a core voltage.

As a method for providing a low-pin-count nonvolatile memory (NVM), yet another embodiment can, for example, include a test mode detection method. The test mode detection can detect and latch a combination of voltage levels and/or timings that should never happen in normal conditions. To prevent any glitches to mis-trigger into the test mode, the unusual conditions need to happen a few consecutive times to go to the test mode. Once in the test mode, the I/Os of the existing integrated circuits can be used as I/Os of the embedded NVM. This embodiment can work with VDDP/CLK/PGM or VDD/CLK scheme once in the test mode. Reading the contents of the NVM can be activated by a ramping up of a supply voltage, such as VDD, so that no any additional pins are needed.

BRIEF DESCRIPTION OF THE DRAWINGS

The present invention will be readily understood by the following detailed descriptions in conjunction with the accompanying drawings, wherein like reference numerals designate like structural elements, and in which:

FIG. 7(a) shows a start bit waveform according to one embodiment.

FIG. 7(b) shows a stop bit waveform according to one embodiment.

FIG. 9(a2) shows a soft-program timing waveform of another low-pin-count NVM protocol, corresponding to FIG. 5(b), according to one embodiment.

FIG. 9(a3) shows a read timing waveform of another low-pin-count NVM protocol, corresponding to FIG. 5(b), according to one embodiment.

FIG. 9(b1) shows a portion of block diagram of another low-pin-count NVM macro using low-pin-count protocol shown in FIGS. 5(a), 5(b) according to one embodiment.

FIG. 9(b2) shows a portion of block diagram of a low-pin-count NVM macro using low-pin-count protocol shown in FIGS. 5(a), 5(b) according to another embodiment.

FIG. 9(b3) shows a portion of block diagram of a low-pin-count NVM macro using low-pin-count protocol shown in FIGS. 5(a), 5(b) according to yet another embodiment.

FIG. 9(c1) shows a portion of a schematic of another sense amplifier related to low-pin-count NVM macros according to another embodiment.

FIG. 9(c2) shows a portion of a schematic of another sense amplifier related to low-pin-count NVM macros according to another embodiment

FIG. 9(e1) shows a portion of a block diagram of an OPA with built-in test mode detector to fully utilize the existing I/O pins.

FIG. 9(e2) shows a portion of a schematic of a test mode detector.

FIG. 9(f1) shows a portion of a schematic for trimming a resistor according to one embodiment.

FIG. 9(f2) shows a portion of a schematic for trimming a resistor according to one embodiment.

DETAILED DESCRIPTION OF THE INVENTION

The invention relates to a low-pin-count non-volatile memory (NVM) having reduced area and footprint. In one embodiment, the low-pin-count non-volatile memory can use an interface that makes use of a minimum of three pins (i.e. VDDP, CLK, and PGM) external to an integrated circuit. In another embodiment, the low-pin-count non-volatile memory can use an interface that makes use of a minimum of two pins (i.e. VDDP and CLK) external to an integrated circuit. The interface not only can use only a few external pin but also can share several internal pins with the rest of integrated circuit to thereby reduce area and footprint. Moreover, if desired, the few external pins can be further multiplexed with the other pins so that no additional pins are needed. In one embodiment the interface can pertain to a low-pin-count OTP interface for an OTP memory so that the OTP memory can be easily integrated into an integrated circuit.

Simply employing a serial interface is not sufficient for an OTP memory because an OTP memory requires high voltage programming control and has a much longer program time than read time. Also, getting into a program mode at a specific address should be immune to noises and be secure to prevent corrupting data.

Figure 5A:
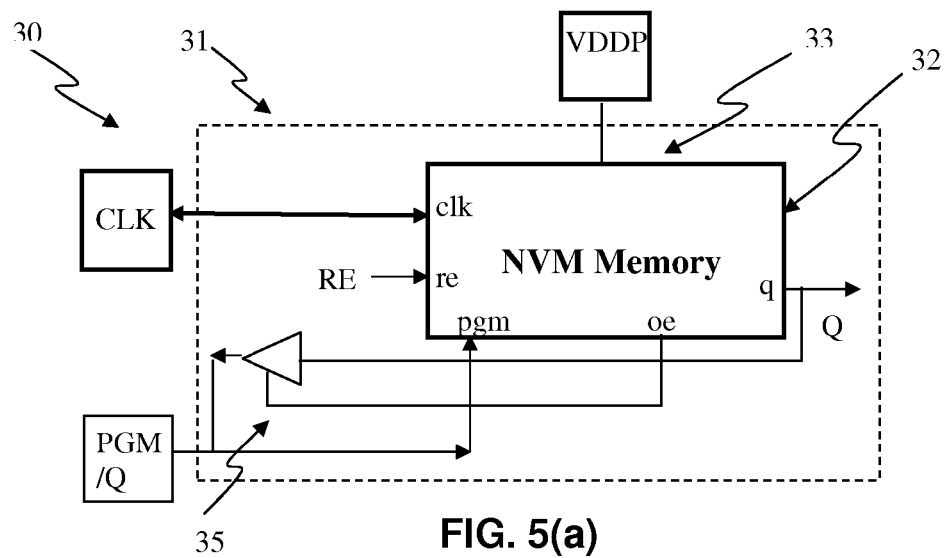
FIG. 5(a) shows a block diagram of a low-pin-count NVM according to one embodiment of the present invention.

FIG. 5(a) shows a portion of a block diagram of a low-pin-count NVM 30 that use a minimum of three pins, VDDP, PGM, and CLK for high voltage, program/erase control and clock according to one embodiment. NVM 30 has a NVM memory core 32, and an output buffer 35. By comparing the relative phase between CLK and PGM, start and stop conditions can be detected. In addition, device ID, read/program/erase mode, and starting address can be determined. Thereafter, read, program, or erase sequences can be properly generated. Program assertion and program time can be determined by the pulse width of PGM in program mode. Similarly erase assertion and erase time can be determined by the pulse width of PGM in erase mode. Finally, the operations can be ended with a stop condition or running through the whole memory. The data in the NVM memory core 32 can be read to q and then stored in external registers. At the same time, the same output can be sent to the PGM pin for output monitoring by enabling an output enable (oe) signal. In some embodiments, this capability can be omitted for data security reasons.

Figure 5B:
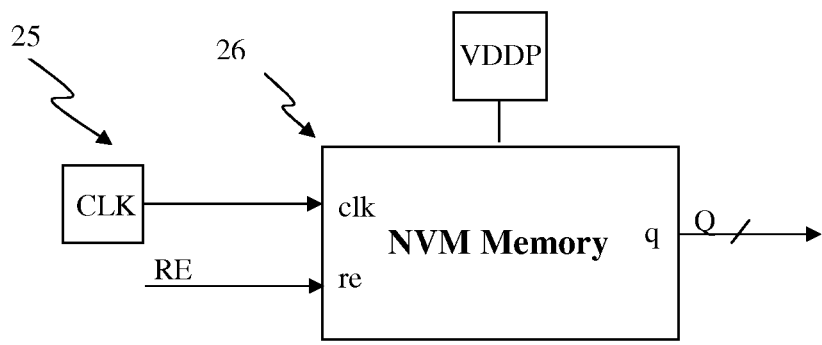
FIG. 5(b) shows a block diagram of another low-pin-count NVM according to another embodiment of the present invention.

FIG. 5(b) shows a block diagram of a low-pin-count NVM that can use a minimum of two pins, VDDP and CLK, for program control and clock, respectively. The low-pin-count NVM can be reset to an initial state upon powering up, with a particular NVM cell selected. Any CLK toggles can select next cells. The selected NVM cells can be enabled during the CLK high period. If the VDDP is raised to a program voltage during the CLK high period of the cells, the cells can be programmed into a high resistance state. If the VDDP is raised to a core voltage but not high enough to the program voltage during the CLK high period, the cells can be soft programmed. Soft program allows data to be stored into the cells for test and verification until satisfaction. Then actual programming can follow. As for read, a Read Enable (RE) signal can be raised to sense and latch cells in a low-pin-count NVM to output Q in parallel or in serial. The RE can be triggered by a signal external to the low-pin-count NVM, or triggered by a Power-On Reset (POR) signal. In one embodiment, the VDDP can be set to ground for sensing during read. In another embodiment, the VDDP can be set to a core voltage for sensing during read. The two external pins, VDDP and CLK, can be further multiplexed and shared with other pins in an integrated circuit.

Figure 5C:
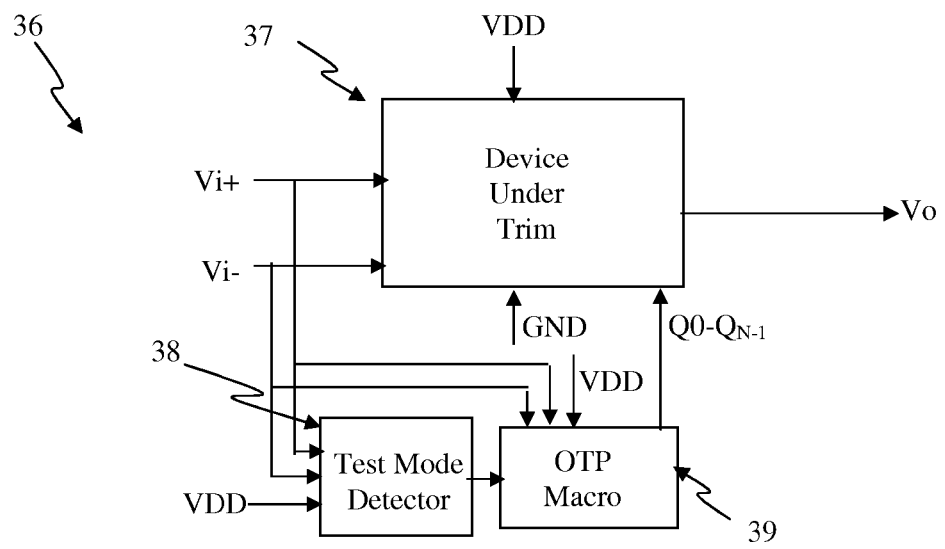
FIG. 5(c) shows a block diagram of yet another low-pin-count NVM according to another embodiment of the present invention.

FIG. 5(c) shows a portion of block diagram of a low-pin-count NVM 39 embedded into an integrated circuit 36 without any additional pins. The integrated circuit 36 has a Device-Under-Trim 37, an OTP macro 39, and a Test Mode Detector 38. The test mode detector 38 detects unusual combinations of voltage and/or timing among Vi−, Vi+, and VDD to latch into a test mode. Once in the test mode, Vi−, Vi+, and VDD can be used as CLK, PGM, and VDDP, as an example. Reading the contents of the NVM 39 can be activated by detecting ramping of a supply voltage, such as VDD.

Figure 6A:
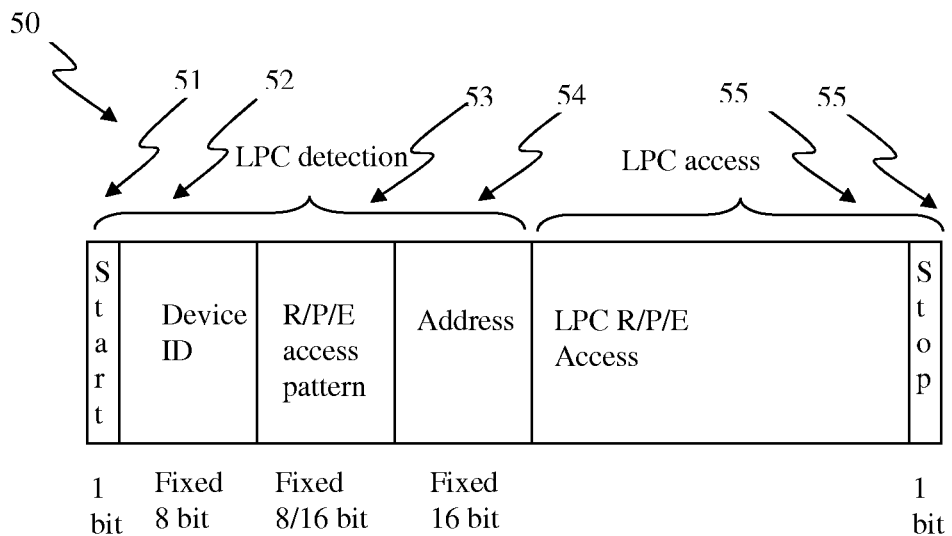
FIG. 6(a) shows a low-pin-count NVM protocol according to one embodiment.

FIG. 6(a) shows a low-pin-count NVM I/O protocol 50 according to one embodiment. The I/O transaction starts with a start bit 51 and ends with a stop bit 55. After detecting the start bit 51, there is a fixed 8-bit device ID code 52 to specify device names and types to access, such as SRAM, ROM, OTP or device 1, device 2, etc. In one embodiment, a device can grant access only when the requested device ID matches the target device ID. Then, there is multiple-bit access pattern 53 to specify read, program, or erase. It is very important for an NVM to prevent accidental programming or erasing so that programming or erasing can happen only when detecting special data patterns. The special access pattern to unlock programming can be a log sequence of alternative zeros and ones such as 0101,0101,0101,0101 for read, 1010,1010,1010,1010 for program, and 0101,0101,1010,1010 for erase. The next field is a starting address 54. Sixteen bits in the address 54 allows memory capacity up to 64K bits. This field can be extended by itself when detecting a particular device in field 52 that has capacity higher than 64 Kb or using more bits in the address 54. After knowing the device type, read/program/erase operation, and starting address in fields 52, 53, and 54, respectively, the next step is the actual read, program, or erase cycles. The data access ends when detecting a stop bit 55, or running through the whole memory. The R/P/E access patterns 53 as noted above are exemplary. The numbers of bits for Device ID 52, R/P/E access pattern 53, and address field 54 can vary. Some bit fields can be omitted in other embodiments. The order of bit fields can be interchangeable. It will be apparent to those skilled in the art that various modifications and variations can be made.

If the capacity of the NVM is very low, such as 32 bits or 256 bits, a conventionally rather long LPC detection sequence may defeat the purpose of a simple and reliable I/O protocol. Hence, according to one aspect of embodiment of the invention, a simplified I/O protocol can be provided which has a substantially reduced LPC detection sequence.

Figure 6B:
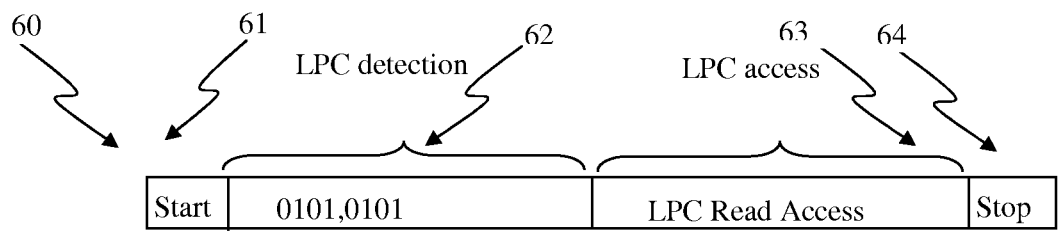
FIG. 6(b) shows a simplified version of low-pin-count NVM protocol for READ according to one embodiment.
Figure 6C:
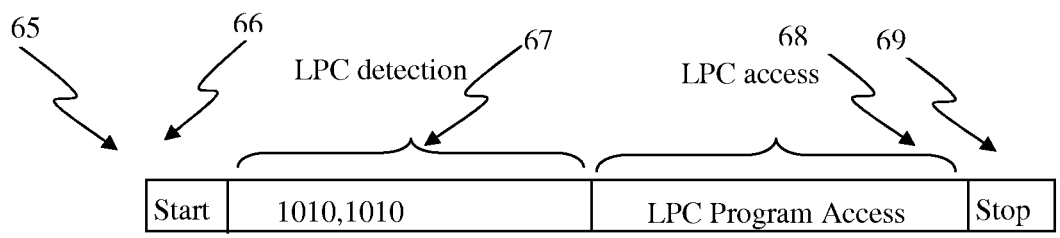
FIG. 6(c) shows a simplified version of low-pin-count NVM protocol for PROGRAM according to one embodiment.
Figure 6D:
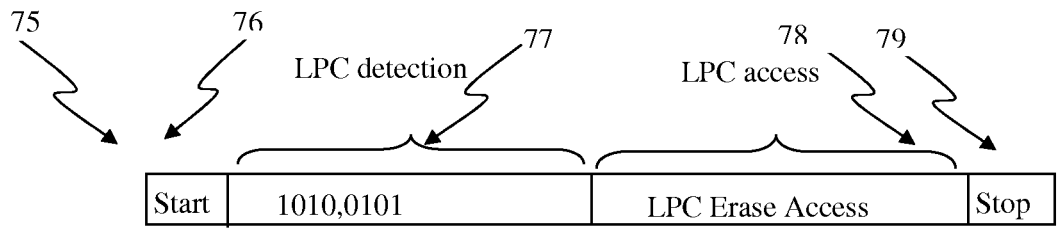
FIG. 6(d) shows a simplified version of low-pin-count NVM protocol for ERASE according to one embodiment.

FIGS. 6(b), 6(c), and 6(d) show simplified versions of low-pin-count NVM protocols for read, program, and erase, respectively, according to one embodiment. FIG. 6(b) shows a low-pin-count read protocol 60 with a start bit 61, LPC detection field 62, LPC Read access 63, and stop bit 64. Similarly, FIG. 6(c) shows a low-pin-count program protocol 65 with a start bit 66, LPC detection field 67, LPC program access 68, and stop bit 69. FIG. 6(d) shows a low-pin-count erase protocol 75 with a start bit 76, LPC detection field 77, LPC erase access 78, and stop bit 79. A simple read, program, or erase sequence, such as 0101,0101, 1010,1010, or 1010, 0101 respectively, can grant read, program or erase access in a low capacity NVM. The pattern bits to specify operations can be a minimum of only one or two bits in other embodiments. The device ID and starting address fields can be omitted. The address can start with the lowest possible address and increments by one after each access. Those skilled in the art understand that the above descriptions are for illustrative purpose. The numbers of fields, number of bits in each field, the order of the fields, address increment/decrement, and actual R/P/E patterns bits may vary and that are still within the scope of this invention.

FIGS. 7(a) and 7(b) show one embodiment of start and stop bit waveforms. When the I/O transaction is inactive, the control signal PGM always toggles at the low CLK period. If the PGM toggles at the high CLK period, this indicates a start or stop condition. When PGM goes high during the high CLK period, this shows a start condition. When PGM goes low during the high CLK period, this shows a stop condition. By using the relative phase between the PGM and the CLK, a chip select function can be provided and a chip select CS# pin can be saved.

Figure 7C:
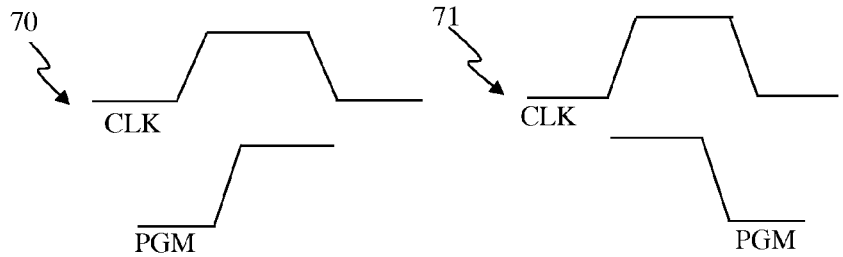
FIG. 7(c) shows a read timing waveform of a low-pin-count NVM, corresponding to FIG. 5(a), in read mode according to one embodiment.
Figure 7C:
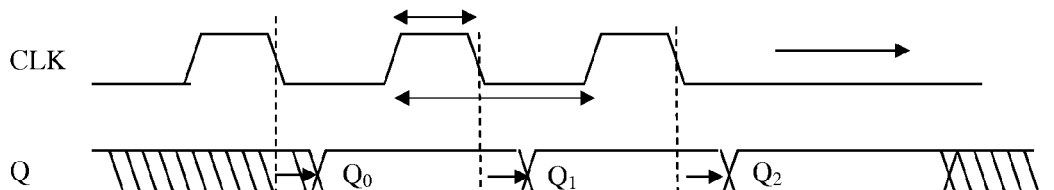

FIG. 7(c) shows a read timing waveform of a low-pin-count NVM in read mode, corresponding to FIG. 5(a), according to one embodiment. Once a read transaction is detected, the data in the NVM can be read out one bit at a time at each falling CLK edge from the starting address. The starting address can be specified in the address field or can be implied as being the lowest or highest possible address. The address can be auto-incremented or decremented by one after each access. In a bi-direction I/O, PGM/Q pin is left floating externally after going into the LPC read stage so that the same pin can be used for outputting data.

Figure 7D:
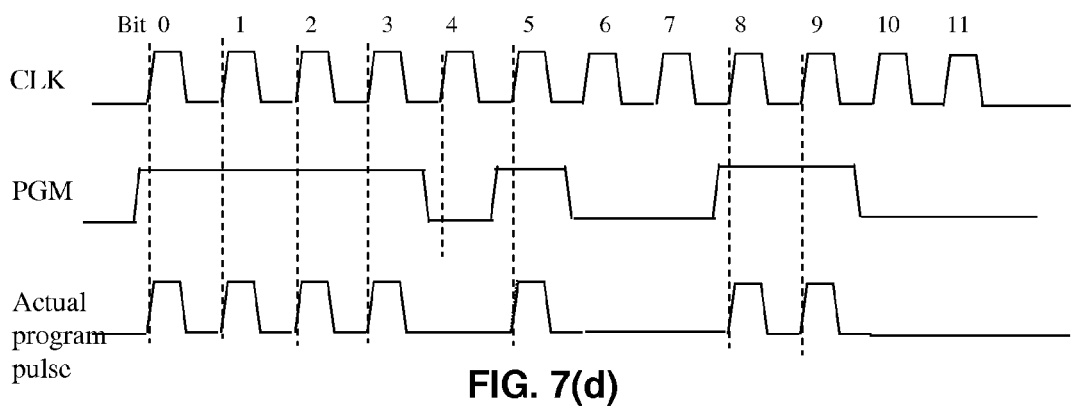
FIG. 7(d) shows a program timing waveform of a low-pin-count NVM, corresponding to FIG. 5(a), in program mode according to one embodiment.

FIG. 7(d) shows a program timing waveform of a low-pin-count NVM in a program mode, corresponding to FIG. 5(a), according to one embodiment. Once a program condition is detected, the I/O transaction goes into the actual programming cycles from the starting address. In one embodiment, the address increments at each falling edge of CLK. Programming a bit is determined if the PGM is high at the rising edge of each CLK cycle. For example, the PGM is high at the CLK rising edge of bit 0, 1, 2, and 3 so that bit 0, 1, 2, and 3 are programmed during the CLK high period. Since PGM is low at the CLK rising edge of bit 4, bit 4 is not programmed. By doing this way, each CLK toggling increments the bit address by one and the PGM high or low at each CLK rising edge determines that bit being programming or not. Actual programming time is the CLK high period.

Figure 7E:
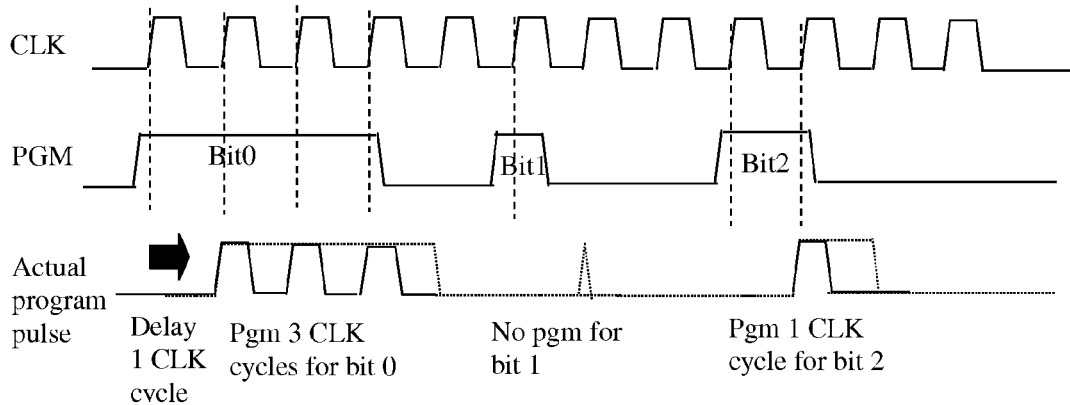
FIG. 7(e) shows another program timing waveform of a low-pin-count NVM, corresponding to FIG. 5(a), in program mode according to one embodiment.

FIG. 7(e) shows a program timing waveform of a low-pin-count NVM in a program mode, corresponding to FIG. 5(a), according to another embodiment. Once the program condition is detected, the I/O transaction goes into the actual programming cycles from the starting address. The program address increments after each low-to-high transition of PGM. The actual program timing depends on the number of whole CLK cycles within each PGM high pulse. For example, in bit 0 the PGM pulse width is larger than 3 CLK cycles but smaller than 4 CLK cycles to enable actual programming for 3 CLK cycles. In bit 1, the PGM pulse width is less than one CLK period so that bit 1 is not programmed. In bit 2, the PGM pulse width is larger than one CLK period but smaller than two so that bit 2 is programmed for 1 CLK cycle. By doing this way, the CLK frequency can be the same for both read and program, while the program period can be determined by the number of CLK high periods in each PGM high pulse width. The actual program pulses can be delayed by one CLK period to make determining the number of CLK cycles easier. The embodiments in FIGS. 7(d) and 7(e) can be applied to erase mode too. In some NVMs, an erase operation happens on a page basis. In that case, the erase address can represent a page address, instead of a bit address.

Figure 8A:
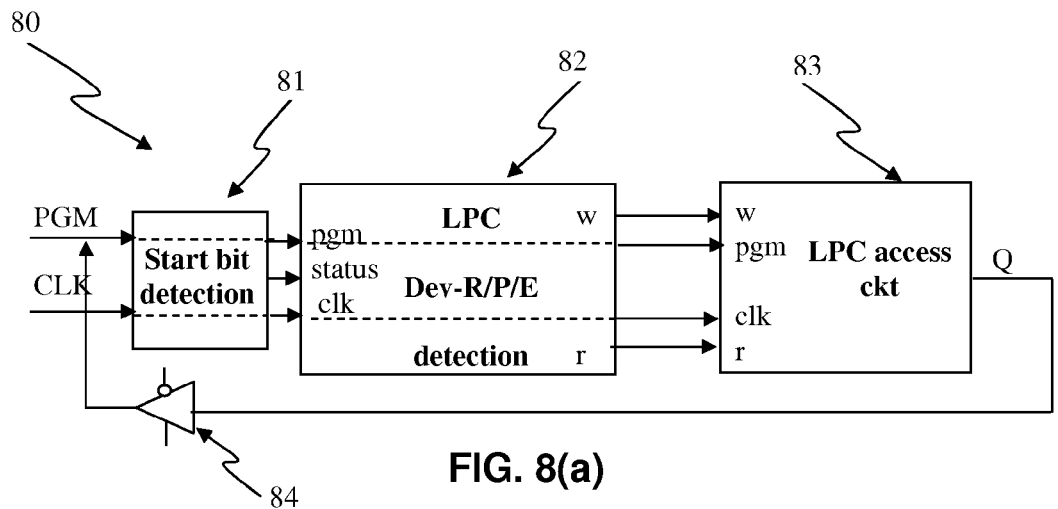
FIG. 8(a) shows a block diagram of a low-pin-count NVM, corresponding to FIG. 5(a), according to one embodiment.

FIG. 8(a) shows a block diagram of a schematic of a low-pin-count NVM 80 according to one embodiment. A start bit detection block 81 detects if a starting condition is met by the relative phase between PGM and CLK as shown in FIGS. 7(a) and 7(b). If yes, a LPC Dev-RPE detection block 82 detects if a device ID and read/program/erase access pattern are met, and then obtains a starting address. With a valid read, program, or erase status and the starting address, a LPC access block 83 performs actual read, program, and erase cycles. If the I/O transaction is a read, a tri-state buffer 84 is asserted so that the output Q is re-directed into the same PGM pin (which can serve as a shared PGM/Q pin). For some embodiments, external read is not desirable for data security reasons such that the tri-state buffer 84 can be omitted.

Figure 8B:
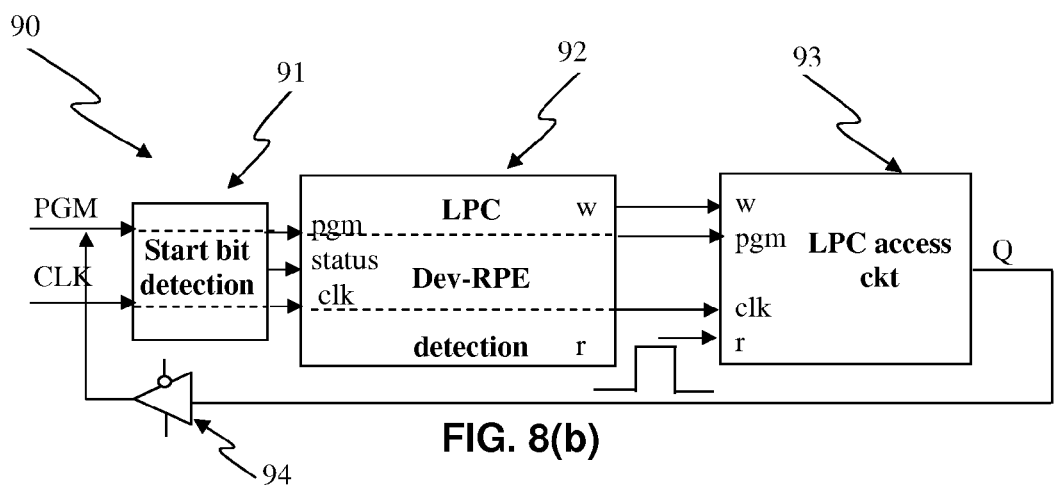
FIG. 8(b) shows a block diagram of a low-pin-count NVM, corresponding to FIG. 5(a), according to another embodiment.

FIG. 8(b) shows a block diagram of a schematic of a low-pin-count NVM 90 according to one embodiment. A start bit detection block 91 detects if a starting condition is met by the relative phase between PGM and CLK as shown in FIGS. 7(a) and 7(b). If yes, a LPC Dev-RPE detection block 92 further detects if a device ID and program, or erase access pattern are met, and then obtains a starting address. With a valid program, or erase status and the starting address, a LPC access block 93 performs actual program and erase cycles. Granting read access can be made simple by asserting a level or a pulse signal to "r" in another embodiment, since read is not a destructive operation. If the I/O transaction is a read, the tri-state buffer 94 is asserted so that the output Q is re-directed into the same PGM pin (which can serve as a shared PGM/Q pin). For some embodiments, external read is not desirable for data security reasons such that the tri-state buffer 94 can be omitted.

Figure 8C:
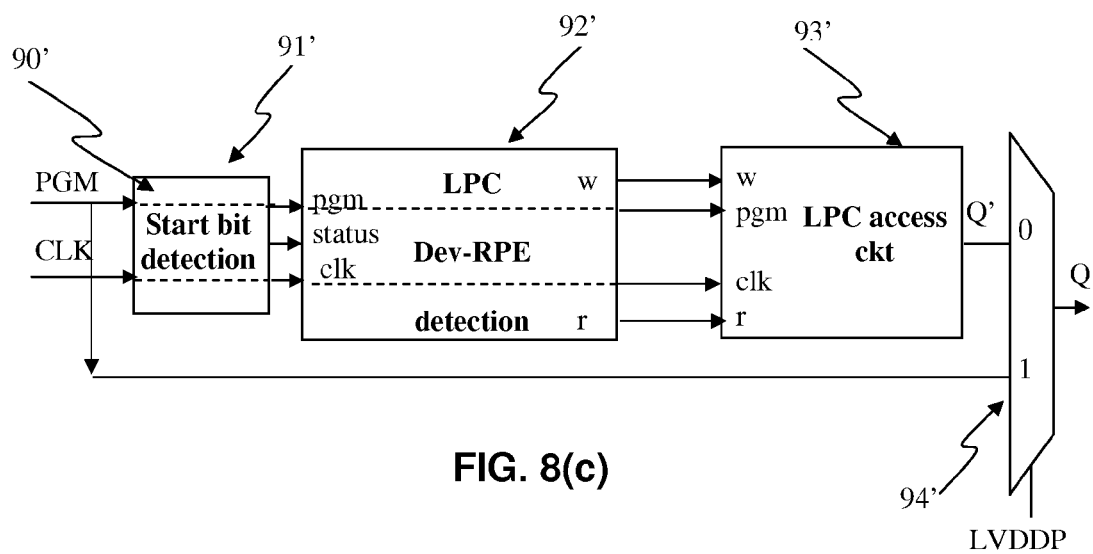
FIG. 8(c) shows a block diagram of a low-pin-count NVM with soft programming capability according to one embodiment.

Soft programming is a technique to allow storing data into registers for test before actual programming could happen. Soft programming is especially important for OTP because the OTP cells can only be programmed once. FIG. 8(c) shows a block diagram of a schematic of a low-pin-count NVM 90' with soft program scheme according to one embodiment. A start bit detection block 91' detects if a starting condition is met by the relative phase between PGM and CLK as shown in FIGS. 7(a) and 7(b). If yes, a LPC Dev-RPE detection block 92' further detects if a device ID and program/erase access pattern are met, and then obtains a starting address. With a valid program, or erase status and a starting address, a LPC access block 93' performs the actual program and erase cycles. A soft programming capability can be provided by adding a multiplex 94' at the output of the LPC access circuit 93' to bypass the LPC RPE detection block 92' and the LPC access circuit 93'. The data to be tested for programming can be provided from PGM to the multiplex 94' directly upon asserting an LVDDP signal. Alternatively, the LVDDP can be asserted once the VDDP voltage is detected lower than a program voltage. The start bit, device ID, or pattern bits for read/program/erase can be bypassed to save time. In other embodiment, a soft program mode can be activated when detecting a special mode in the R/P/E mode bits to accept data from PGM and route them to the output of LPC access circuit 93' Q' without using the multiplexer 94'. In yet another embodiment, the output registers can be built into the OTP. There are many variations and equivalent embodiments to perform soft programming and they are all within the scope of this invention. It is desirable to keep the VDDP below the program voltage to prevent accidental programming during soft programming.

Figure 9:
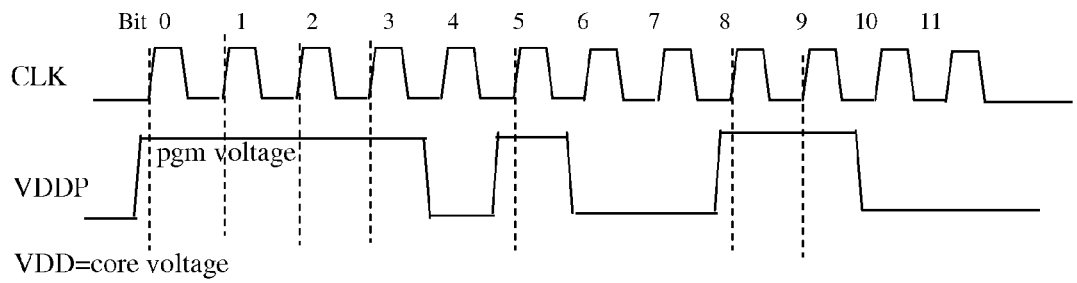
FIG. 9(a1) shows a program timing waveform of another low-pin-count NVM protocol, corresponding to FIG. 5(b), according to one embodiment.
Figure 9:
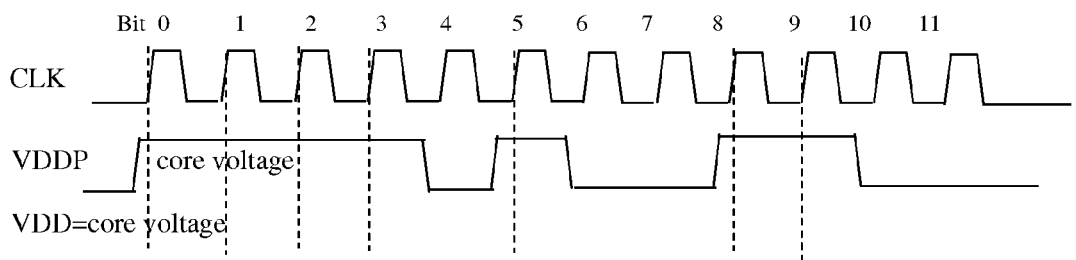
Figure 9:
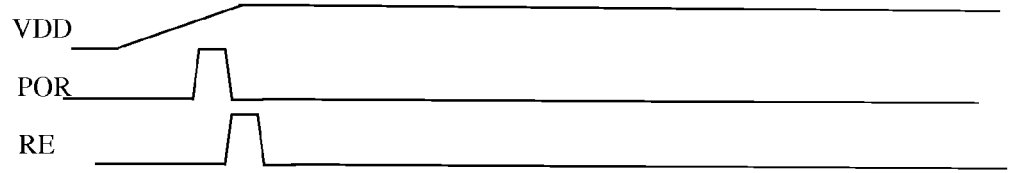
Figure 9:
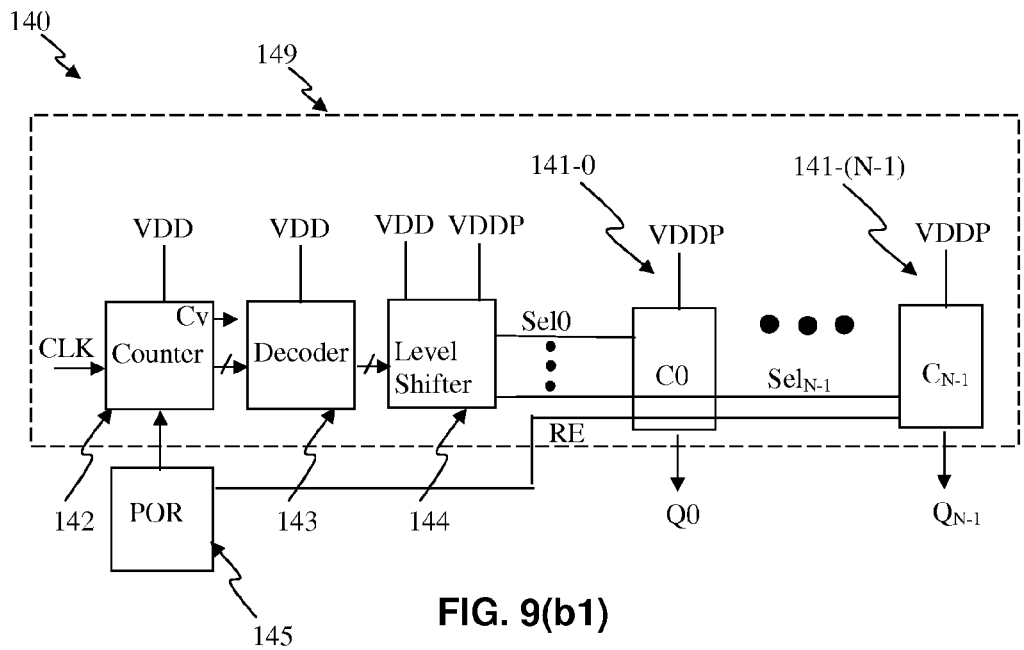
Figure 9:
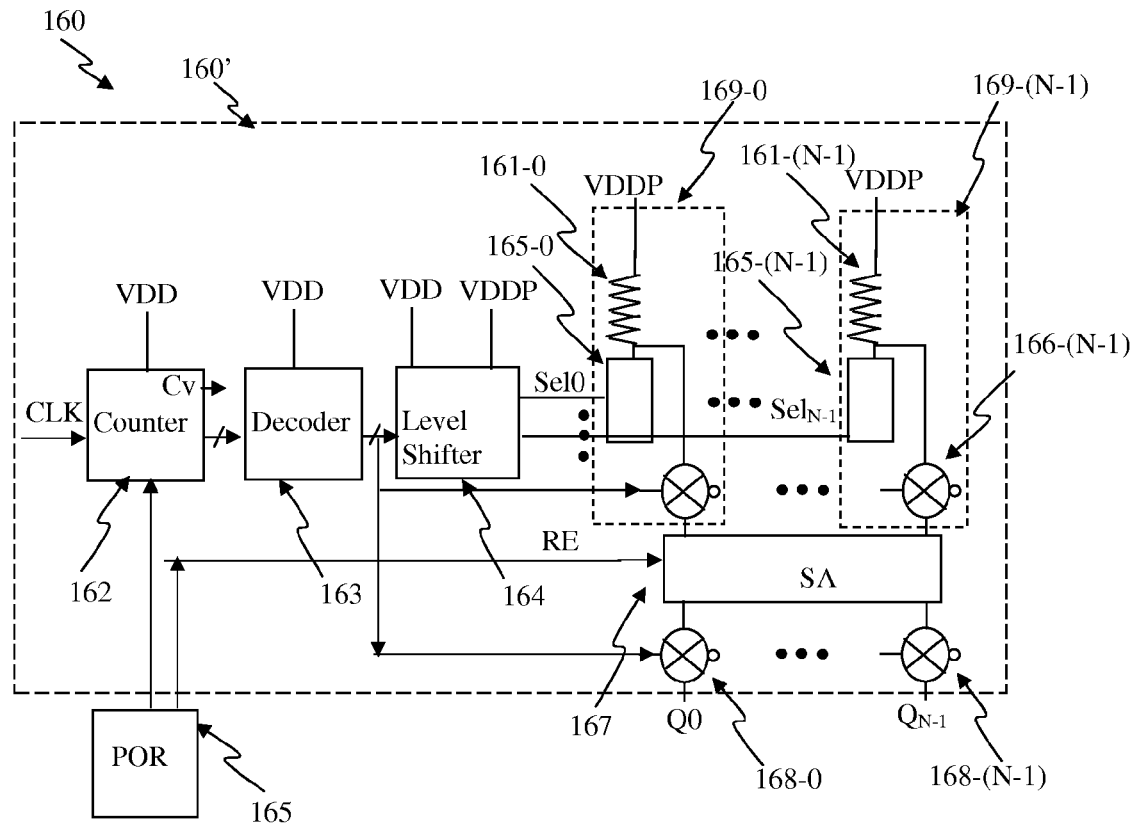
Figure 9:
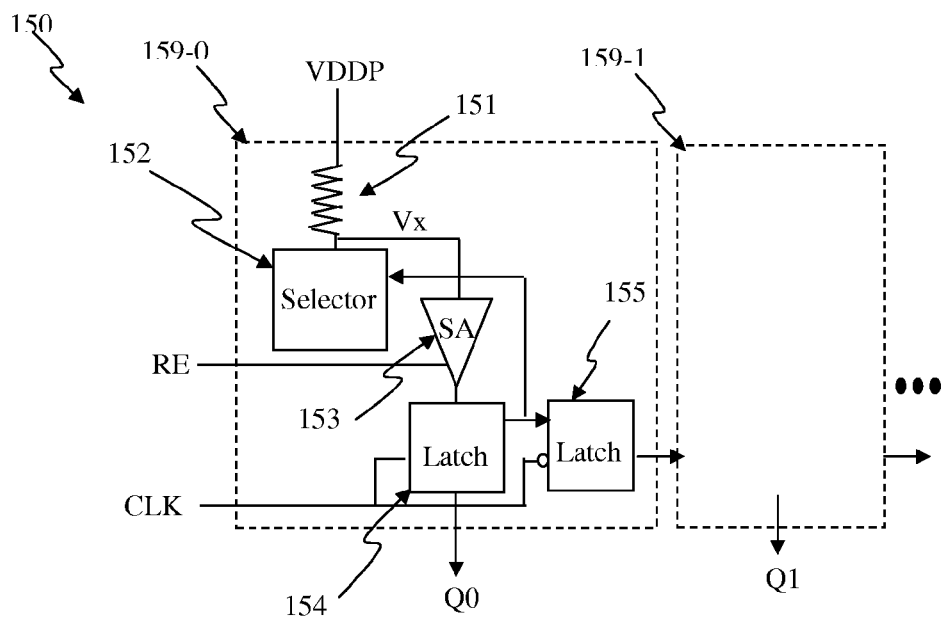
Figure 9:
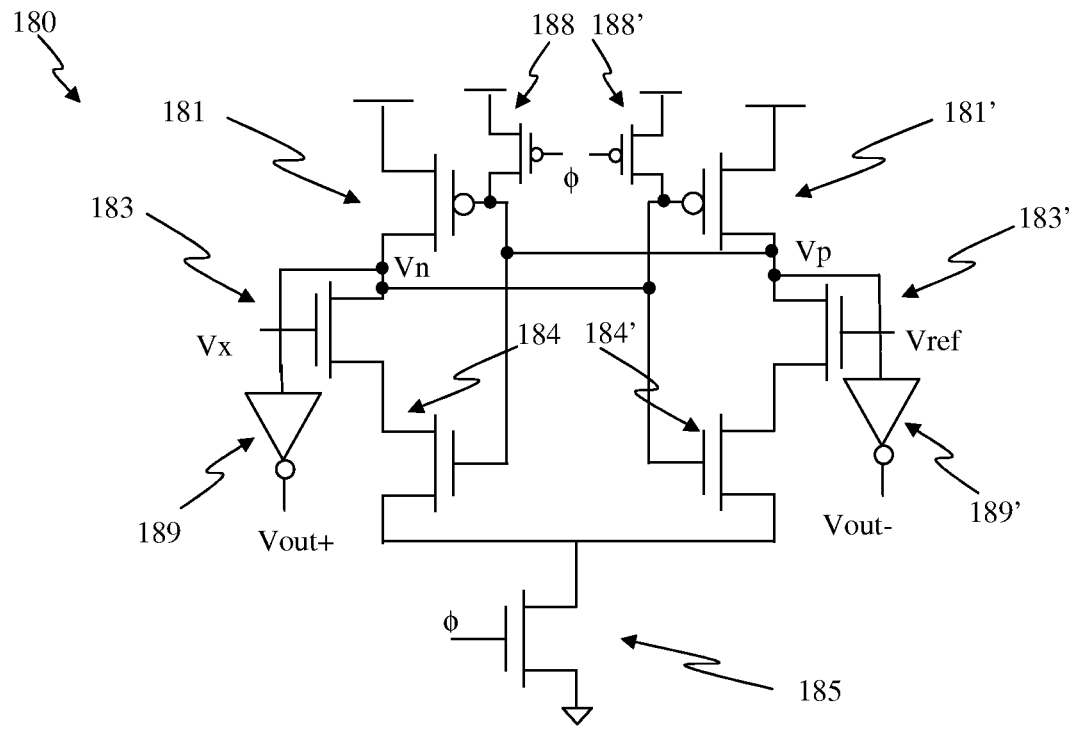
Figure 9:
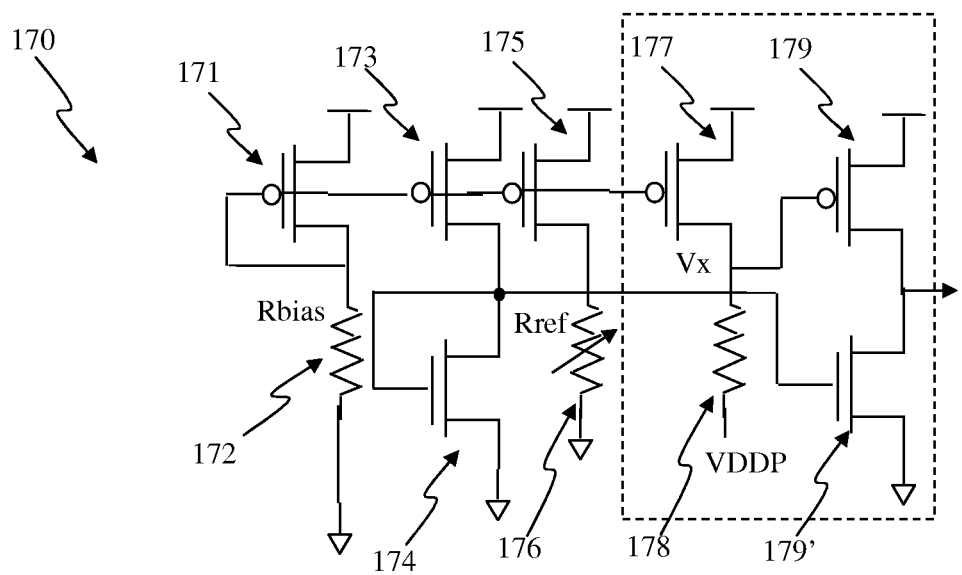

FIGS. 9(a1), 9(a2), and 9(a3) show timing waveforms of a low-pin-count NVM protocol that needs only two pins (i.e. CLK and VDDP) as shown in FIG. 5(b) for at least program, soft program, and read according to another embodiment. This protocol uses CLK to select and to enable the NVM cells sequentially and then relies on raising the VDDP to a high program voltage or not to determine programming into these cells. If the VDDP is at a high voltage (i.e. 5V for programming a fuse), the selected and enabled cells can be programmed. If the VDDP is at a core voltage (i.e. 1.8V for 0.18 um, or 1.2V for 0.13 um CMOS, etc.), the selected and enabled cells can not be programmed. But, instead, the data can be stored in the NVM cells with data being 0 or 1, depending on whether VDDP is at ground or core voltage. This is one embodiment for soft program. As for read, the resistance states of the NVM cells can be sensed and stored when the VDD is detected ramping up from ground to the core voltage. VDDP can be set to ground or VDD during read in one embodiment.

FIG. 9(a1) shows a timing waveform of programming NVM cells from 0 to 11 as an example. The VDD is set at a core voltage. CLK is toggling between ground and core voltage periodically to select and enable the NVM cells from 0, 1, 2, etc. VDDP can be raised to a high voltage (i.e. 5V for programming a fuse) to program those cells selected and enabled by CLK. For example, if cells 0, 1, 2, and 3 need to be programmed into 1, the VDDP can be set at a high voltage during the high CLK periods selecting those cells. Since cell 4 is not intended to be programmed, VDDP is set low at ground voltage when CLK is high at cell 4. Cells can be programmed only when both CLK and VDDP are at core and high voltage, respectively.

FIG. 9(a2) shows a timing waveform of soft programming cells from 0 to 11 as an example. The VDD is set at a core voltage. CLK is toggling between ground and core voltage periodically to select and enable cells from 0, 1, 2, etc. VDDP can toggle between a core voltage (i.e. 1.2V for 0.13 um CMOS) and ground to soft program those bits into 1 or 0 enabled by CLK. For example, if cells 0, 1, 2, and 3 need to be soft programmed into 1, the VDDP can be set at a core voltage during the high CLK periods of those cells. Since cell 4 is not intended to be soft programmed so that VDDP is set low at ground voltage when CLK is high at cell 4. In one embodiment, a detection circuit can detect if VDDP is set at the core voltage to enable sense amplifiers to sense the cells and store the data accordingly.

FIG. 9(a3) shows a timing waveform of reading cells in a low-pin-count NVM, according to one embodiment. When VDD is ramping up from ground to a core voltage, a Power-On Reset (POR) signal can be generated. This POR can be used to generate another pulse RE to enable at least one sense amplifier and to store sensed data. The POR or RE signal can activate a single or a plurality of sense amplifiers to sense a single or a plurality of cells in one embodiment. In another embodiment, more than one RE signals can be generated sequentially to sense more cells into the latches until all desirable cells are read. In another embodiment, the POR pulse can be used as RE.

Figure 1:
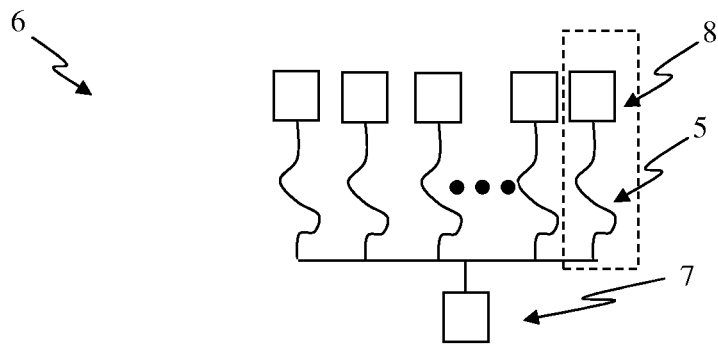
FIG. 1 shows a conventional OTP cell that has one pad for each fuse.
Figure 2A:
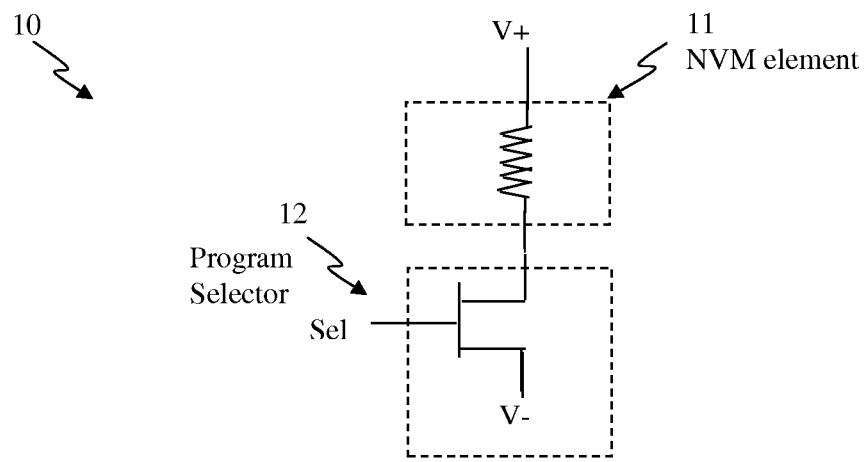
FIG. 2(a) shows a conventional NVM cell that has one NVM element and one MOS as program selector.
Figure 2B:
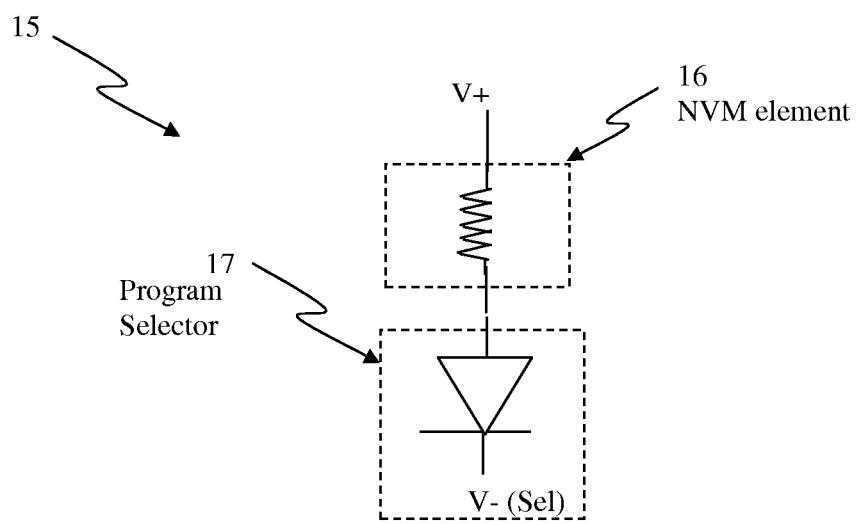
FIG. 2(b) shows a conventional NVM cell that has one NVM element and one diode as program selector.
Figure 2C:
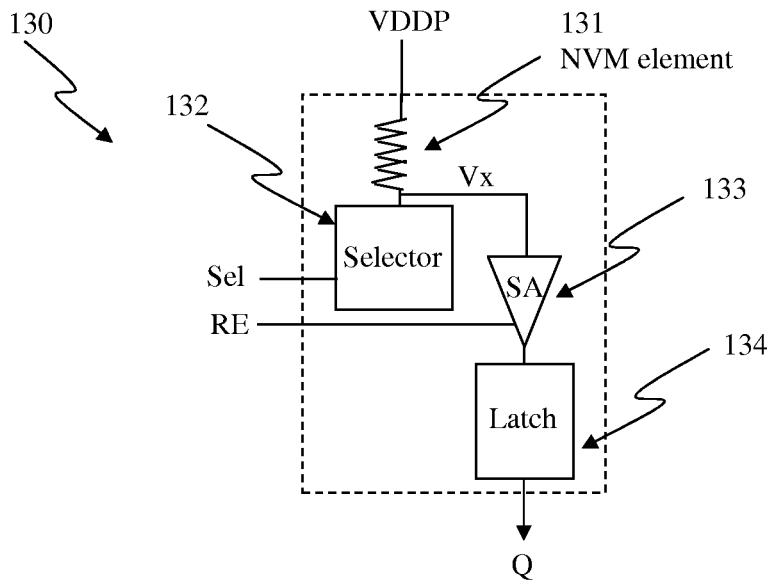
FIG. 2(c) shows a conventional low-pin-count NVM cell that has one NVM element, one program selector, a sense amplifier, and a latch.
Figure 3:
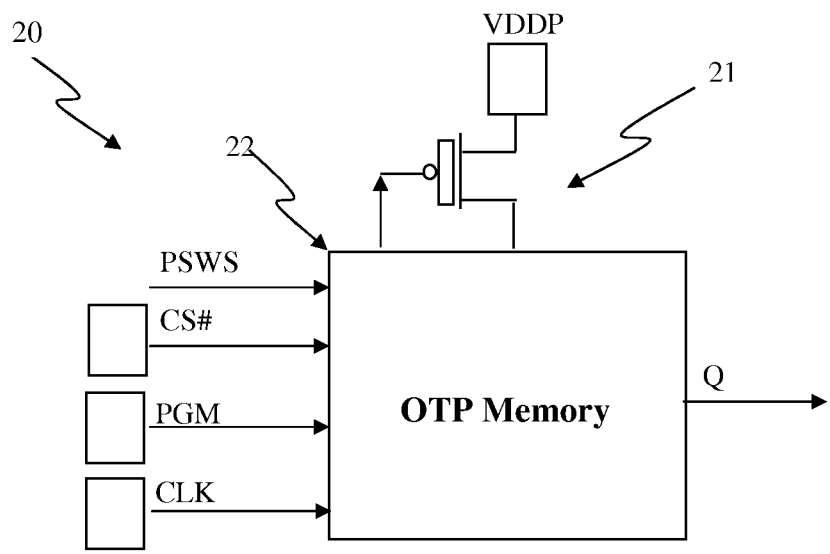
FIG. 3 shows a pin configuration of a low-pin-count OTP memory.
Figure 4A:
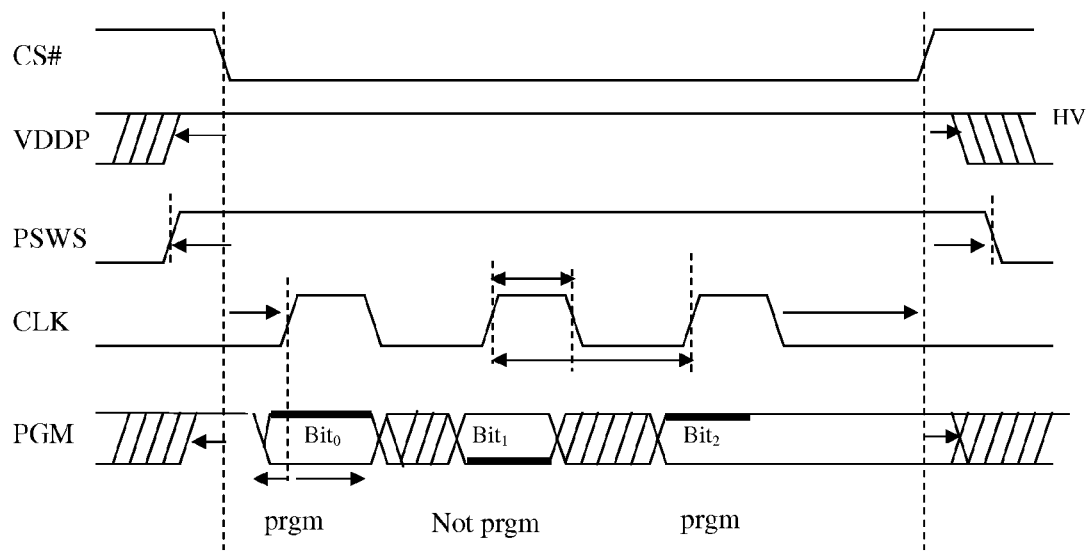
FIG. 4(a) shows a program timing waveform of a serial OTP memory.
Figure 4B:
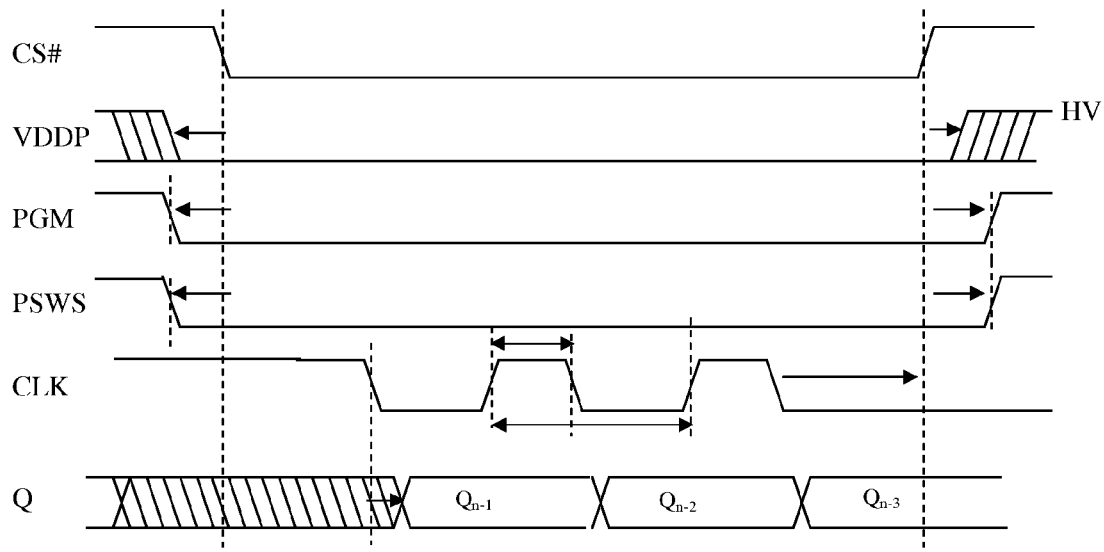
FIG. 4(b) shows a read timing waveform of a serial OTP memory.

FIG. 9(b1) shows a portion of a block diagram 140 of a low-pin-count NVM macro using a two-pin protocol as shown in FIG. 9(a1)-9(a2), according to one embodiment. The macro 140 has an NVM core 149 and a Power-On Reset (POR) circuit 145. The macro 149 has N NVM cells, 141-0 through 141-(N-1), which can be the cell 130 as shown in FIG. 2(c). This macro 149 also has at least one counter 142, a plurality of decoders 143, and level shifters 144. The counter 142 can be reset to all 0s by a power-on reset (POR) signal and then be incremented upon detecting one CLK toggle. The counter 142 may output a flag Cv to indicate an overflow. The counter outputs are decoded using a plurality of decoders 143 and further level shifted to VDDP voltage in level shifters 144. The outputs from the level shifters 144 can be used to select the cells from 141-0 to 141-(N-1) for programming. The level shifters 144 can be powered by VDDP when a high voltage at VDDP is detected, or VDD when a core voltage at VDDP is detected for program or read. The sense amplifiers in the cells 141-0 through 141-(N-1) can be activated by a Read Enable (RE) signal generated from a POR block 145.

FIG. 9(b2) shows a portion of a block diagram 160 of a low-pin-count NVM macro using a two-pin protocol as shown in FIG. 9(a1)-9(a2), according to another embodiment. The macro 160 has an NVM core 160' and a Power-On Reset (POR) circuit 165. This macro 160' has N NVM cells, 169-0 through 169-(N-1), which can be similar to the cell 130 as shown in FIG. 2(c) with input/output multiplexers, 166-i and 168-i, where i=0, 1, 2, . . . , N-1, respectively, to a shared sense amplifier 167. Each NVM cell 169-i has a programmable resistive element 161-i coupled to a selector 165-i, where i=0,1, . . . , N-1. This macro 160 also has at least one counter 162, a plurality of decoders 163, and level shifters 164. The counter 162 can be reset to all 0s by a power-on reset (POR) signal and be incremented upon detecting one CLK toggle. The counter 162 may output a flag Cv to indicate an overflow. The counter outputs are decoded using a plurality of decoders 163 and further level shifted to VDDP voltage in level shifters 164. The outputs from the level shifters 164 can be used to select the cells from 169-0 to 169-(N-1) for programming. The level shifters 164 can be powered by VDDP when a high voltage at VDDP is detected, or VDD when a core voltage at VDDP is detected for program and read, respectively. The node in an NVM cell between the NVM element and the selector can be enabled by CMOS pass gates 166-0 through 166-(N-1) to a shared sense amplifier 167 for sensing. The output of the sense amplifier 167 can be further selected by another set of CMOS pass gates 168-0 through 168-(N-1) to output nodes Q0 through $Q_{N-1}$. The pass gates 166-i and 168-i, where i=0, 1, 2, . . . , N-1, can be controlled by the outputs of the decoder 163 at core voltage level. The sense amplifier 167 can be enabled by a Read Enable (RE) from a Power-On Reset block 165. There can be one sense amplifier 167 for all or a portion of NVM cells in other embodiments. Similarly, the sense amplifier 167 can be turned on one or multiple times until all available cells can be sensed in yet another embodiment.

FIG. 9(b3) shows a portion of a block diagram of a low-pin-count NVM 150 according to yet another embodiment. The low-pin-count NVM 150 has a plurality of NVM cell 159-0, 159-1, etc. The NVM cell 159-0 has an NVM 151, a selector 152, a sense amplifier 153, a master latch 154 and a slave latch 155. The master and slave latches of 154 and 155 constitute a shift register to the next NVM cell 159-1. When the NVM 150 is powered up to an initial state, the latches 154 and 155 are set to 1 to select the selector 152 in NVM cell 159-0, while the other latches in the other NVM cells are set to 0s. When the CLK toggles, the "1" in the latches 154 and 155 are shifted to the latches in the NVM cell 159-1 to select the 159-1 cell. The cells selected and enabled by CLK allow each VDDP pulse being programmed or soft programmed into the cells. Read can be activated by raising a RE signal to enable the sense amplifier 153 to an output Q0, Q1, . . . etc. There are many variations and equivalent embodiment of the low-pin-count NVMs and they are all within the scope of this invention.

FIGS. 9(c1), 9(c2), and 9(c3) only show three of many possible embodiments of a low-pin-count NVM macro, The number of the NVM cells can vary. The NVM cells can be organized in one or two dimensional array electrically or physically. The numbers of row or column may vary in one or two dimensional array. The selector in an NVM cell can be a MOS, diode, or bipolar device. There can be a single or a plurality of sense amplifiers to sense a single or a plurality of cells simultaneously. The sense amplifiers can be activated more than once to sense more bits by a POR signal or by a signal generated from internal or external of the low-pin-count NVM. The actual programming time can be during the CLK low periods rather than the high periods. There are many variations and equivalent embodiments for the low-pin-count NVM protocol and they are all within the scope of this invention for those skilled in the art.

FIG. 9(c1) shows a portion of a sense amplifier schematic 180 for a low-pin-count NVM macro according to one embodiment. Vx is a node between the NVM element and the selector that can be provided as an input to a sense amplifier. For the CLK/VDDP two-pin protocol, the VDDP is tied to ground for an NVM cell as shown in FIG. 2(c) and a pullup (not shown in FIG. 9(c1)) is applied to Vx as an input to the sense amplifier 180 during sensing. Similarly, a Vref from a reference cell provides a reference input to the sense amplifier 180. The sense amplifier 180 has a sensing branch that has a PMOS 181 with the source coupled to VDD. The drain of PMOS 181 is coupled to the drain of another NMOS 183. The source of NMOS 183 is coupled to the drain of another NMOS 184 whose source is coupled to a drain of a common NMOS 185. The gate of the NMOS 183 is coupled to Vx. A reference branch has a PMOS 181' whose source is coupled to VDD and whose drain is coupled to a drain of an NMOS 183'. The source of NMOS 183' is coupled to the drain of an NMOS 189' and whose source is coupled to a drain of a common NMOS 185. The gate of the NMOS 183' is coupled to Vref. The gates of MOS 181 and 184 is coupled together and further coupled to the drain of the PMOS 181', Vp. Similarly, the gates of MOS 181' and 184' are coupled together and further coupled to the drain of the PMOS 181, Vn. There are two inverters 189 and 189' whose inputs are coupled to Vn and Vp, respectively, and whose outputs are Vout+ and Vout– respectively, the outputs of the sense amplifier 180,. There are two pull-ups 188 and 188' whose sources are coupled to VDD and whose drains are coupled to Vp and Vn, respectively. The gates of pull-ups 188, 188', and the common NMOS 185 are coupled to an activation signal φ. When Vx and Vref has sufficient differential voltage (e.g. 100 mV) developed, the sense amplifier 180 can be activated by pulling the signal φ to VDD. There can be a pair of cross-coupled NAND gates coupled to the outputs Vout+ and Vout− to latch the sensed data so that φ can be returned to ground after sensing. The sense amplifier shown in FIG. 9(c1) is an example to illustrate the sensing concept only. There are many variations and equivalent embodiments of latch-type sense amplifiers that can be applied to any NVM cells in a low-pin-count NVM.

FIG. 9(c2) shows a portion of a sense amplifier schematic 170 for a low-pin count NVM, according to another embodiment. This sense amplifier 170 has a bias branch that has a PMOS 171 whose source is coupled to VDD and whose gate and drain are coupled together and further coupled to a bias resistance Rbias 172. The other end of Rbias is coupled to ground. There is a reference branch that has a PMOS 175 whose source is coupled to VDD, whose gate coupled to the gate of PMOS 171, and whose drain coupled to a reference resistance Rref 176. The other end of Rref is coupled to ground. Similarly, there is a sensing branch that has a PMOS 177 whose source is coupled to VDD, whose gate is coupled to the gates of PMOS 171 and 175, and whose drain is coupled to the Vx of a NVM cell as shown in FIG. 9(c2). The other end of the NVM element VDDP is coupled to VDDP, which can be set to ground for sensing. PMOS 179 and NMOS 179' constitute a second stage of the sense amplifier 170. The source of 179 is coupled to VDD, the gate is coupled to Vx, and the drain is coupled to the drain of NMOS 179'. The gate of 179' is coupled to a current mirror of the bias branch. The current mirror branch has a PMOS 173 and an NMOS 174. The source of the PMOS 173 is coupled to VDD, the gate coupled to the gate of PMOS 171, and the drain coupled to the drain of the NMOS 174. The gate of the NMOS 174 is coupled to the drain of the same device and to the gate of 179'. The source of the NMOS 174 is coupled to ground. In this static sense amplifier embodiment, the VDDP of the NVM cell is coupled to ground for sensing. The sense amplifier 170 shown in FIG. 9(c2) is for example only. There are many variations and equivalent embodiments of sense amplifier that can be applied to any NVM cells in a low-pin-count NVM.

Figure 9D:
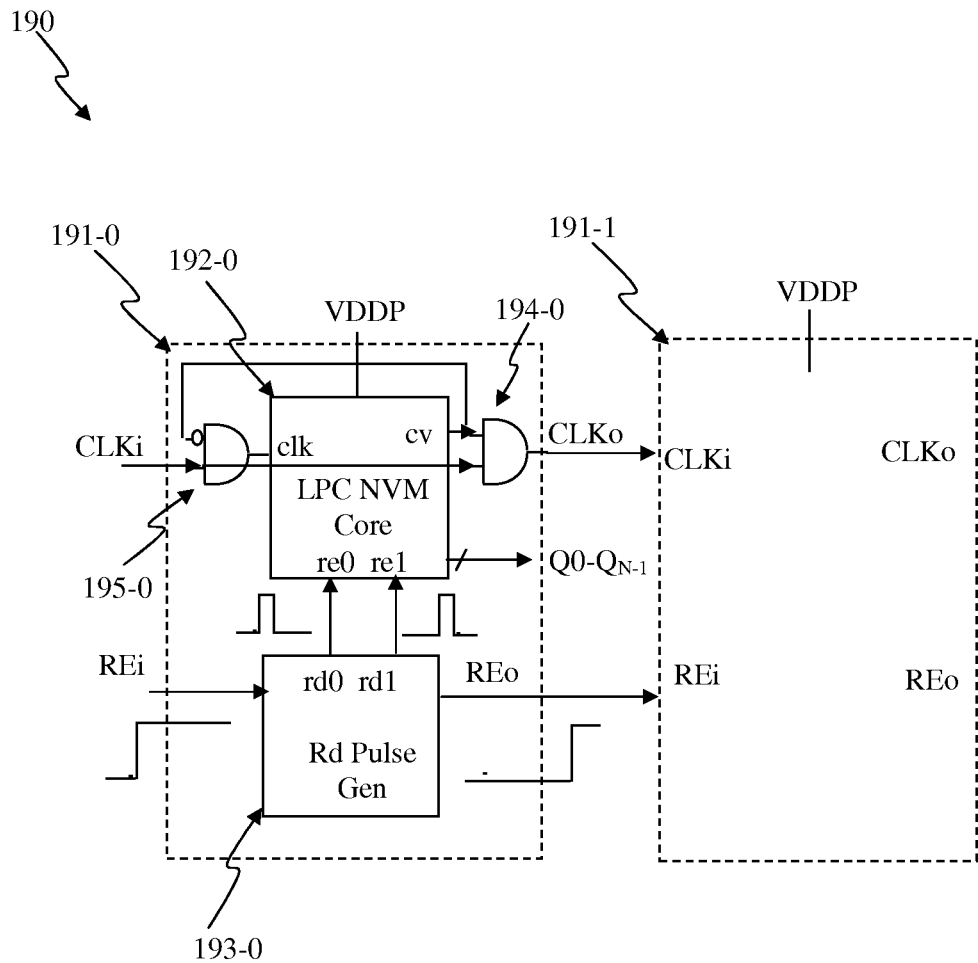
FIG. 9(d) shows a portion of a block diagram of cascaded low-pin-count NVM, related to the NVM in FIG. 5(a), according to one embodiment.
Figure 9:
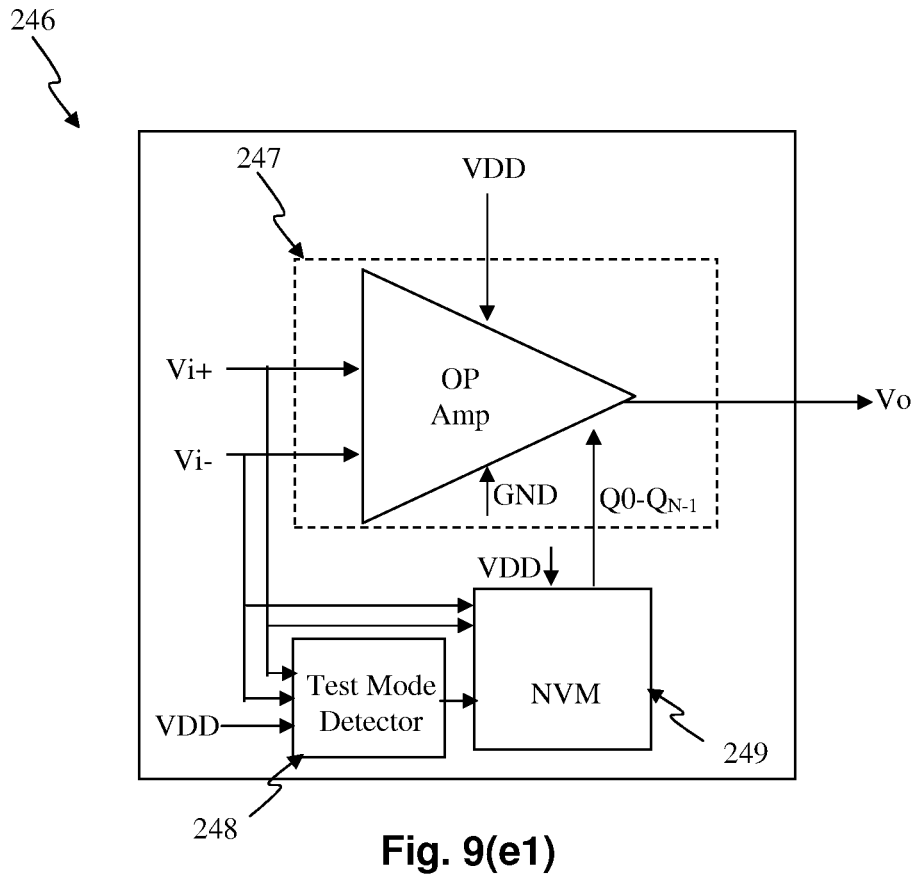
Figure 9:
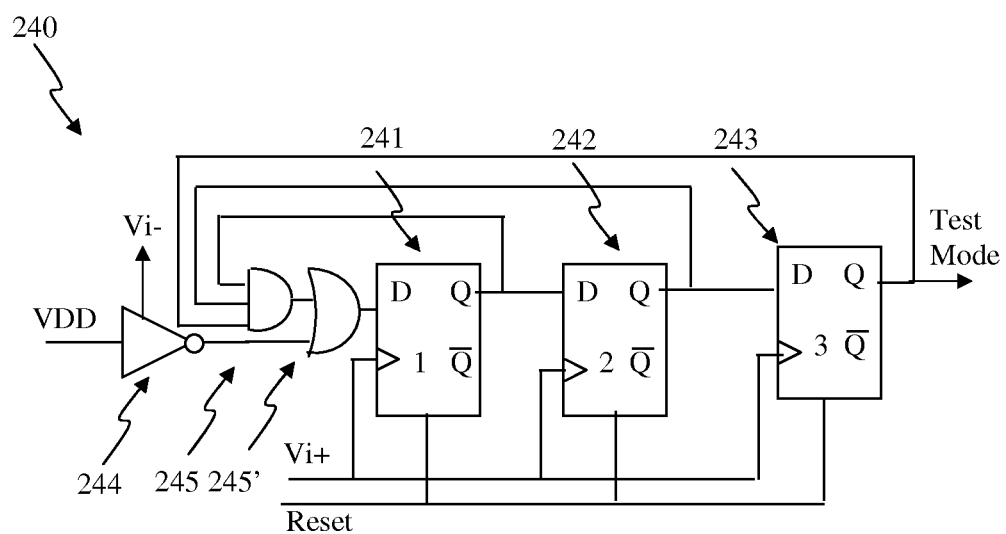
Figure 9:
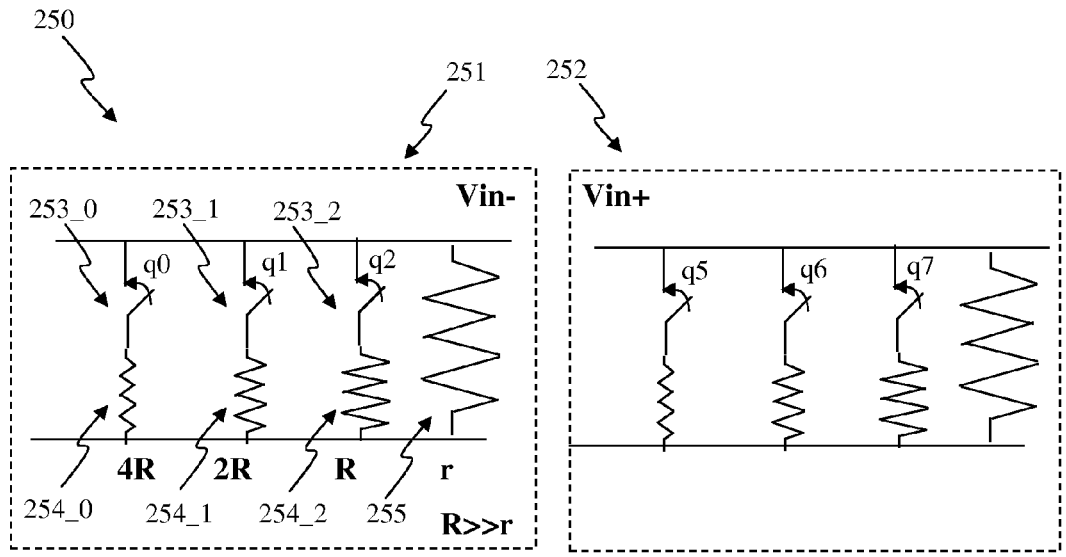
Figure 9:
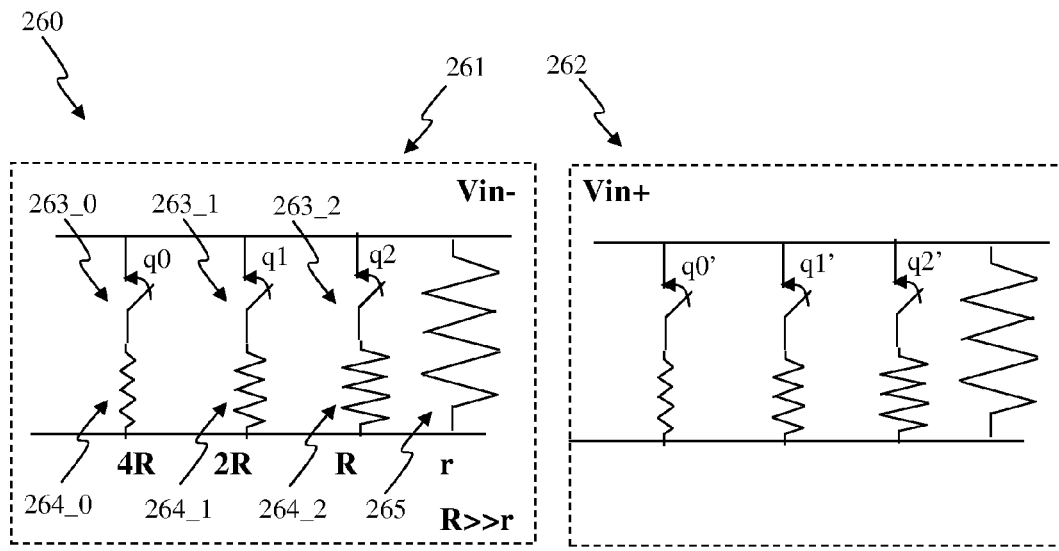

The low-pin-count NVM can be cascaded. FIG. 9(d) shows a portion of a schematic 190 that has two instances of a low-pin-count NVM cascaded as 191-0 and 191-1. The low-pin-count NVM 191-0 has an LPC NVM Core 192-0 (e.g. 149 in FIG. 9(b1) or 160' in FIG. 9(b2)), a read pulse generator 193-0, a clock output buffer 194-0, and a clock input buffer 195-0. The POR is not included in the LPC NVM 192-0. The output clock buffer 194-0 generates a clock output to the next instance when the counter inside the LPC NVM core 192-0 overflows with a flag cv. And the clock input buffer 195-0 is disabled by cv to prevent accepting further clock signal to the instance 191-0. By do this way, the clock from CLKi can be passed to the next instance. Upon receiving an Read Enable input (REi), the Rea Pulse Generator 193-0 generates two read pulses rd0 and rd1, as an example, to read the contents of the LPC NVM. After the first instance 191-0 is read, a REo can be generated as an input to the REi of the next stance 191-1 after delaying two pulses re0 and re1. By doing this way, the contents of the LPC NVM can be read sequentially from the first, second, and third instances, etc. In one embodiment, a POR circuit can be input to REi of the Read Pulse Generator 193-0 to read the contents of the low-pin-count NVMs sequentially upon powering up. In another embodiment, all contents in the low-pin-count NVMs can be read upon powering up. There are many variations and equivalent embodiments for cascading LPC NVMs and they all within the scope of this invention.

In some applications, absolutely no additional pins can be provided for a low-pin count NVM embedded in an integrated circuit for device trimming. FIG. 9(e1) shows an integrated circuit 246 that has an Operation Amplifier (OPA) 247, which has only 5 pins: Vi−, Vi+, Vo, VDD, and VSS. However, an OPA needs to be trimmed for input DC offset, gain, transconductance, frequency compensation, and slew rate, etc. without any additional pins in a 5-pin package. As such, in one embodiment, for example, by detecting a single or combination of unusual conditions of voltages, currents, or timings, a test mode can be entered so that at least a portion of the I/Os of the OPA 247 can be used for I/Os of the NVM 249. For example, Vi−, Vi+, VDD, and VSS of the OPA 247 can be used as CLK, PGM, VDDP, and VSS of the NVM 249, respectively. The output of the OPA 247 Vo can also be used as an output of the NVM 249. A test mode detector 248 can be designed to perform this detection function either as a stand alone block or built into the NVM 249.

FIG. 9(e2) shows a portion of a schematic of a test mode detector 240, corresponding to Test Mode Detector 248 in FIG. 9(e1), according to one embodiment. Assuming the normal operation range of the OPA is between 0 to 5V and the absolute maximum voltage of any pin is 7.0V, any pin that is higher than 5V, 6.5V for example, is considered an unusual (or abnormal) condition. To prevent any glitches to mis-trigger into the test mode, this unusual condition can be detected a few consecutive times to ensure going into test mode deliberately. The test mode detector 240 has three D flip-flops 241 through 243, an inverter 244, and a 3-input AND 245 and an OR 245'. The inverter 244 has a supply voltage from Vi− and an input from VDD. If the VDD=5V but Vi−=6.5V, the inverter output is high in a very unusual condition, because VDD voltage tends to be higher than any input pins. Subsequently, this input can be sampled by Vi+ for three times and then latched in the flip-flops 241-243 through gates AND 245 and OR 245'. Sampling by Vi+ three times consecutively can prevent any glitches to mis-fire into the test mode. Once the three flip-flops 241-243 latch all 1s, the data in the flip-flops will be latched all 1s even if the input of the inverter 244 changes, embodied by the Boolean logic AND 245 and OR 245'. The unusual conditions can be sampled any number or not latched at all in one embodiment. The flip-flops can be reset during VDD ramping up in another embodiment.

Any out of ranges or polarity of voltage and/or current that should not be found in normal operations can be used as unusual conditions to trigger into a test mode. Any timing transitions, with or without certain pre-determined patterns, that can not be found in normal operations can be used as unusual conditions. Any duration of transients that can not be found in normal operations can be used as unusual conditions. Any inductive or capacitive coupling that should not be found in normal operations can be used as unusual conditions. Any modes that deviate from normal operations, such as idle, sleep, hibernation, shutdown, protection, or unused product test modes, can be used as unusual conditions. Any abnormal temperature and/or temperature changes can be used as unusual conditions. Return to normal mode can be triggered by similar procedures with the opposite conditions as getting into the test mode or after a time duration. There are many variations and equivalent of unusual conditions and detection and their combinations that can be used to go into a test mode and that are all within the scope of this invention for those skilled in the art.

FIG. 9(f1) shows a portion of a schematic 250 for trimming a pair of resistor networks for matching according to one embodiment. A pair of resistor networks 251 and 252 are associated with two inputs Vi− and Vi+ of the OPA 247 in FIG. 9(e1), respectively. The resistor network 251 in Vi− side has a main resistor r 255 and three large resistors 254_0, 254_1, and 254_2 associated with three switches 253_0, 253_1, and 253_2, respectively. The resistor network 252 in Vi+ side has similar components. The resistances of resistors 254_0, 254_1, and 254_2 are 4R, 2R, and R, respectively, while R is very larger than r. The switches 253_0, 253_1, and 253_2 can be open or close to adjust the equivalent resistance in the Vi− side. Opening and closing a switch can be assigned as value 1 and 0, respectively. Since the resistances of the resistors 254_0, 254_1, and 254_2 are binary weighted and R>>r, opening or closing the switches 253_0, 253_1, and 253_2 can increase or decrease the main resistor r 255 slightly in binary fashion according to the switch values. The switch values can be assigned from outputs of an OTP. To provide $2^N$ steps for trimming, the total number of trimming resistors and switches are N for one side, or 2N OTP bits total for two sides.

FIG. 9(f2) shows a portion of a schematic 260 for trimming a pair of resistor networks for matching according to another embodiment. A pair of resistor networks 261 and 262 are associated with two inputs Vi− and Vi+ of the OPA 247 in FIG. 9(e1), respectively. The resistor network 261 in Vi− side has a main resistor r 265 and three large resistors 264_0, 264_1, and 264_2 associated with three switches 263_0, 263_1, and 263_2, respectively. The resistor network 262 in Vi+ side has similar components. The resistances of resistors 264_0, 264_1, and 264_2 are 4R, 2R, and R, respectively, while R is very larger than r. The switches 263_0, 263_1, and 263_2 can be open or close to adjust the equivalent resistance in the Vi− side. Opening and closing a switch can be assigned as value 1 and 0, respectively, and all switches are assumed close initially. Since the resistances of the resistors 264_0, 264_1, and 264_2 are binary weighted and R<<r, opening or closing the switches 263_0, 263_1, and 263_2 can increase or decrease the main resistor r 265 slightly in binary fashion according to the switch values. Since the absolute values of the resistor networks 261 or 262 does not matter but only the match between the networks 261 and 262, only one side of the switches needs to be selectively open from an initial state. In other words, if the switch values come from outputs of an OTP, only one set of the resistor network 261 or 262 needs to be assigned with OTP outputs to trim (i.e. Q2-Q0 coupled to the switches in network 261 or 262), while the switches in the other set can be in the initially state (i.e. all 0s or all 1s). Therefore, only one additional OTP output Q3 is needed to specify which side of network to trim. To provide $2^N$ steps for trimming, the total OTP bits are N for both sides plus one for side selection, or N+1 bits total, though the total number of switches is still 2N. In general, the number of OTP bits required for M step trimming is an integer not smaller than $\log_2(M)+1$.

FIGS. 9(f1) and 9(f2) only show two examples to illustrate the device networks for trimming. The devices to be trimmed can be any devices, such as resistors, capacitors, inductors, transistors, diodes, bipolar transistors, or MOS devices. The number of devices and switches can be any numbers in a trimming network. The switches can be any switching devices, such as diode, bipolar, or MOS. The device values can be the same for equal-step trimming, binary weighted for binary-step trimming, or any values for any kinds of combinations. The device network to be trimmed can be further added on with devices in serial and/or in parallel to provide additional scaling and/or offset. The devices added on can be the same kind or different kinds of devices as those devices in the network. The device network can be trimmed to meet specifications, instead of matching with the other set of device network. The devices can also be trimmed in analog means, for example, the resistance can be programmed with resistance increased progressively by applying a single or a plurality of pulses until a desirable value is achieved. In the embodiment as shown in FIG. 9(f1), the other side that does not need to be trimmed can be further used for trimming in a second pass. For example, one set can be used for trimming in the wafer level and the other set can be used for trimming after package in another embodiment. The device network can be set to certain values in wafer level by soft programming so that other tests can continue, and then the actual programming can be done after package. The NVM for trimming as shown in FIGS. 9(e1) and 9(e2) are only for illustrative purposes. Particularly, the NVM can be One-Time Programmable (OTP) device that can only be programmed once. The OTP can be at least an electrical fuse, anti-fuse, or floating-gate device. The integrated circuit to be trimmed can be Operational Amplifier (OP Amp), voltage regulator, current regulator, DC-DC or DC-AC converter, quartz crystal, any power management integrated circuits, or any SoCs. The integrated circuit to be trimmed can have no more than 2 pins, including power supply, program supply, input, output, and/or ground. Trimming can still be achieved by using unusual conditions to get into a test mode and then using the existing pins of the integrated circuit to access NVM for program, soft program, or read. In terms of integrated circuits to be trimmed, trimming networks, unusual conditions, or methods of getting into or out of the unusual conditions, there are many variations and equivalent embodiments for this invention and they are all within the scope of this invention according to those skilled in the art.

Figure 10A:
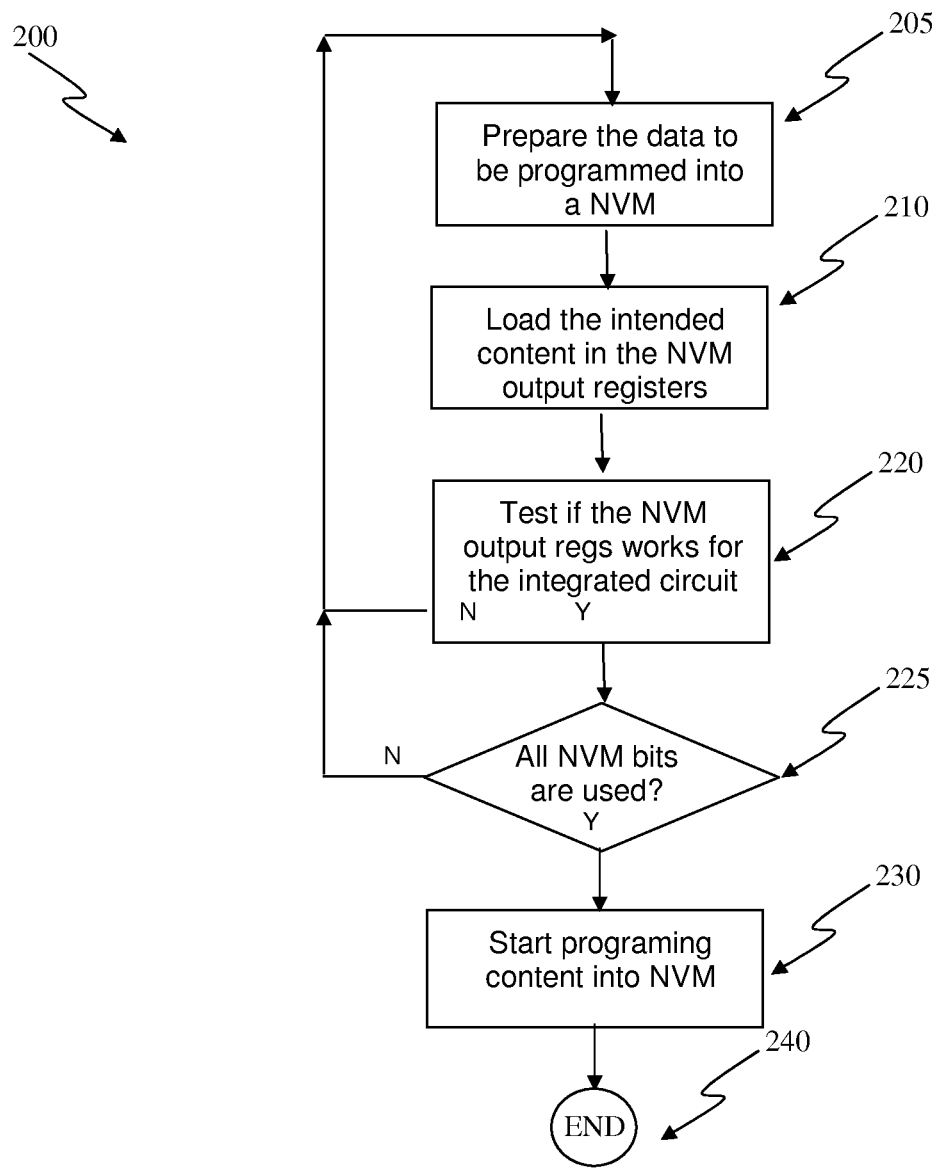
FIG. 10(a) shows a soft program procedure for a low-pin-count NVM. corresponding to FIG. 5(a) or 5(b), according to one embodiment.

In most applications, the NVM data are for device trimming, configuration or parameters storage, memory repair, or MCU code. Normally, data are loaded into registers to test if they can function properly before actually programming. This technique is called soft program. FIG. 10(a) shows a flow chart of a soft-program procedure 200 for a low-pin-count NVM. The procedure 200 starts with preparing the data to be programmed into an NVM in step 205, and then loading the intended NVM data to be programmed into the output registers of the NVM in 210. The registers are tested to check if they can function as expected at 220. If not, go back to step 205 to adjust the data for testing. If yes, proceed to test check if all NVM bits have been used in step 225. If yes, start programming the contents into the NVM at 230 and stop after finishing in step 240. Otherwise, proceed to prepare a few more bits of NVM data for programming in step 205. Soft programming is especially useful for OTP memories because such devices can only be programmed once.

Figure 10B:
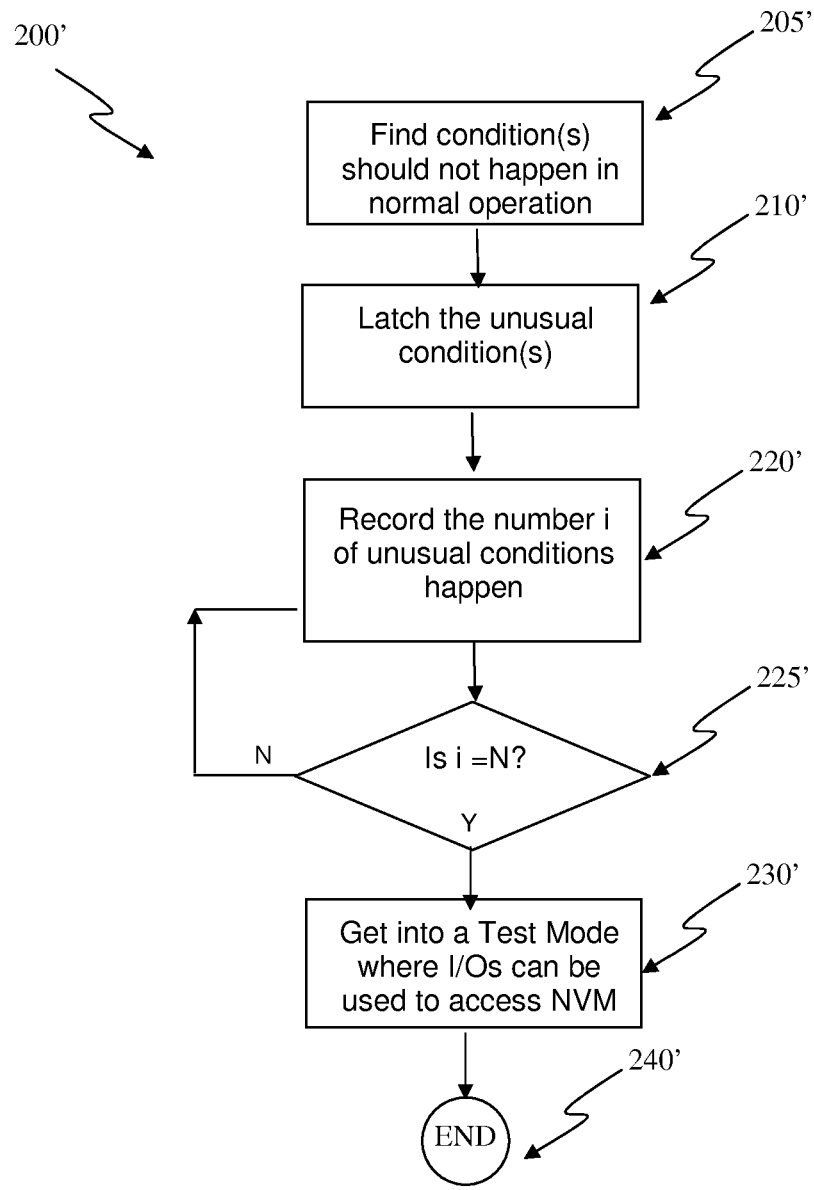
FIG. 10(b) shows a flow chart of a test mode detection procedure for a low-pin count NVM, according to one embodiment.

FIG. 10(b) shows a flow chart of a test mode detection procedure 200' for a low-pin-count NVM. The procedure 200' starts with finding unusual (or abnormal) conditions in an integrated circuit with an embedded NVM in step 205'. The unusual conditions can be any combinations of voltage level and/or timings that should not happen in normal operations. Then latch the unusual condition in step 210' and record the occurrence of unusual condition i in step 220'. Check if the occurrence of the unusual condition equal to a preset number N in step 225'. If not, go back to step 220' to record more occurrences. If yes, proceed to go into a test mode so that a portion or all of the I/Os in the integrated circuit can be used as the I/Os of the embedded NVM. This test mode embodiment is especially useful for OTP memories and/or with low pin counts because such devices can only be programmed once for trimming device mismatches.

Figure 11A:
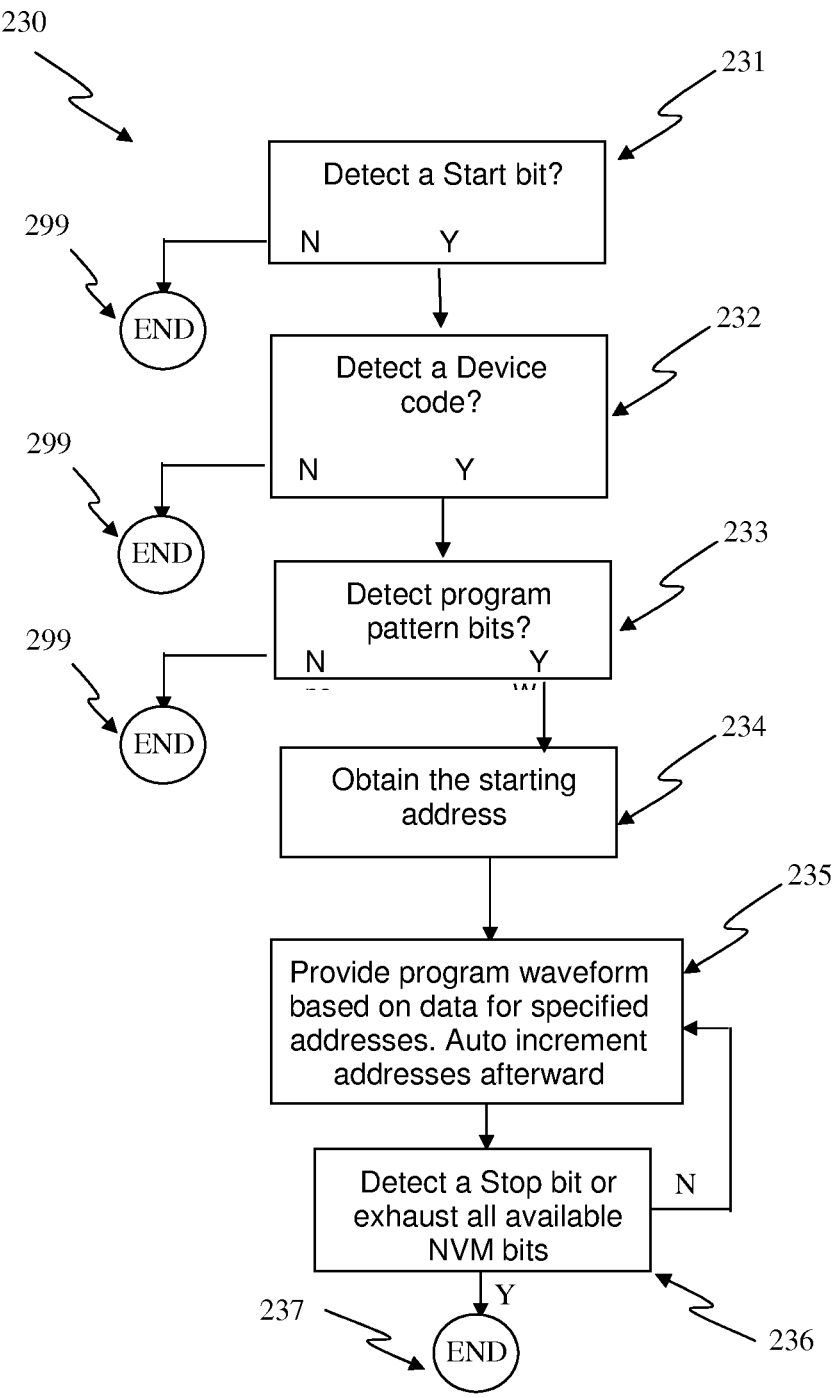
FIG. 11(a) shows a flow chart of a program procedure for a low-pin count NVM, corresponding to FIG. 5(a), according to one embodiment.

FIG. 11(a) shows a flow chart of a program procedure 230 for a low-pin-count NVM, corresponding to FIGS. 6(a) through 8(c), according to one embodiment. The procedure 230 starts with detecting a start bit at 231. If a start bit is detected, proceed to detect a valid device ID at 232., or ends at 299 with errors if not detected. Then, the procedure 230 proceeds to detect a program pattern at 233, or ends at 299 with errors if not detected. The procedure 230 continues to obtain a starting address in 234. After the start bit, device ID, program pattern, and starting address are checked and obtained, the next step would be to provide an adequate program waveform based on the data for the corresponding address at 235 and auto increment the address afterward. The programming progresses until a stop bit is detected in 236 or the available bits in an NVM are exhausted. Then the procedure 230 finishes at 237. The above discussion is for illustrative purposes. For those skilled in the art understand that some steps can be omitted, some steps can be in different order, the number of bits in each bit field can be different, the bit field order can be interchangeable and that are still within the scope of this invention.

Figure 11B:
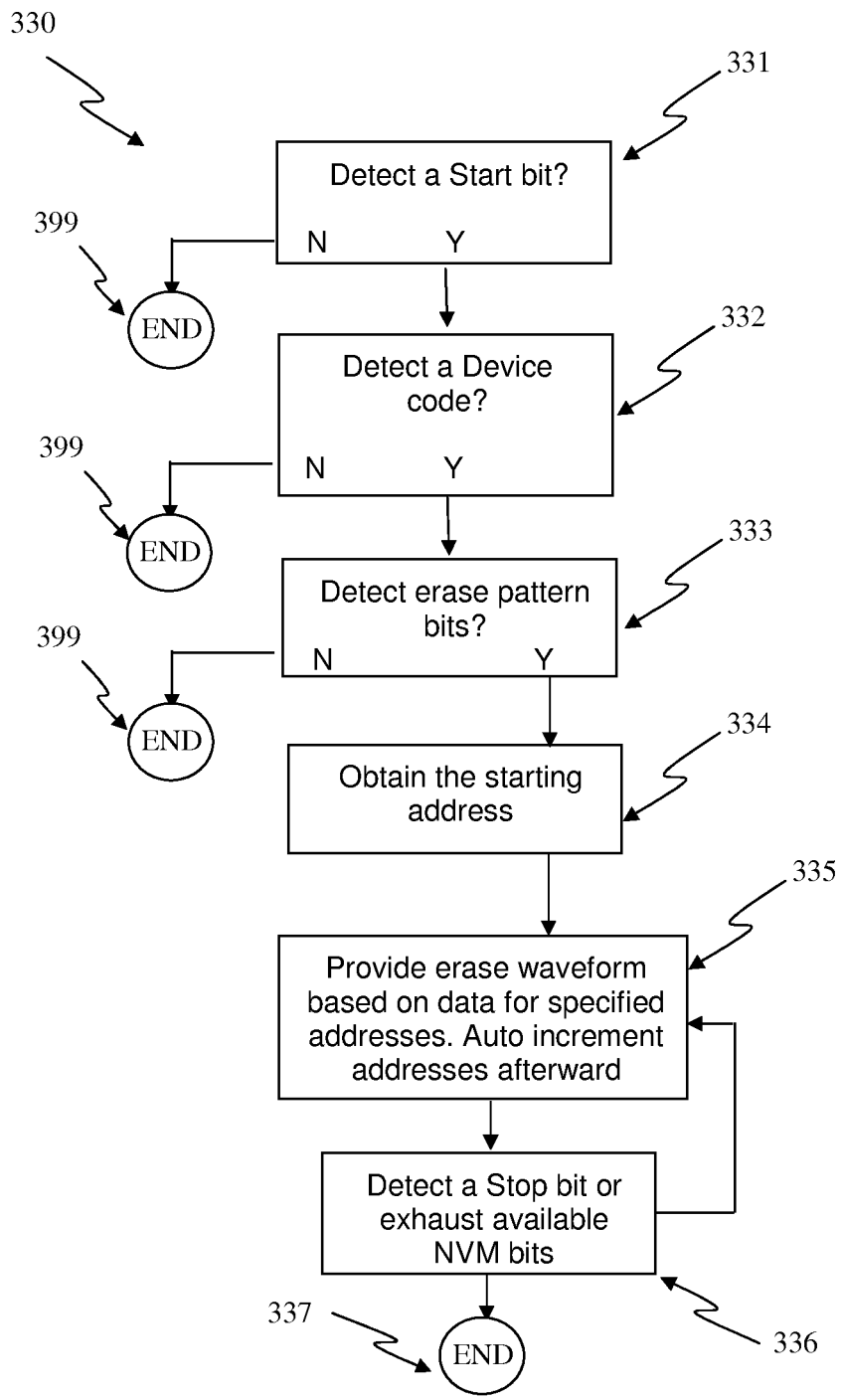
FIG. 11(b) shows a flow chart of a soft program procedure for a low-pin count NVM, corresponding to FIG. 5(a), according to one embodiment.

FIG. 11(b) shows a flow chart of an erase procedure 330 for a low-pin-count NVM, corresponding to FIGS. 6(a) through 8(c) according to one embodiment. The procedure 330 starts with detecting a start bit at 331. If a start bit is detected, proceed to detect a valid device ID at 332, or ends at 399 with errors if not detected. Then, the procedure 330 proceeds to detect an erase pattern at 333, or ends at 399 with errors if not detected. The procedure 330 continues to obtain a starting address at 334. After the start bit, device ID, erase pattern, and starting address are checked and obtained, the next step would be to provide an adequate erase waveform based on the data for the corresponding address at 335 and auto increment the address afterward. The erasing progresses until a stop bit is detected at 336 or the available bits in a low-pin-count NVM are exhausted, then the procedure 330 finishes at 337. The above discussion is for illustrative purposes. For those skilled in the art understand that some steps can be omitted, some steps can be in different order, the number of bits in each bit field can be different, the bit field order can be interchangeable and that are still within the scope of this invention.

Figure 12:
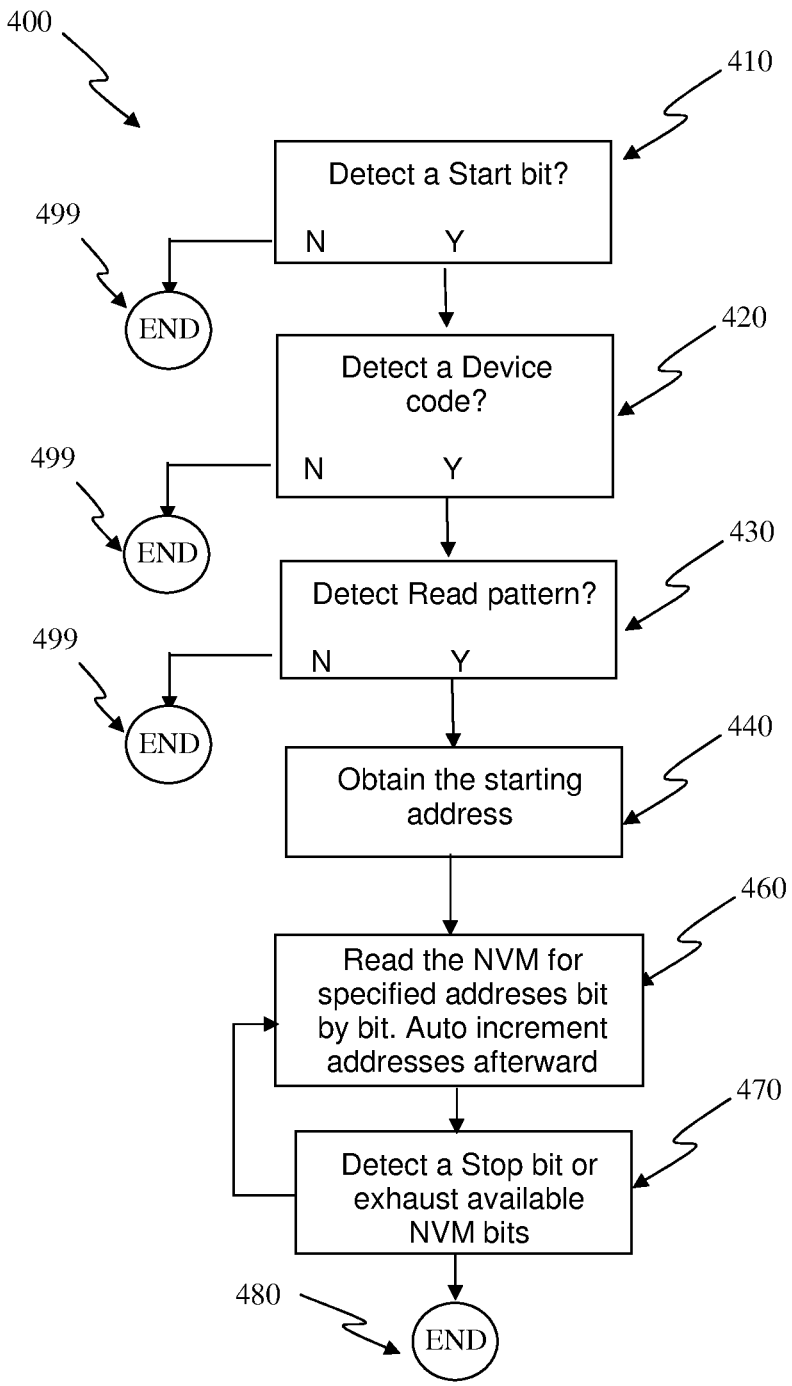
FIG. 12 shows a flow chart of a read procedure for a low-pin count NVM, corresponding to FIG. 5(a), according to one embodiment.

FIG. 12 shows a flow chart of a read procedure 400 for a low-pin-count NVM, corresponding to FIGS. 6(a) through 8(c), according to one embodiment. The procedure 400 starts with detecting a start bit at 410. If a start bit is detected, proceed to detect a device ID at 420, or ends with errors at 499 if not detected. Then, proceeds to detect a read pattern at 430, or ends with errors at 499 if not detected. The procedure 430 continues obtaining a starting address at 440. After the start bit, device ID, read pattern, and starting address are checked and obtained, the next step is to read data bit by bit at the rising or falling edge of each clock cycle at 460 and auto increment the address after each access. The read progresses until a stop bit is detected or the available NVM bits are exhausted at 470, then the procedure 400 finishes with an end at 480. The above discussion is for illustrative purposes. For those skilled in the art understand that some steps can be omitted, some steps can be in different order, the number of bits in each bit field can be different, the bit field order can be interchangeable and that are still within the scope of this invention.

The block diagrams shown in FIGS. 8(a), 8(b), and 8(c) are for illustrative purpose. The actual circuit and logic implementations may vary. Similarly, the procedures described in FIGS. 10, 11(a), 11(b), and 12 are for exemplifying purposes. The detailed implementation in the procedures may vary. For example, some steps may be skipped if simplified versions of read, program, or erase protocols in FIG. 6(b), 6(c), or 6(d) are employed. There can be many embodiments of the circuit, logic, block diagram, and procedures and that are still within the scope of this invention for those skilled in the art.

Figure 13A:
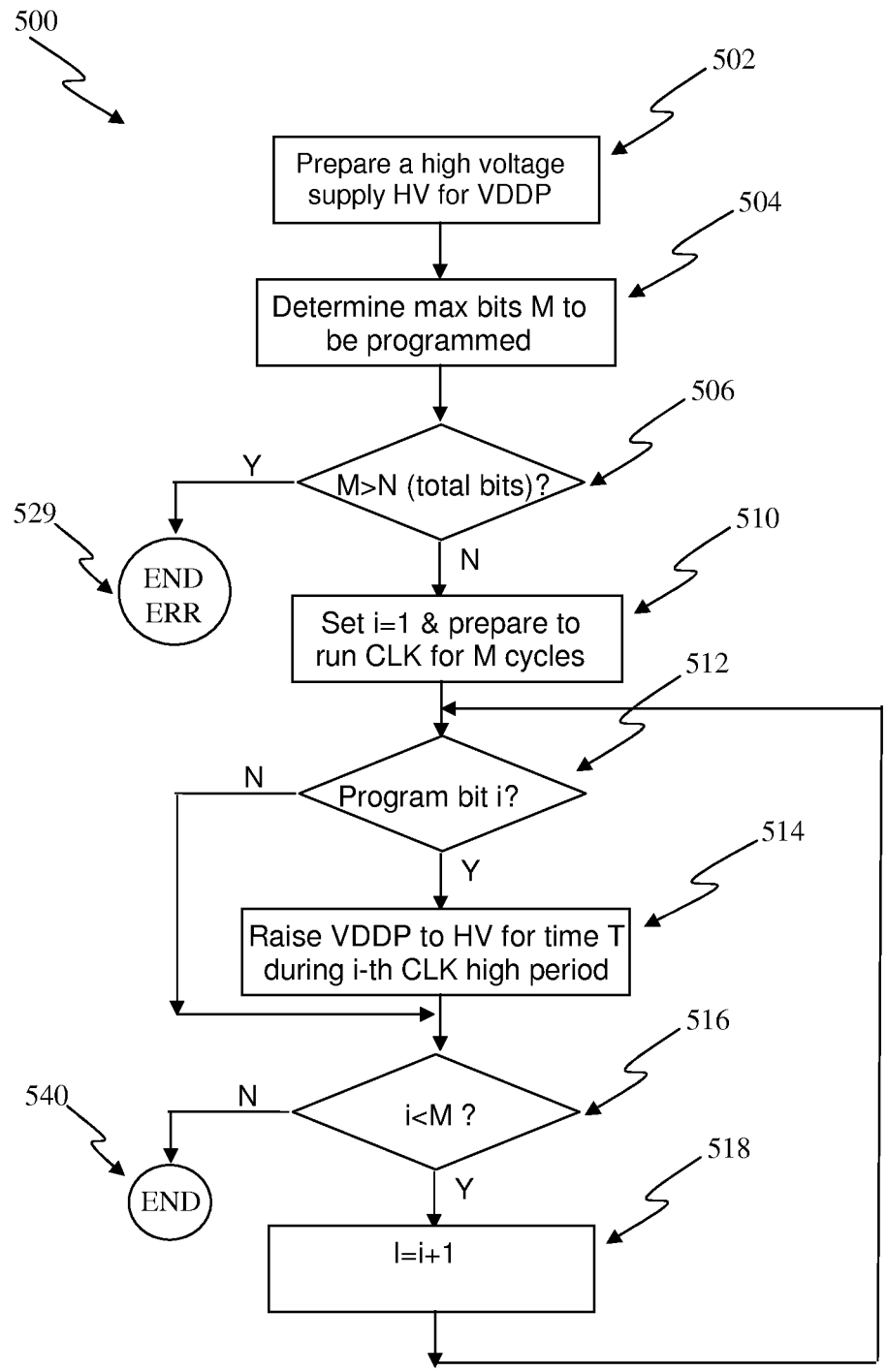
FIG. 13(a) shows a flow chart of a program procedure 500 for a low-pin-count NVM according to one embodiment.

FIG. 13(a) shows a flow chart of a program procedure 500 for a low-pin-count NVM, corresponding to CLK/VDDP protocol as shown in FIGS. 9(a1), 9(a2), and 9(a3), according to one embodiment. The program procedure starts at 502 by preparing a high voltage HV for VDDP pin. Then, determine the maximum number of bits M to be programmed in an N-bit NVM in step 504. Check if M is larger than N in step 506. If yes, the programming stops at 529 with an error. If no, proceeding programming in step 510 by setting the index i equal to 1 and then prepare to generate CLK for M cycles. Check if the i-th address needs to be programmed in step 512. If yes, raise VDDP to HV for a specific time T during the i-th CLK high period and then proceed to 516. If no, proceed to 516. At step 516, check if i is less than M. If no, the procedure finishes and ends at 540. If yes, increment the index i in 518 and go back to step 512 to check and program the following bits.

Figure 13B:
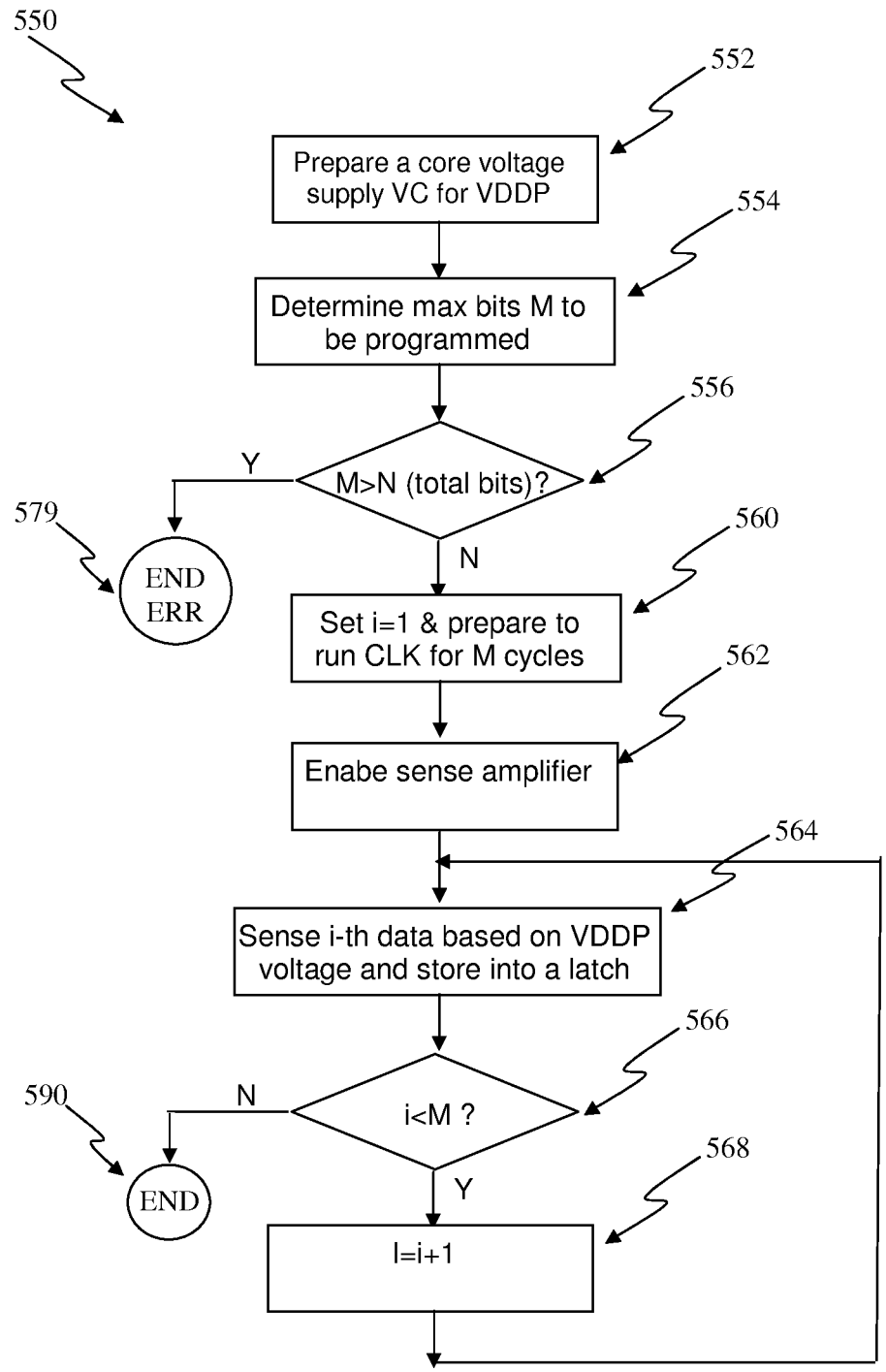
FIG. 13(b) shows a flow chart of a soft program procedure 550 for a low-pin-count NVM according to one embodiment.

FIG. 13(b) shows a flow chart of a soft program procedure 550 for a low-pin-count NVM, corresponding to CLK/VDDP protocol as shown in FIGS. 9(a1), 9(a2), and 9(a3), according to one embodiment. The soft program procedure starts at 552 by preparing a core voltage VC for VDDP pin. Then, determine the maximum number of bits M to be soft programmed in an N-bit NVM in step 554. Check if M is larger than N in step 556. If yes, the soft programming stops at 579 with an error. If no, proceeding soft programming in step 560 by setting the index i equal to 1 and then prepare to generate CLK for M cycles. Enable sense amplifier in step 562. Sense the i-th data being 0 or 1 if the VDDP voltage is at ground or VC, respectively, and store data into a latch at 564. Check if i is less than M in 566. If no, the procedure finishes and ends at 590. If yes, increment the index i in 568 and go to step 564 to soft program the following bits. In another embodiment, the step 562 can be omitted and the data to be programmed are sent to an output latch in step 564.

Figure 13C:
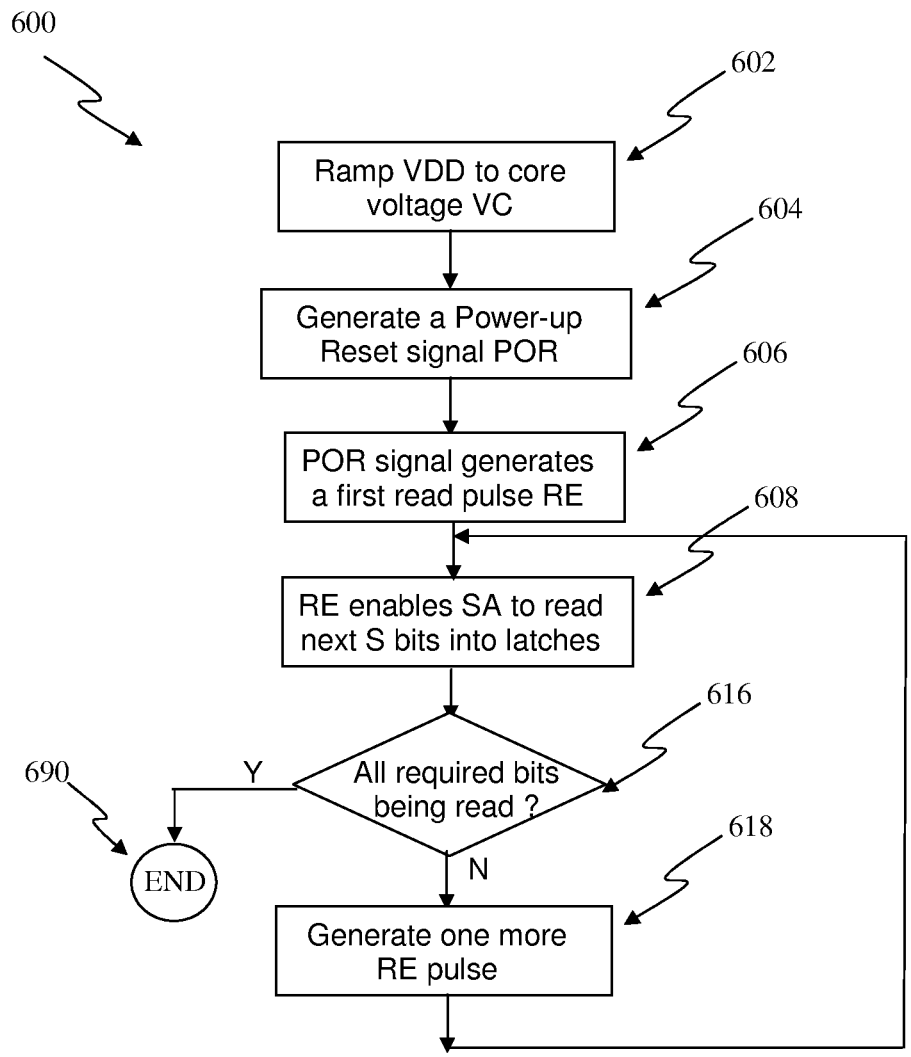
FIG. 13(c) shows a flow chart of a read procedure 600 for a low-pin-count NVM according to one embodiment.

FIG. 13(c) shows a flow chart of a read procedure 600 for a low-pin-count NVM, corresponding to CLK/VDDP protocol as shown in FIGS. 9(a1), 9(a2), and 9(a3), according to one embodiment. The read procedure starts at 602 by ramping up VDD from ground to a core voltage VC. Then, generate a power-up reset (POR) signal in step 604. POR generates a first read pulse RE in step 606. The RE signal enables a single or a plurality of sense amplifier to read S bits into their corresponding latches at 608. Then, check if all required bits are read in 616. If no, generate one more RE pulse in 618 and go to step 608 to read more bits. If yes, the read procedure ends at 690.

To further reduce the footprint, the low-pin-count NVM can have a portion of the NVM be built under a bonding pad of PGM, CLK, VDDP, or any pins in an integrated circuit, in the so-called Circuit-Under-Pad (CUP) technology. The Electrostatic Discharge (ESD) protection can be integrated into the low-pin-count NVM as well, particularly for VDDP pin.

Figure 14:
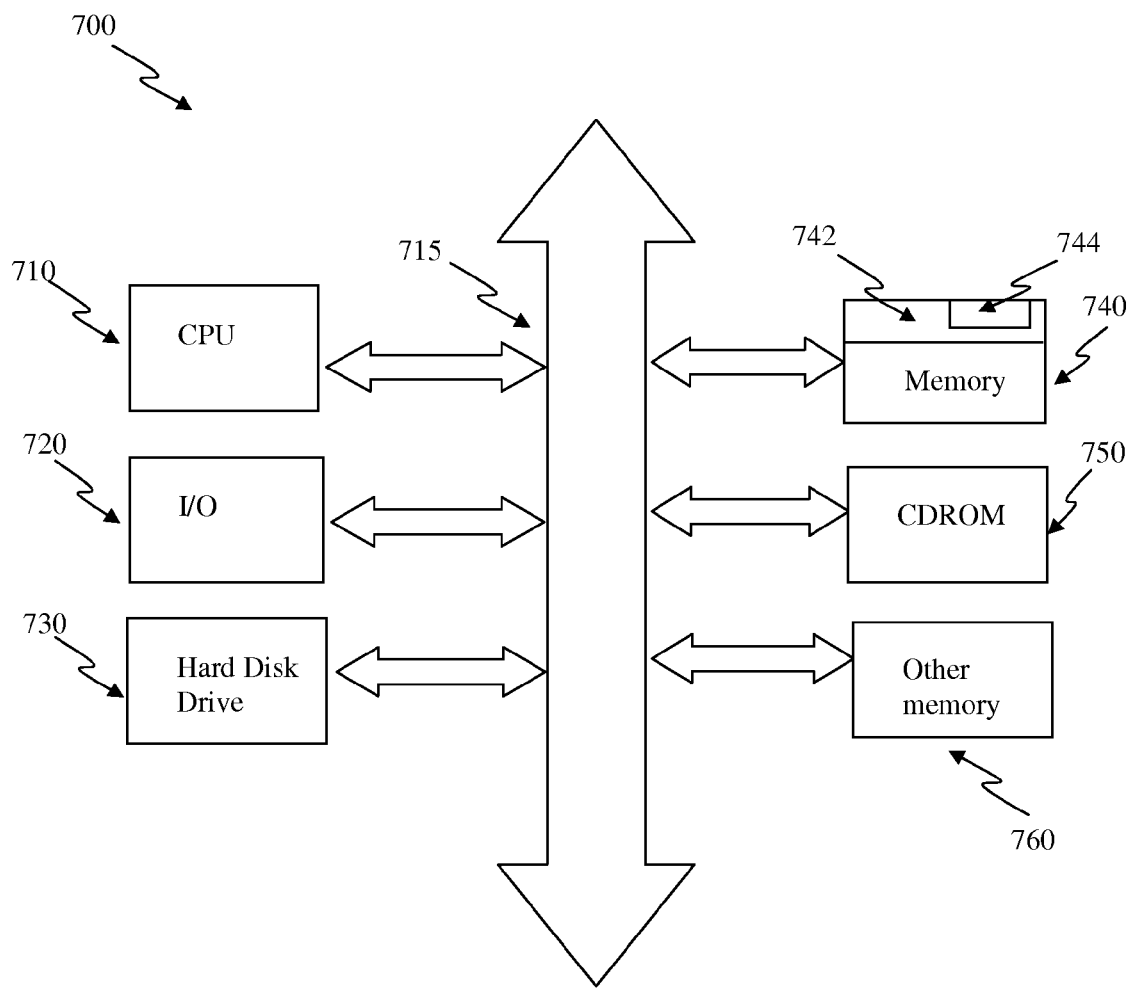
FIG. 14 shows a processor electronic system that employees at least one low-pin-count NVM according to one embodiment.

FIG. 14 shows a processor electronic system 700 that employees at least one low-pin-count NVM according to one embodiment. The processor system 700 can include at least one NVM cell 744, such as in a cell array 742, in at least one low-pin-count NVM memory 740, according to one embodiment. The processor system 700 can, for example, pertain to an electronic system. The electronic system can include a Central Process Unit (CPU) 710, which communicate through a common bus 715 to various memory and peripheral devices such as I/O 720, hard disk drive 730, CDROM 750, low-pin-count NVM memory 740, and other memory 760. Other memory 760 is a conventional memory such as SRAM, DRAM, or flash, typically interfaces to CPU 710 through a memory controller. CPU 710 generally is a microprocessor, a digital signal processor, or other programmable digital logic devices. Low-pin-count NVM 740 is preferably constructed as an integrated circuit, which includes the memory array 742 having at least one programmable resistive device 744. The low-pin-count NVM memory 740 typically interfaces to CPU 710 through a simple bus. If desired, the memory 740 may be combined with the processor, for example CPU 710, in a single integrated circuit.

The invention can be implemented in a part or all of an integrated circuit in a Printed Circuit Board (PCB), or in a system. The programmable resistive device in a low-pin-count NVM can be an OTP (One-Time Programmable), FTP (Few-Time Programmable), MTP (Multiple-Time Programmable), Charge-storing nonvolatile memory, or emerging nonvolatile memory. The OTP can be fuse or anti-fuse, depending on the initial resistance state being low or high, respectively, and the final resistance is just the opposite. The fuse can include at least one of the silicided or non-silicided polysilicon, local interconnect, metal, metal alloy, metal-gate, polymetal, thermally isolated active area, contact, or via fuse. The anti-fuse can be a gate-oxide breakdown anti-fuse, contact or via anti-fuse with dielectrics in-between. The charge-storing nonvolatile memory can be EPROM, EEPROM, or flash memory. The emerging nonvolatile memory can be Magnetic RAM (MRAM), Phase Change Memory (PCM), Conductive Bridge RAM (CBRAM), Ferroelectric RAM (FRAM), or Resistive RAM (RRAM). Though the program mechanisms are different, their logic states can be distinguished by different resistance values.

The above description and drawings are only to be considered illustrative of exemplary embodiments, which achieve the features and advantages of the present invention. Modifications and substitutions of specific process conditions and structures can be made without departing from the spirit and scope of the present invention.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A low-pin-count non-volatile memory (NVM) integrated in an integrated circuit, the NVM comprising:
    a plurality of NVM cells;
    at least one of the NVM cells including at least:
        an NVM element coupled to a first supply voltage line; and
        a selector coupled to the NVM element and a second supply voltage line having a select signal;
    a first signal input for receiving a first signal; and
    a second signal input for receiving a second signal,
    wherein a transaction starts based on a voltage level of the first signal during a transition of the second signal,
    wherein the transaction includes at least one mode cycle and a plurality of data cycles to specify operation modes and programming, erasing, or reading the NVM cells, respectively, once the transaction starts, and
    wherein the NVM cells are selected sequentially for program, erase, or read when the voltage of the first signal is coupled to the first or second supply voltage level during the data cycles.

2. The low-pin-count non-volatile memory (NVM) as recited in claim 1, wherein the NVM element is a phase-change film or magnetic tunnel junction in a PCRAM or MRAM cell, respectively.

3. The low-pin-count non-volatile memory (NVM) as recited in claim 1, wherein the NVM element is a resistive-change film in a RRAM or CBRAM cell.

4. The low-pin-count non-volatile memory (NVM) as recited in claim 1, wherein the NVM element is a One-Time Programmable (OTP) element.

5. The low-pin-count non-volatile memory (NVM) as recited in claim 4, wherein the OTP element comprises at least one of an electrical fuse, anti-fuse, floating gate device.

6. The low-pin-count non-volatile memory (NVM) as recited in claim 1, wherein the transaction pertains to or includes a non-volatile programming mode by loading data to be programmed into output registers.

7. The low-pin-count non-volatile memory (NVM) as recited in claim 1, wherein the start of a transaction is based on the voltage level of one signal sampled by a transition of the other signal.

8. The low-pin-count non-volatile memory (NVM) as recited in claim 1, wherein the at least one mode cycle has at least two cycles for read, nonvolatile program, volatile program or erase modes.

9. The low-pin-count non-volatile memory (NVM) as recited in claim 1,
    wherein the at least one mode cycle has at least two cycles for nonvolatile program or volatile program modes, and
    wherein entering the nonvolatile or volatile program mode is based on the voltage level of the first supply voltage line to the second supply voltage line.

10. The low-pin-count non-volatile memory (NVM) as recited in claim 1, wherein reading the at least one of the NVM cells is triggered by a third signal.

11. The low-pin-count non-volatile memory (NVM) as recited in claim 1, wherein reading the at least one of the NVM cells is triggered by detecting a ramping of the first, the second, or a third supply voltage line.

12. The low-pin-count non-volatile memory (NVM) as recited in claim 1, wherein the NVM cells are selected sequentially by a counter or shift register triggered using one or both of the first signal and the second signal.

13. The low-pin-count non-volatile memory (NVM) as recited in claim 1, wherein selecting the NVM cells includes detecting at least one device ID for matching or detecting a start address for accessing.

14. The low-pin-count non-volatile memory (NVM) as recited in claim 1, wherein selecting the NVM cells is ended with detecting a stop of the transaction or running out of the entire memory space.

15. An electronic system, comprising:
    a processor; and
    at least one low-pin-count nonvolatile memory (NVM) operatively connected to the processor, the NVM includes at least a plurality of NVM cells for providing data storage, at least one of the NVM cells comprising:

a NVM element coupled to a first supply voltage line;
a selector coupled to the NVM element and a second supply voltage line having a select signal;
a first signal input for receiving a first signal;
a second signal input for receiving a second signal; and
wherein a transaction starts based on a voltage level of the first signal during a transition of the second signal,
wherein the transaction includes at least one mode cycle and a plurality of data cycles to specify operation modes and programming, erasing, or reading the NVM cells, respectively, once the transaction starts, and
wherein the NVM cells are selected sequentially for program, erase, or read when the voltage of the first signal is coupled to the first or second supply voltage level during the data cycles.

16. An electronic system as recited in claim 15, wherein the NVM element is a One-Time Programmable (OTP) element.

17. An electronic system as recited in claim 16, wherein the OTP element has at least one of the electrical fuse, anti-fuse, floating gate device.

18. A One-Time Programmable (OTP) memory integrated in an integrated circuit comprises a plurality of OTP cells, each of the plurality of OTP cells comprising:

an OTP element coupled to a first supply voltage line;
a selector coupled to the OTP element and a second supply voltage line having a select signal;
a first signal input for receiving a first signal; and
a second signal input for receiving a second signal,
wherein a transaction starts based on conditions on the first signal input and the second signal input, and
wherein the transaction includes at least one mode cycle and a plurality of data cycles to specify operation modes and programming, erasing, or reading the OTP elements, respectively.

19. A One-Time Programmable (OTP) memory as recited in claim 18, wherein the OTP elements are selected sequentially for program, erase, or read during the data cycles.

20. A One-Time Programmable (OTP) memory as recited in claim 18, wherein the OTP elements are selected sequentially for program, erase, or read when the voltage of the first signal is coupled to the first or second supply voltage level during the data cycles.

* * * * *